(12) United States Patent
Niwa et al.

(10) Patent No.: US 10,021,335 B2
(45) Date of Patent: Jul. 10, 2018

(54) IMAGING ELEMENT, IMAGING METHOD AND ELECTRONIC APPARATUS

(71) Applicant: SONY CORPORATION, Tokyo (JP)

(72) Inventors: Atsumi Niwa, Kanagawa (JP); Yosuke Ueno, Kanagawa (JP); Shimon Teshima, Kanagawa (JP); Daijiro Anai, Kanagawa (JP); Yoshinobu Furusawa, Fukuoka (JP); Taishin Yoshida, Tokyo (JP); Takahiro Uchimura, Kanagawa (JP); Eiji Hirata, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/313,645

(22) PCT Filed: May 21, 2015

(86) PCT No.: PCT/JP2015/002549
§ 371 (c)(1),
(2) Date: Nov. 23, 2016

(87) PCT Pub. No.: WO2015/186302
PCT Pub. Date: Dec. 10, 2015

(65) Prior Publication Data
US 2017/0201702 A1  Jul. 13, 2017

(30) Foreign Application Priority Data

Jun. 2, 2014 (JP) ................................ 2014-114143
Nov. 12, 2014 (JP) ................................ 2014-230000
(Continued)

(51) Int. Cl.
*H04N 5/378* (2011.01)
*H04N 5/374* (2011.01)
(Continued)

(52) U.S. Cl.
CPC ....... *H04N 5/378* (2013.01); *H01L 27/14612* (2013.01); *H01L 27/14621* (2013.01);
(Continued)

(58) Field of Classification Search
CPC ............... H04N 5/378; H04N 5/37455; H04N 5/37457; H01L 27/14636; H01L 27/14645; H01L 27/14621; H01L 27/14612
(Continued)

(56) References Cited

U.S. PATENT DOCUMENTS

| | | | |
|---|---|---|---|
| 2012/0307120 A1 | 12/2012 | Ito et al. | |
| 2015/0172583 A1* | 6/2015 | Tanaka | H04N 5/365 348/308 |
| 2016/0006969 A1* | 1/2016 | Matsumoto | H04N 5/357 348/308 |

FOREIGN PATENT DOCUMENTS

| | | | |
|---|---|---|---|
| EP | 1 954 033 A1 | 8/2008 | |
| EP | 2 453 649 A2 | 5/2012 | |
| (Continued) | | | |

OTHER PUBLICATIONS

International Search Report and Written Opinion prepared by the European Patent Office dated Jul. 28, 2015, for International Application No. PCT/JP2015/002549.

*Primary Examiner* — Tuan Ho
*Assistant Examiner* — Marly Camargo
(74) *Attorney, Agent, or Firm* — Sheridan Ross P.C.

(57) ABSTRACT

There is provided an imaging device including a pixel array section including pixel units two-dimensionally arranged in a matrix pattern, each pixel unit including a photoelectric converter, and a plurality of column signal lines disposed according to a first column of the pixel units. The imaging (Continued)

device further includes an analog to digital converter that is shared by the plurality of column signal lines.

20 Claims, 31 Drawing Sheets

(30) Foreign Application Priority Data

Nov. 12, 2014 (JP) .................................. 2014-230001
Nov. 12, 2014 (JP) .................................. 2014-230002

(51) Int. Cl.
*H01L 27/146* (2006.01)
*H04N 5/3745* (2011.01)
*H04N 9/04* (2006.01)

(52) U.S. Cl.
CPC .. *H01L 27/14636* (2013.01); *H01L 27/14645* (2013.01); *H04N 5/37455* (2013.01); *H04N 5/37457* (2013.01); *H04N 9/045* (2013.01); *H04N 2209/045* (2013.01)

(58) Field of Classification Search
USPC ............... 348/308, 294, 300, 301, 302, 280; 257/291, 292; 250/208.1
See application file for complete search history.

(56) References Cited

FOREIGN PATENT DOCUMENTS

| EP | 2 600 609 A2 | 6/2013 |
|----|---|---|
| JP | 2005 303648 | 10/2005 |
| JP | 2009 296423 | 12/2009 |
| KR | 2013 0064971 A | 6/2013 |

\* cited by examiner

IMAGING ELEMENT, IMAGING METHOD AND ELECTRONIC APPARATUS

CROSS REFERENCE TO RELATED APPLICATIONS

This application is a national stage application under 35 U.S.C. 371 and claims the benefit of PCT Application No. PCT/JP2015/002549 having an international filing date of 21 May 2015, which designated the United States, which PCT application claims the benefit of Japanese Priority Patent Application JP 2014-114143, filed Jun. 02, 2014; Japanese Priority Patent Application JP 2014-230001, filed Nov. 12, 2014; Japanese Priority Patent Application JP 2014-230002, filed Nov. 12, 2014; and, Japanese Priority Patent Application JP 2014-230000, filed Nov. 12, 2014, the entire contents of each of which are incorporated herein by reference in their entirety.

TECHNICAL FIELD

The present disclosure relates to an imaging element, an imaging method, and an electronic apparatus, and particularly to an imaging element, an imaging method, and an electronic apparatus that can attain a speed increase using a low-power consumption.

BACKGROUND ART

In the related art, an electronic apparatus having an imaging function, such as a digital still camera or a digital video camera, uses a solid-state imaging element, such as a charge coupled device (CCD) image sensor or a complementary metal oxide semiconductor (CMOS) image sensor. The solid-state imaging element includes a pixel, in which a photodiode (PD) that performs a photoelectric conversion and a plurality of transistors are combined, and an image is formed based on an image signal that is output from a plurality of pixels that are disposed in a flat manner. In addition, for example, the image signals that are output from the pixels are converted in parallel into digital signals from analog signals by a plurality of analog to digital (AD) converters disposed in each pixel column.

For such a solid-state imaging element, the present applicant proposes a solid-state imaging element that can increase a speed of AD conversion processing by performing count processing in a down-count mode and an up-count mode in an AD converter (for example, refer to PTL 1).

In addition, the present applicant proposes a solid-state imaging element that can reduce noise by performing AD conversion of a pixel signal of a reset level and a pixel signal of a signal level by repetition for multiple times (for example, refer to PTL 2).

CITATION LIST

Patent Literature

PTL 1: Japanese Unexamined Patent Application Publication No. 2005-303648
PTL 2: Japanese Unexamined Patent Application Publication No. 2009-296423

SUMMARY OF INVENTION

Technical Problem

However, in the related art, it is necessary to read a pixel signal at a high speed from a solid-state imaging element. In addition, in recent years, applications that are used for a small terminal, such as a so-called smart phone or a wearable device, have become widespread, and thereby reducing power consumption of the solid-state imaging element is necessary. For example, in the related art, a speed increase is attained by increasing the number of column parallel AD converters described above. But, in doing so, the power consumption increases in proportion to the number of column parallel AD converters, and thus it is difficult to improve power efficiency (i.e., speed/power). That is, the power consumption increases as the speed increases, and the speed decreases according to a low-power consumption.

It is desirable to increase the speed while consuming low power.

Solution to Problem

An imaging device according to a first embodiment of the present disclosure includes a pixel array including a plurality of pixels two-dimensionally arranged in a matrix pattern, a plurality of column signal lines disposed according to a first column of the pixels, wherein at least one column signal line of the plurality of column signal lines is connected to two or more pixels in the first column, and an analog to digital converter shared by the plurality of column signal lines.

An electronic apparatus according to a second embodiment of the present disclosure includes an optical system including at least one lens and an imaging element configured to receive light through the optical system, wherein the imaging element includes: a pixel array including pixels two-dimensionally arranged in a matrix pattern, a plurality of column signal lines disposed according to a first column of the pixels, wherein at least one column signal line of the plurality of column signal lines is connected to two or more pixels in the first column, and an analog to digital converter shared by the plurality of column signal lines.

A comparator according to a third embodiment of the present disclosure includes a first differential pair unit connected to a first column signal line of an imaging device and a second differential pair unit connected to a second column signal line of the imaging device, wherein the first column signal line and the second column signal line are for the same column of pixel array units in a pixel array.

Advantageous Effects of Invention

According to an embodiment of the present disclosure, it is possible to attain a speed increase with a low-power consumption.

DESCRIPTION OF EMBODIMENTS

Hereinafter, a specific embodiment to which the present technology is applied will be described in detail with reference to the drawings.

Figure 1:
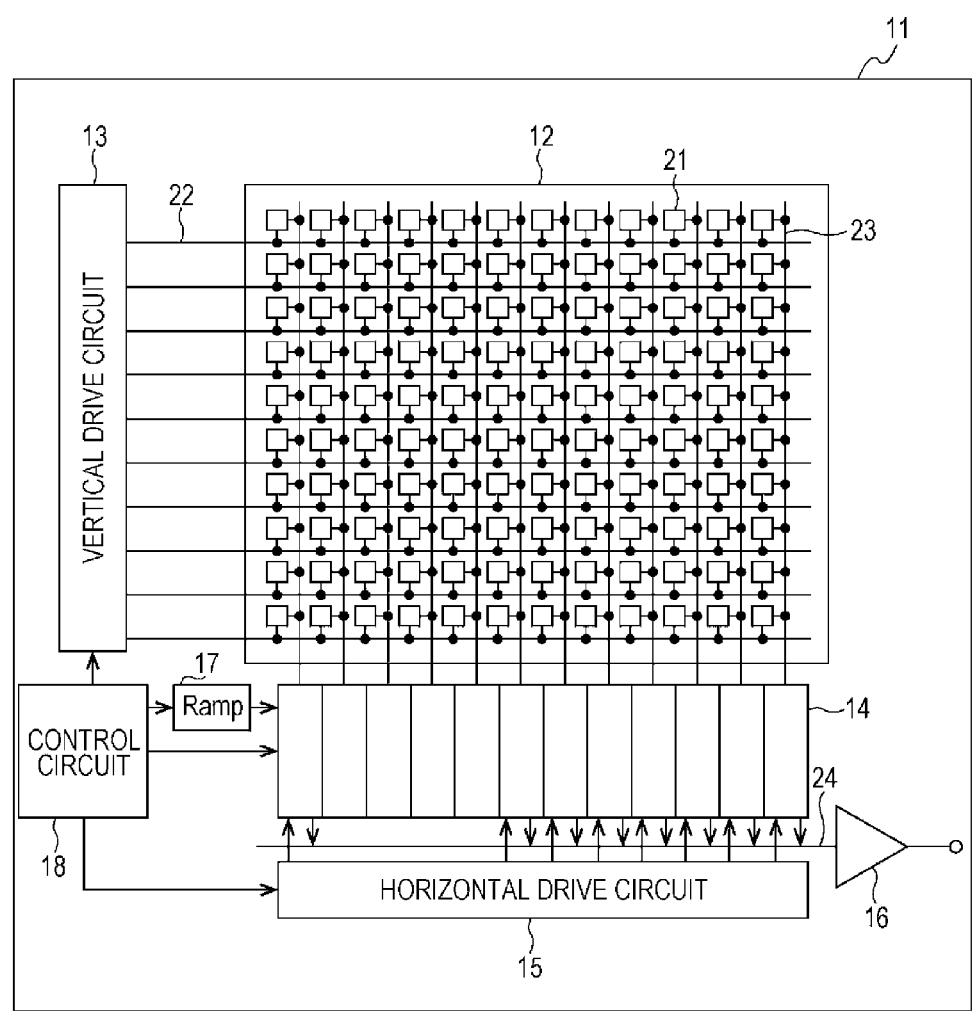
FIG. 1 is a block diagram illustrating a configuration example according to an embodiment of an imaging element to which the present technology is applied.

FIG. 1 is a block diagram illustrating a configuration example according to a first embodiment of an imaging element to which the present technology is applied.

As illustrated in FIG. 1, an imaging element 11 is configured to include a pixel area 12, a vertical drive circuit 13, a column signal processing circuit 14, a horizontal drive circuit 15, an output circuit 16, a ramp signal generation circuit 17, and a control circuit 18.

The pixel area 12 is a light-receiving surface for receiving light that is collected by an optical system, which is not illustrated. A plurality of pixels 21 is disposed in a matrix in the pixel area 12, each pixel 21 is connected to the vertical drive circuit 13 in each row via the horizontal signal line 22, and is connected to the column signal processing circuit 14 in each column via the vertical signal line 23. The plurality of pixels 21 outputs pixel signals with levels corresponding to an amount of light that is received, respectively, and an image of a subject that is imaged on the pixel area 12 is constructed from the pixel signals.

The vertical drive circuit 13 sequentially supplies drive signals for driving (i.e., transferring, selecting, resetting, or the like) the respective pixels 21 to each row of the plurality of pixels 21 disposed in the pixel area 12, via the horizontal signal line 22 to the pixels 21.

The column signal processing circuit 14 performs correlated double sampling (CDS) processing with respect to a pixel signal that is output from the plurality of pixels 21 via the vertical signal line 23, and thereby an AD conversion of the pixel signal is performed and reset noise is removed. For example, the column signal processing circuit 14 is configured to include a plurality of column processing units 41 (refer to FIG. 2 described later) corresponding to the number of columns of the pixels 21, and can perform in parallel with the CDS processing for each column of the pixels 21.

The horizontal drive circuit 15 supplies a drive signal, which is used to output pixel signals that are sequentially transferred from each column of the plurality of pixels 21 disposed in the pixel area 12 to the data output signal line 24 from the column signal processing circuit 14, to the column signal processing circuit 14.

The output circuit 16 amplifies the pixel signal that is supplied via the data output signal line 24 from the column signal processing circuit 14 at a timing according to the drive signal of the horizontal drive circuit 15, and outputs the amplified signal to a signal processing circuit of a subsequent stage.

The ramp signal generation circuit 17 generates a ramp signal of a voltage (i.e., slope voltage) that drops with a constant slope according to the lapse of time, as a reference signal that is used when the column signal processing circuit 14 performs an AD conversion of the pixel signal, and supplies the ramp signal to the column signal processing circuit 14.

The control circuit 18 drives each of the internal blocks of the imaging element 11. For example, the control circuit 18 generates block signals according to drive periods of each block, and supplies the block signals to respective blocks. In addition, for example, the control circuit 18 performs a control for reading the pixel signal from the pixel 21 such that the AD conversion of the pixel signal can be performed at a high speed in the column signal processing circuit 14.

Figure 2:
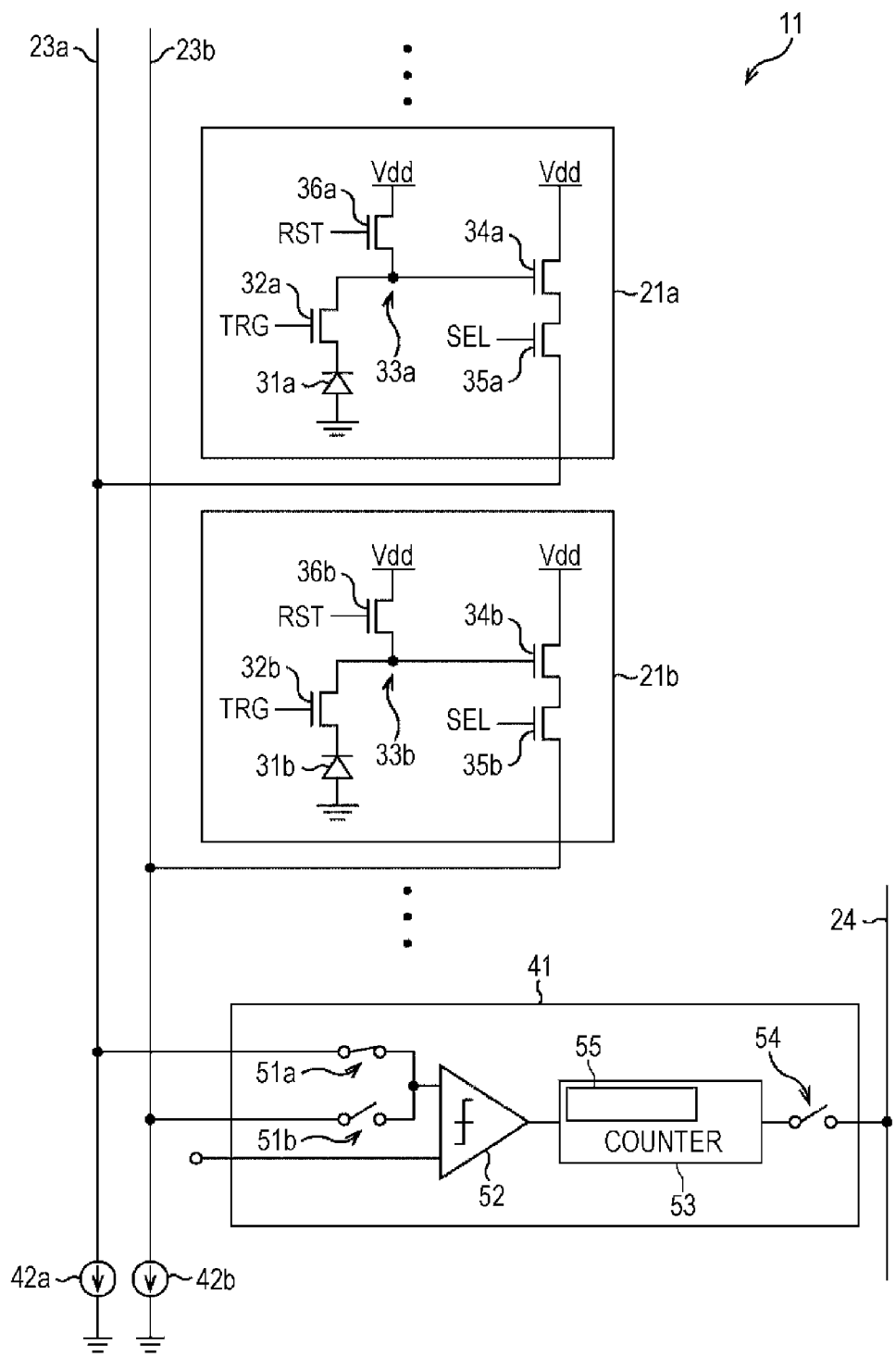
FIG. 2 is a block diagram illustrating a configuration example of a pixel and a column processing unit.

Next, FIG. 2 illustrates a configuration example of the pixel 21 of the imaging element 11 and the column processing unit 41.

FIG. 2 illustrates two pixels 21a and 21b that are disposed in parallel in a predetermined column, among the plurality of pixels 21 disposed in the pixel area 12 in FIG. 1. In addition, FIG. 2 illustrates the column processing unit 41 that is disposed so as to correspond to the column, among the plurality of column processing units 41 that is included in the column signal processing circuit 14.

As illustrated in FIGS. 1 and 2, in the imaging element 11, two signal lines including a first vertical signal line 23a and a second signal line 23b are provided in one column of the pixels 21. The pixel 21a (e.g., pixel 21 in an odd-numbered row) is connected to the first vertical signal line 23a, and the pixel 21b (e.g., pixel 21 in an even-numbered row) is connected to the second vertical signal line 23b. In addition, a constant current source 42a that configures a source follower circuit is connected to the first vertical signal line 23a, and a constant current source 42b that configures a source follower circuit is connected to the second vertical signal line 23b. The first vertical signal line 23a and the second vertical signal line 23b are connected to the one column processing unit 41 that is disposed so as to correspond to the column.

The pixel 21a is configured to include a PD 31a, a transfer transistor 32a, an FD unit 33a, an amplification transistor 34a, a selection transistor 35a, and a reset transistor 36a.

The PD 31a is a photoelectric conversion unit that photoelectrically converts incident light into charges and stores the charges. An anode terminal of the PD 31a is grounded and a cathode terminal thereof is connected to the transfer transistor 32a.

The transfer transistor 32a is driven by a transfer signal TRG that is supplied from the vertical drive circuit 13, and if the transfer transistor 32a is turned on, the charges that are stored in the PD 31a are transferred to the FD 33a.

The FD 33a is a floating diffusion area having a predetermined storage capacitor that is connected to a gate electrode of the amplification transistor 34a, and stores the charges that are transferred from the PD 31a.

The amplification transistor 34a outputs the pixel signal with a level (that is, a potential of the FD unit 33a) according to the charges that are stored in the FD unit 33a, to the first vertical signal line 23a via the selection transistor 35a. That is, due to a configuration in which the FD unit 33a is connected to the gate electrode of the amplification transistor 34a, the FD unit 33a and the amplification transistor 34a function as a conversion unit that converts the charges, which are generated in the PD 31a into the pixel signal with the level according to the charges.

The selection transistor 35a is driven by a selection signal SEL that is supplied from the vertical drive circuit 13, and if the selection transistor 35a is turned on such that the selection transistor 35a is in an on state, the pixel signal that is output from the amplification transistor 34a can be output to the first vertical signal line 23a.

The reset transistor 36a is driven by a reset signal RST that is supplied from the vertical drive circuit 13, and if the reset transistor 36a is turned on, the charges that are stored in the FD unit 33a are discharged to a power supply wire Vdd; thereby, the FD unit 33a is reset.

In addition, in the same manner as the pixel 21a, the pixel 21b is configured to include a PD 31b, a transfer transistor 32b, an FD unit 33b, an amplification transistor 34b, a selection transistor 35b, and a reset transistor 36b. Thus, since each unit of the pixel 21b operates in the same and/or similar manner as each unit of the pixel 21a described above, a detailed description thereof will be omitted. In addition, hereinafter, if it is not necessary to distinguish between the pixel 21a and the pixel 21b, the pixels 21a and 21b will be simply referred to as the pixel 21, and each unit that configures the pixel 21 is referred to in the same manner, as appropriate.

The column processing unit 41 is configured to include two input switches 51a and 51b, a comparator 52, a counter 53, and an output switch 54.

An input terminal on a negative side of the comparator 52 is connected to the first vertical signal line 23a via the input switch 51a, and is connected to the second vertical signal line 23b via the input switch 51b. In addition, an input terminal on a positive side of the comparator 52 is connected to the ramp signal generation circuit 17 on FIG. 1. An output terminal of the comparator 52 is connected to an input terminal of the counter 53, and an output terminal of the counter 53 is connected to the data output signal line 24 via the output switch 54.

The input switches 51a and 51b are closed and opened by the control of the control circuit 18 in FIG. 1, and switch connection between the input terminal on the negative side of the comparator 52 and the first vertical signal line 23a and the second vertical signal line 23b. For example, if the input switch 51a is closed and the input switch 51b is opened, the input terminal on the negative side of the comparator 52 is connected to first vertical signal line 23a, and then the pixel signal that is output from the pixel 21a is input to the comparator 52. Meanwhile, if the input switch 51b is closed and the input switch 51a is opened, the input terminal on the negative side of the comparator 52 is connected to second vertical signal line 23b, and then the pixel signal that is output from the pixel 21b is input to the comparator 52.

The comparator 52 compares magnitudes of the ramp signal that is input to the input terminal on the positive side and the pixel signal that is input to the input terminal on the negative side, and outputs a comparison result signal that indicates the comparison result. For example, the comparator 52 outputs the comparison result signal having a high level when the ramp signal is greater than the analog pixel signal, and outputs the comparison result signal having a low level when the ramp signal is equal to or less than the analog pixel signal.

For example, the counter 53 counts the number of clocks from a time when a potential of the ramp signal that is output from the ramp signal generation circuit 17 starts to drop with a constant slope to a time when the comparison result signal that is output from the comparator 52 is switched from a high level to a low level. Thus, the value that is counted by the counter 53 becomes a value according to the level of the pixel signal that is input to the comparator 52, and thereby the analog pixel signal that is output from the pixel 21 is converted into a digital value.

As another example, in the imaging element 11, the pixel signal corresponding to a reset level in which the FD unit 33 of the pixel 21 is reset, and the pixel signal corresponding to a signal level where the FD unit 33 of the pixel 21 retains the charges that are obtained by photoelectric conversion of the PD 31, are output from the pixel 21. Then, when the column processing unit 41 performs the AD conversion of the pixel signal, an output signal in which reset noise is removed by acquiring a difference between the signals is output. In addition, the counter 53 includes a retention unit 55 that retains the counted value; such counted value may be temporarily retained, as will be described later.

The output switch 54 is closed or opened by a drive signal that is output from the horizontal drive circuit 15. For example, if the pixel signal in a column for which a predetermined column processing unit 41 is disposed is output, the output switch 54 is closed by the drive signal that is output from the horizontal drive circuit 15, and an output terminal of the counter 53 is connected to the data output signal line 24. Accordingly, the pixel signal that is obtained by the AD conversion of the column processing unit 41 is output to the data output signal line 24.

The imaging element 11 is configured in this way, and the column processing unit 41 can alternately perform the AD conversions of the pixel signal that is output from the pixel 21a and the pixel signal that is output from the pixel 21b. Thus, the imaging element 11 can control reading of the pixel signal, in such a manner that settling of the pixel signal obtained by performing a reset operation or a signal transfer operation of one of the pixel 21a and the pixel 21b can be alternately and repeatedly performed concurrently with the processing of the AD conversion. Thus, the AD conversion may be performed by the column processing unit 41 for the pixel signal which is output from the other pixel.

In this way, the column processing unit 41 alternately switches the pixel signals of the pixel 21a and the pixel 21b and performs the AD conversion concurrently with the settling of the respective pixel signals of the pixel 21a and the pixel 21b; thus, it is possible to speed up the AD conversion of the column processing unit 41. In addition, the imaging element 11 can speed up the AD conversion without an increase in the number of the column processing units 41; thus, an increase in power consumption can be avoided. That is, the imaging element 11 can attain a speed increase of the AD conversion with a low-power consumption.

Figure 3:
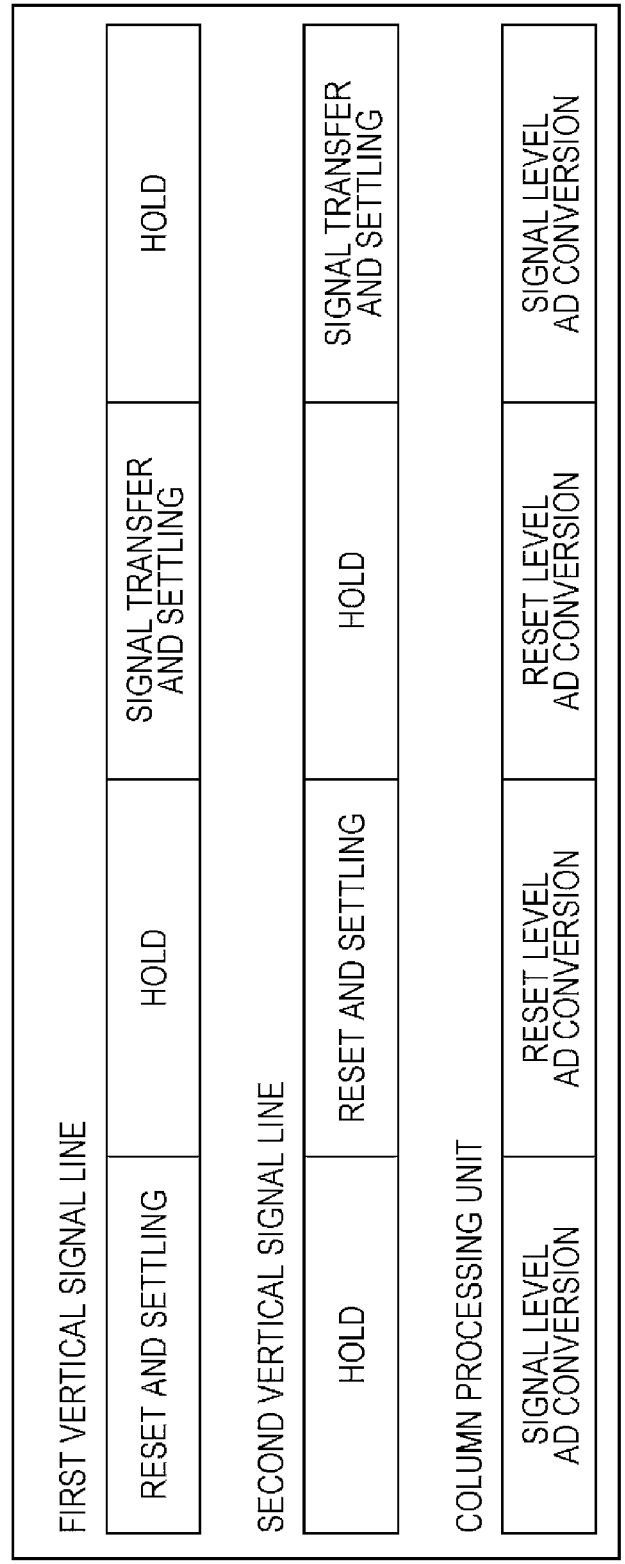
FIG. 3 is a timing chart for explaining an operation of an AD conversion of the imaging element.

Next, FIG. 3 illustrates a timing chart for explaining an operation of the AD conversion of the imaging element 11.

FIG. 3 illustrates, sequentially from the top, the operation of the pixel 21a that is connected to the first vertical signal line 23a, the operation of the pixel 21b that is connected to the second vertical signal line 23b, and the operation of the column processing unit 41.

To begin with, in a first operation period, the pixel 21a that is connected to the first vertical signal line 23a resets the FD unit 33a and holds until the output of the pixel signal corresponding to a reset level is sufficiently settled (i.e., reset period). Concurrently with this operation, in the first operation period, the pixel 21b that is connected to the second vertical signal line 23b retains the output of the pixel signal corresponding to a signal level according to an amount of light in the PD 31b that is settled in a previous operation period. Then, the column processing unit 41 performs the AD conversion of the pixel signal corresponding to the signal level that is output from the pixel 21b (AD conversion period). At this time, in the column processing unit 41, the counter 53 retains the counted value, according to the pixel signal with the signal level of the pixel 21b, in the retention unit 55.

Next, in a second operation period, the pixel 21a that is connected to the first vertical signal line 23a retains the output of the pixel signal corresponding to a reset level that is settled in the first operation period and the column processing unit 41 performs an AD conversion of the reset level that is output from the pixel 21a. In addition, at this time, the column processing unit 41 retains the counted value corresponding to the reset level of the pixel 21a, in the retention unit 55. Concurrently with this operation, in the second operation period, the pixel 21b that is connected to the second vertical signal line 23b resets the FD unit 33b and holds until the output of the pixel signal corresponding to the reset level is sufficiently settled.

In a third operation period, the pixel 21a that is connected to the first vertical signal line 23a transfers the charges that are obtained by the PD 31a to the FD unit 33a and holds until an output of the pixel signal corresponding to a signal level according to an amount of light received at the PD 31a is sufficiently settled (signal transfer period). Concurrently with this operation, in the third operation period, the pixel 21b that is connected to the second vertical signal line 23b retains the output of the pixel signal corresponding to a reset level that is settled in the second operation period and the column processing unit 41 performs an AD conversion of the reset level that is output from the pixel 21b. Then, the column processing unit 41 acquires a difference between the counted value corresponding to the reset level and the counted value corresponding to the signal level of the pixel 21b that is retained in the retention unit 55, and outputs a pixel signal corresponding to a pixel signal in which reset noise has been removed.

In a fourth operation period, the pixel 21a that is connected to the first vertical signal line 23a retains an output of the pixel signal corresponding to the signal level that is settled in the third operation period, and the column processing unit 41 performs an AD conversion of the pixel signal corresponding to the signal level that is output from the pixel 21a. Then, the column processing unit 41 acquires a difference between the counted value corresponding to the pixel signal of the signal and the counted value corresponding to the reset level of the pixel 21a that is retained in the retention unit 55, and outputs a pixel signal corresponding to a pixel signal in which the reset noise has been removed. Concurrently with this operation, in the fourth operation period, the pixel 21b that is connected to the second vertical signal line 23b transfers the charges that are obtained by the PD 31b to the FD unit 33b and holds until the output of the pixel signal corresponding to a signal level according to an amount of light received at the PD 31b is sufficiently settled.

After the fourth operation period is ended, the processing returns to the first operation period, and hereinafter, in the same manner as above, the pixels 21a and the pixels 21b in subsequent rows are set as the operation targets, and sequentially the operations from the first operation period to the fourth operation period are repeatedly performed. In addition, in the pixel 21a and the pixel 21b, a half-period shift with each operation period may be performed.

As described above, in the imaging element 11, the AD conversion of one of the pixel signals of the pixel 21a and the pixel 21b is performed concurrently with the settling of the pixel signal of the other pixel. Accordingly, for example, the AD conversion of the pixel signal corresponding to the signal level of the pixel 21b in the first operation period is completed, and immediately after that, the AD conversion of the pixel signal corresponding to the reset level of the pixel 21a in the second operation period is completed. In the same manner, the AD conversion of the pixel signal corresponding to the reset level of the pixel 21a in the second operation period is completed, and immediately after that, the AD conversion of the pixel signal corresponding to the reset level of the pixel 21b in the third operation period is completed. Furthermore, the AD conversion of the pixel signal corresponding to the reset level of the pixel 21b in the third operation period is completed, and immediately after that, the AD conversion of the pixel signal with the signal level of the pixel 21a in the fourth operation period is completed. Since each of the pixel signals with the signal level of the pixel 21a in the fourth operation period and the pixel signal with the signal level of the pixel 21b in the first operation period corresponds to an amount of charge accumulated in a respective photodiode and transferred to a respective floating diffusion area having a preexisting charge corresponding to a reset level, the reset level, or reset noise, may be removed such that a pixel signal corresponding to a pixel signal in which a reset noise has been removed can be obtained.

Thus, the imaging element 11 can perform the AD conversion at a higher speed compared to the configuration in which the column processing unit 41 holds the AD conversion until the settling of the pixel signal is completed, for example.

Figure 4:
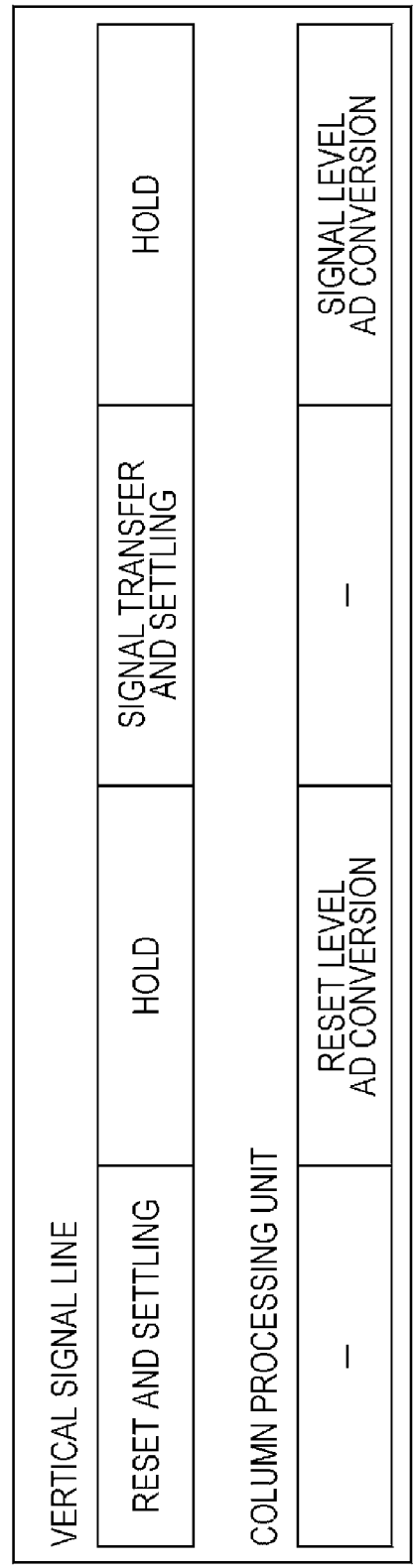
FIG. 4 is a timing chart for explaining an operation of an AD conversion of an imaging element of the related art.

Here, an operation of the AD conversion of the imaging element of the related art will be described with reference to a timing chart illustrated in FIG. 4.

The imaging element of the related art is configured to include one vertical signal line with respect to one column of pixels, and in a first operation period, the pixel resets a FD unit, holds until an output of a pixel signal with a reset level is sufficiently settled, and a column processing unit does not perform processing. Next, in a second operation period, the pixel continues to retain the output of the pixel signal with the reset level that is settled in the first operation period, and the column processing unit performs an AD conversion of the pixel signal corresponding to the reset level that is output from the pixel.

After the AD conversion is completed, in a third operation period, the pixel transfers the charges that are obtained by photoelectric conversion of a PD to the FD unit, and holds until an output of the pixel signal with the signal level according to an amount of received light of the PD is sufficiently settled, and the column processing unit does not perform the processing. Then, in a fourth operation period, the pixel continues to retain the output of the pixel signal with the signal level that is settled in the third operation period, and the column processing unit performs the AD conversion of the pixel signal with the signal level that is output from the pixel.

In this way, in the imaging element of the related art, the column processing unit does not perform the AD conversion while the output of the pixel signal is settled, and thus in order to perform the AD conversion of the pixel signal and output the signal, it is necessary to approximately double the time, compared to an operation of the AD conversion illustrated in FIG. 3.

In addition, some imaging elements of the related art employ a sample/hold technology.

Here, an AD conversion operation of the imaging element of the related art that employs the sample/hold technology will be described with reference to the timing chart illustrated in FIG. 5.

Figure 5:
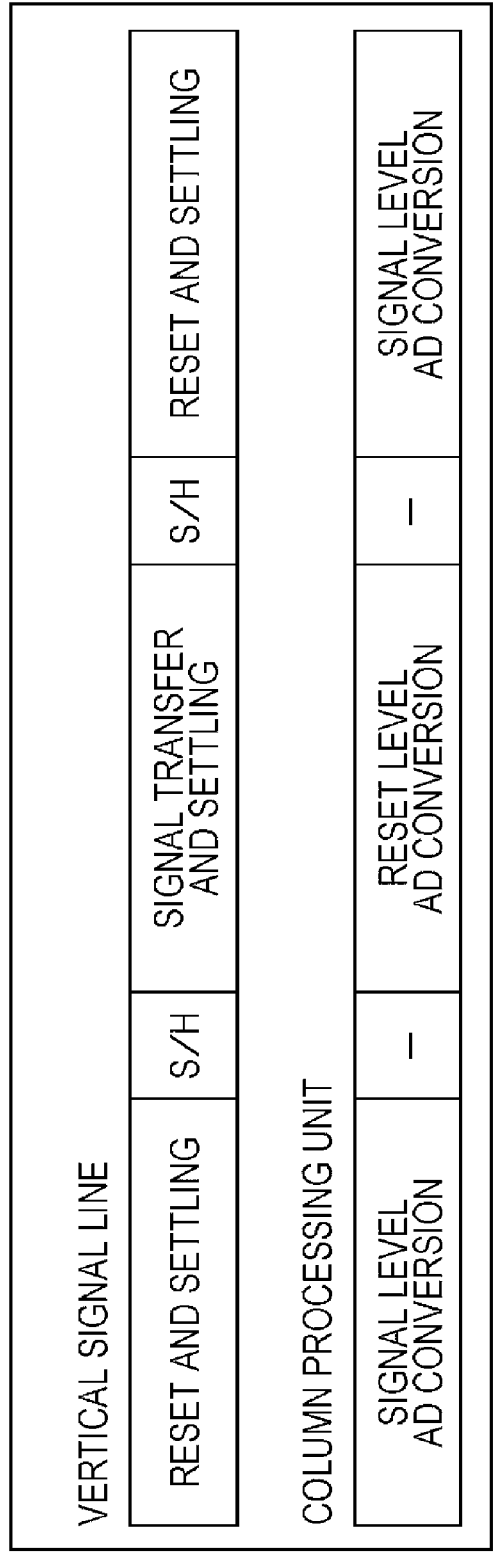
FIG. 5 is a timing chart for explaining an operation of an AD conversion of the imaging element of the related art to which a sample and hold technology is employed.

As illustrated in FIG. 5, in the imaging element of the related art in which the sample/hold technology is employed, one vertical signal line is provided in each column of the pixel, the settled pixel signal is sampled and held in a capacitance element, and thus the voltage level can be retained. Accordingly, it is possible to perform the AD conversion of the pixel signal with the signal level that is retained concurrently with the settling of the pixel signal with the reset level, and to perform the AD conversion of the pixel signal with the reset level that is retained concurrently with the settling of the pixel signal with the signal level.

However, in recent years, a solid-state imaging element that is used for a small terminal, such as a so-called smart phone or a wearable device, uses a fine pixel size of approximately 1 micrometer and thus it is less practical to employ a sample/hold technology. In addition, if a capacitance element that is used for the sample/hold is too small, noise (i.e., so-called kT/C noise) that is generated by the sample/hold is increased. Such noise may be difficult to remove by the CDS processing, and thus the image quality is significantly degraded. In addition, if the capacitance element that is used for the sample/hold becomes large to the extent that the noise does not affect the image quality, a capacitance load of the vertical signal line is increased, and accordingly, the settling speed is decreased resulting in a decrease if the processing speed of the column signal processing.

In contrast to this, in the imaging element 11, since the noise does not occur in the configuration that uses the sample/hold technology, it is possible to avoid image quality degradation and to attain an increase in the processing speed.

In addition, as illustrated in FIG. 3, the imaging element 11 performs the AD conversion processing in a sequence of performing the AD conversion of a pixel signal corresponding to the reset level of the pixel 21a, performing the AD conversion of the pixel signal corresponding to the reset level of the pixel 21b, performing the AD conversion of the pixel signal corresponding to the signal level of the pixel 21a, and performing the AD conversion of the pixel signal corresponding to the signal level of the pixel 21b. For example, the pixel signal is read in the same sequence even in the solid-state imaging element that is disclosed in the PTL 2 described above, but it is different from the imaging element 11 in that the AD conversion is repeated with respect to the pixel signal with the same reset level and signal level. Accordingly, the imaging element 11 has a circuit configuration or an operation sequence of the column processing unit 41 for removing the kT/C noise, which is different from the solid-state imaging element of PTL 2.

Figure 6:
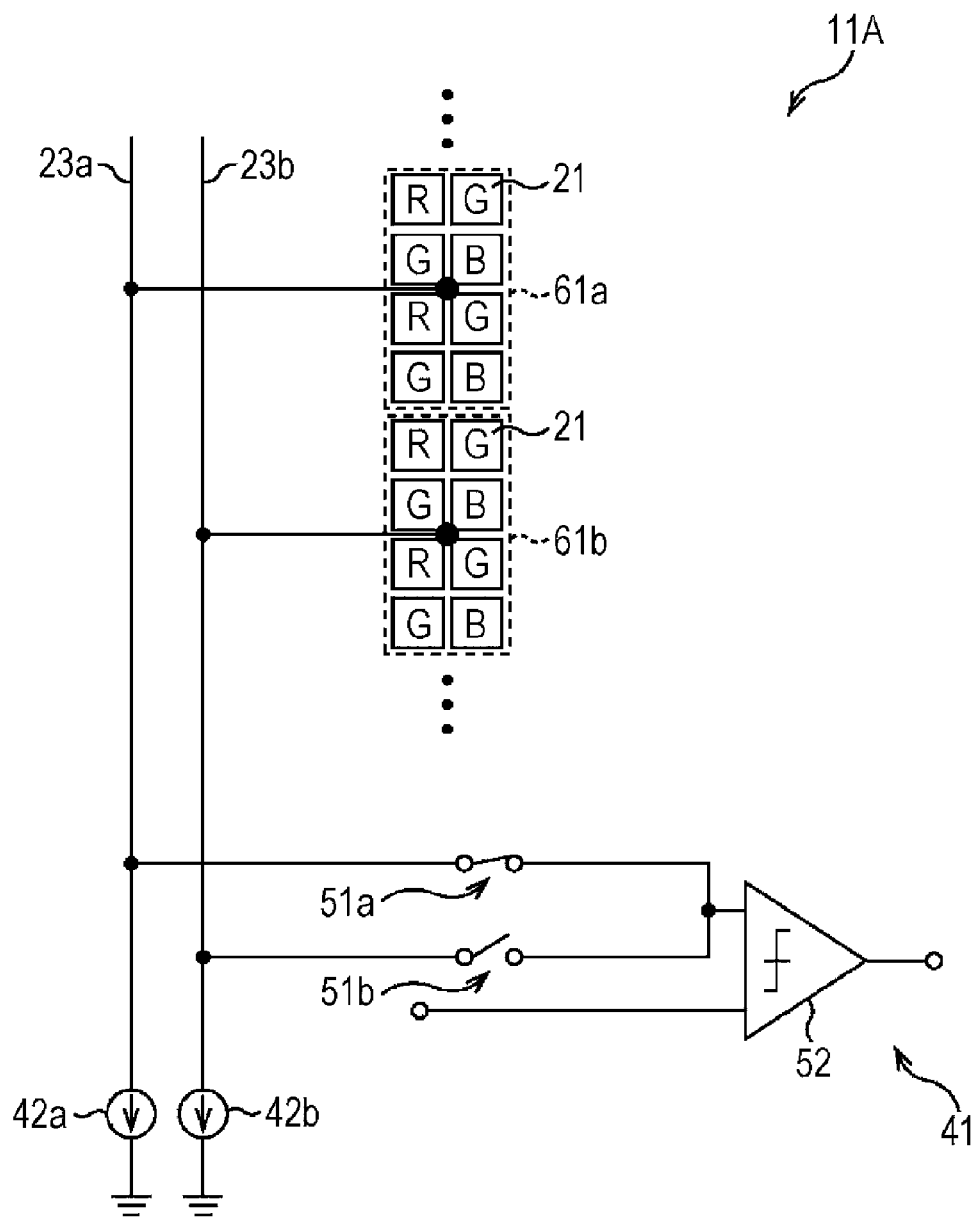
FIG. 6 is a block diagram illustrating a portion of a configuration example according to a second embodiment of the imaging element.

Next, FIG. 6 is a block diagram illustrating a portion of a configuration of a second embodiment of the imaging element 11. In an imaging element 11, as illustrated in FIG. 6, the same symbols or reference numerals are attached to the same configurations as those of the imaging element 11 illustrated in FIG. 2, and detailed description thereof will be omitted.

As illustrated in FIG. 6, the imaging element 11A has a different configuration from the imaging element 11 illustrated in FIG. 2 in that a plurality of pixels 21 employs a pixel-sharing structure in which a portion configuring the pixel 21, such as the FD unit 33 or the amplification transistor 34, is shared.

A sharing pixel 61 that configures the imaging element 11A employs a pixel-sharing structure that is formed by eight pixels 21, which are disposed in a matrix of 4×2. The imaging element 11A has a configuration in which color filters are disposed on the pixels 21 according to a so-called Bayer pattern, and in FIG. 6, colors (R, G, B) of the respective color filters are illustrated in the pixels 21.

In addition, also in the imaging element 11A, in the same manner as the imaging element 11 of FIG. 2, the first vertical signal line 23a and the second vertical signal line 23b are provided in each column in which the sharing pixel 61 is disposed, and a pixel signal that is input to the comparator 52 can be switched by the input switches 51a and 51b.

Thus, in the imaging element 11A, the AD conversion of a pixel signal with a signal level and the AD conversion of a pixel signal with a reset level is alternately performed by the pixels 21 that are respectively included in two sharing pixels of a sharing pixel 61a and a sharing pixel 61b, which are arranged in a column direction. Then, if the AD conversion of the pixel signals of the eight pixels 21 included in the sharing pixel 61a and the sharing pixel 61b concludes, the sharing pixel 61a and the sharing pixel 61b in the subsequent row are set as a processing target, and the AD conversion is repeatedly performed.

In this way, in the imaging element 11A that employs the pixel-sharing structure, in the same manner as the imaging element 11 in FIG. 2, it is possible to attain a speed increase of the AD conversion with a low-power consumption.

Figure 7:
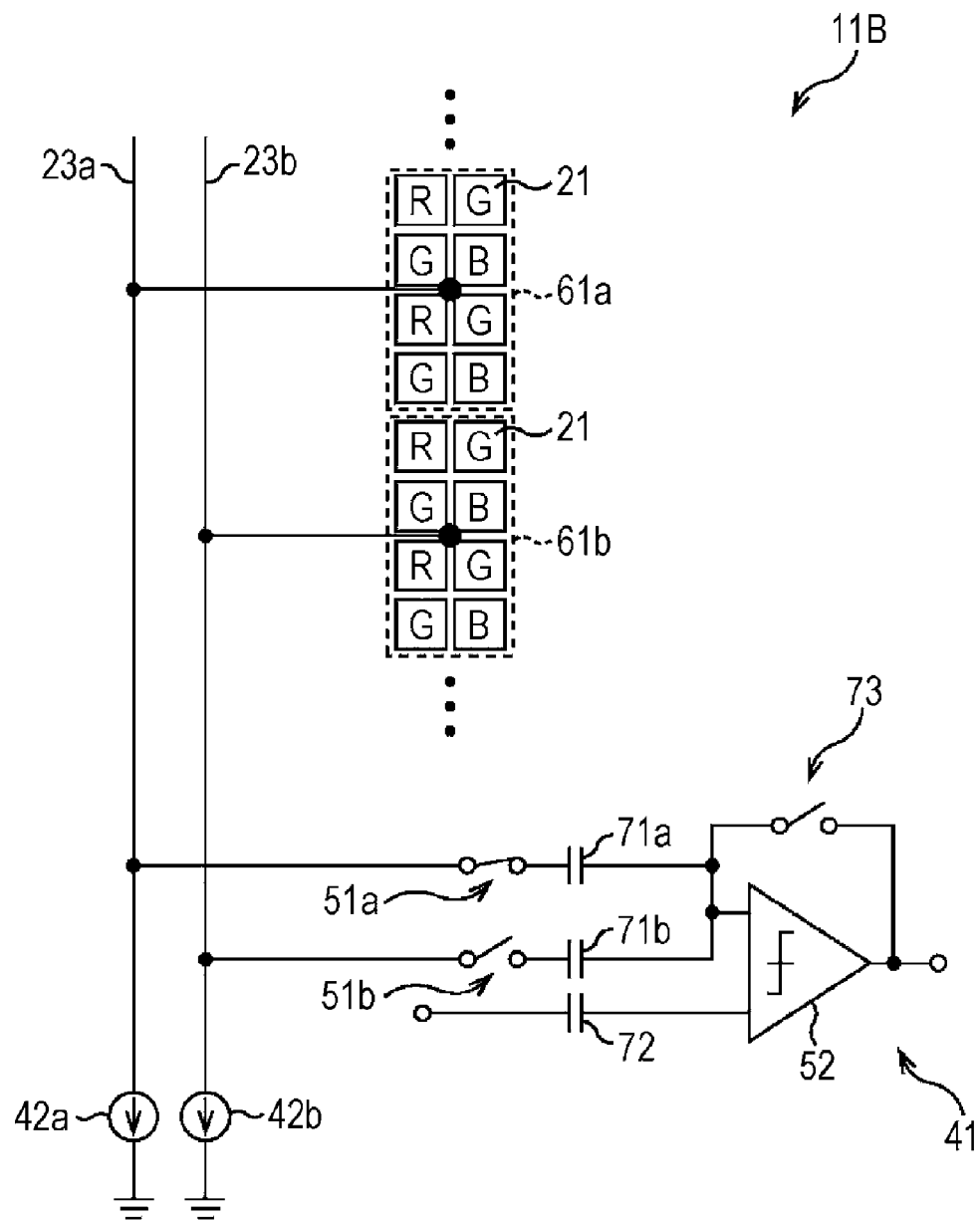
FIG. 7 is a block diagram illustrating a portion of a configuration example according to a third embodiment of the imaging element.

Next, FIG. 7 is a block diagram illustrating a portion of a configuration example according to a third embodiment of the imaging element 11. In an imaging element 11B illustrated in FIG. 7, the same symbols or reference numerals are attached to the same configurations as those of the imaging element 11A illustrated in FIG. 6, and detailed description thereof will be omitted.

That is, the imaging element 11B has a different configuration from the imaging element 11A of FIG. 6 in that auto-zero technology is used to improve one or more characteristics. Specifically, in the imaging element 11B, a capacitor 71a is connected between the input switch 51a and the input terminal on the negative side of the comparator 52, and a capacitor 71b is connected between the input switch 51b and the input terminal on the negative side of the comparator 52. In addition, in the imaging element 11B, the input terminal on the positive side of the comparator 52 is connected to the ramp signal generation circuit 17 (refer to FIG. 1) via a capacitor 72, and an output terminal of the comparator 52 is connected to the input terminal on the negative side via a feedback switch 73.

Thus, the imaging element 11B is configured to offset the noise (kT/C noise) that is generated by the sampling utilizing CDS processing performed by the column processing unit 41.

A sequence of the CDS processing performed by the imaging element 11B will be described with reference to FIG. 8 and FIG. 9.

Figure 8:
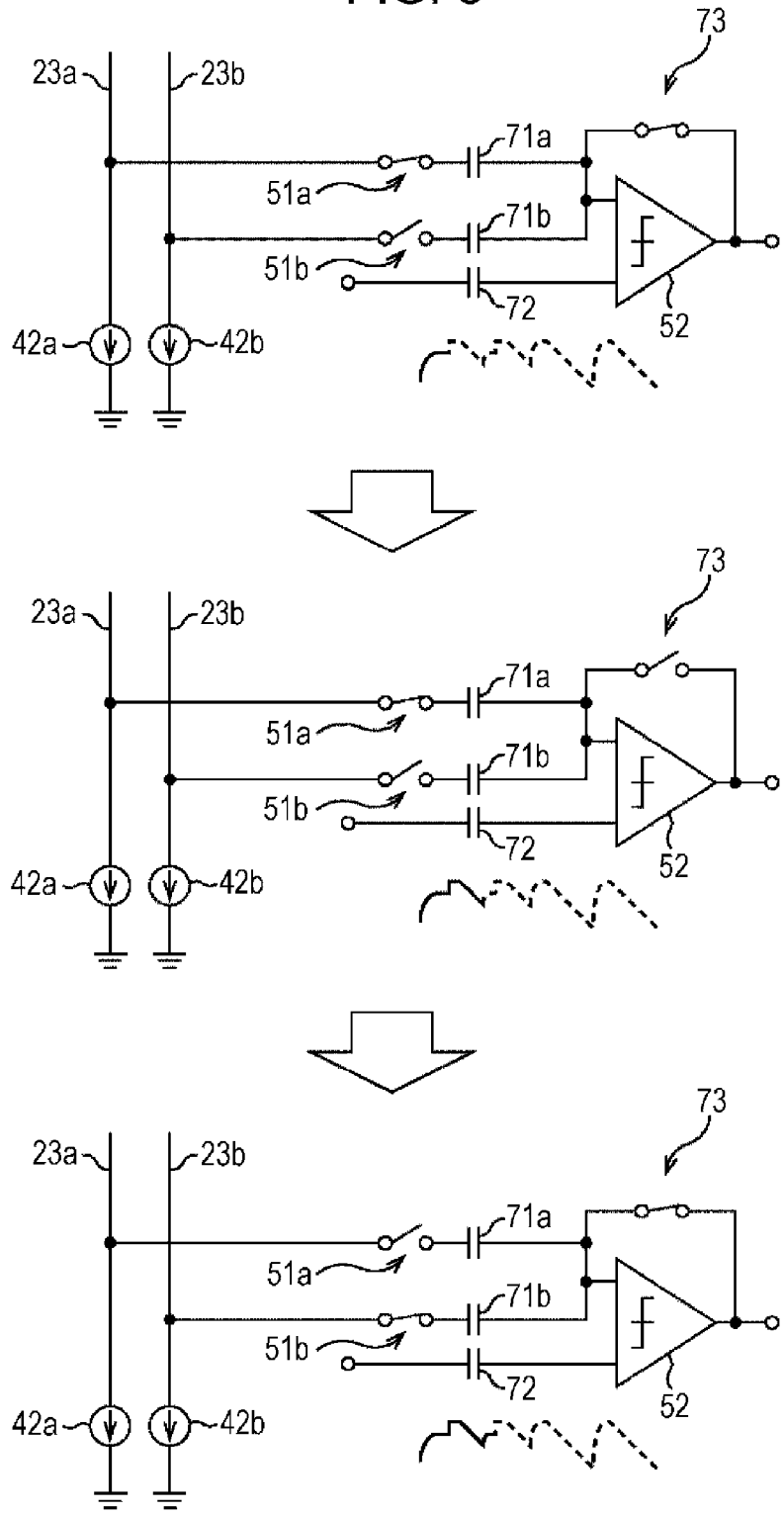
FIG. 8 is a diagram illustrating a sequence of CDS processing that is performed by the imaging element.

To begin with, as illustrated in an upper stage of FIG. 8, in a first step, the input switch 51a and the feedback switch 73 are closed. Next, as illustrated in a middle stage of FIG. 8, in a second step, the feedback switch 73 is opened, the ramp signal starts to fall, and the AD conversion of the pixel signal corresponding to a reset level that is input via the first vertical signal line 23a is performed.

After that, as illustrated in a lower stage of FIG. 8, in a third step, the input switch 51a is opened, and the input switch 51b and the feedback switch 73 are closed. Then, as illustrated in an upper stage of FIG. 9, in a fourth step, the feedback switch 73 is opened, the ramp signal starts to fall, and the AD conversion of the pixel signal corresponding to a reset level that is input via the second vertical signal line 23b is performed.

Figure 9:
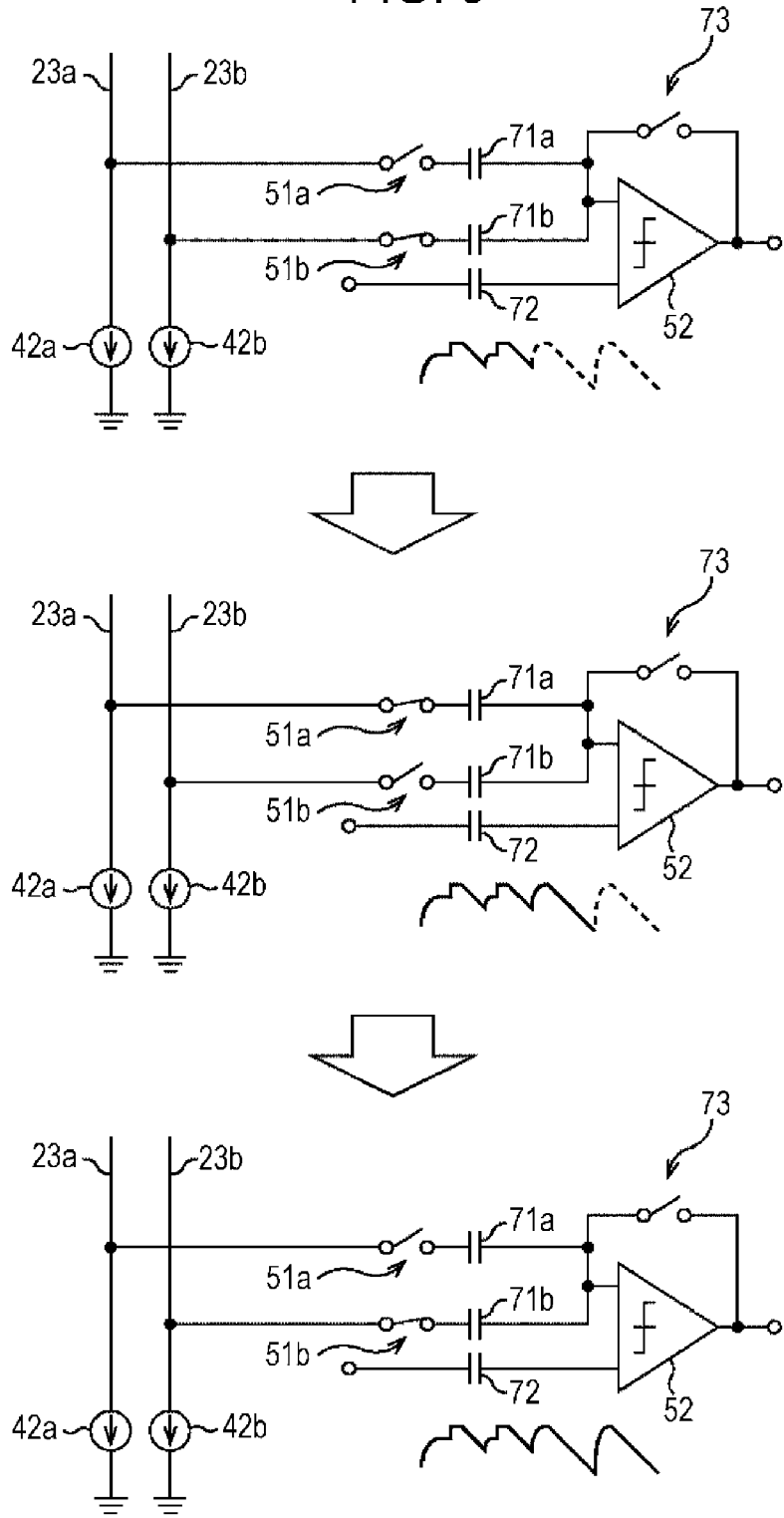
FIG. 9 is a diagram illustrating a sequence of CDS processing that is performed by the imaging element.

Furthermore, as illustrated in a middle stage of FIG. 9, in a fifth step, the input switch 51b is opened, the input switch 51a is closed, the ramp signal starts to fall, and the AD conversion of the pixel signal corresponding to a signal level that is input via the first vertical signal line 23a is performed. Then, as illustrated in a lower stage of FIG. 9, in a sixth step, the input switch 51a is opened, the input switch 51b is closed, the ramp signal starts to fall, and the AD conversion of the pixel signal corresponding to a signal level that is input via the second vertical signal line 23b is performed.

Here, in the transition from the first step to the second step, the kT/C noise is applied to the capacitor 71a connected to the first vertical signal line 23a. After that, in the transition from the third step to the fifth step, one side of the capacitor becomes an open end (high impedance node) such that capacitance charges do not move; thus, a new application of the kT/C noise is avoided. Thus, by acquiring a difference between the results of the AD conversion from the first step to the fifth step, and by performing the digital CDS processing, it is possible to offset the kT/C noise.

Accordingly, the imaging element 11B can capture an image with less noise, can avoid image quality degradation, and can attain an increase in speed of the processing speed.

Figure 10:
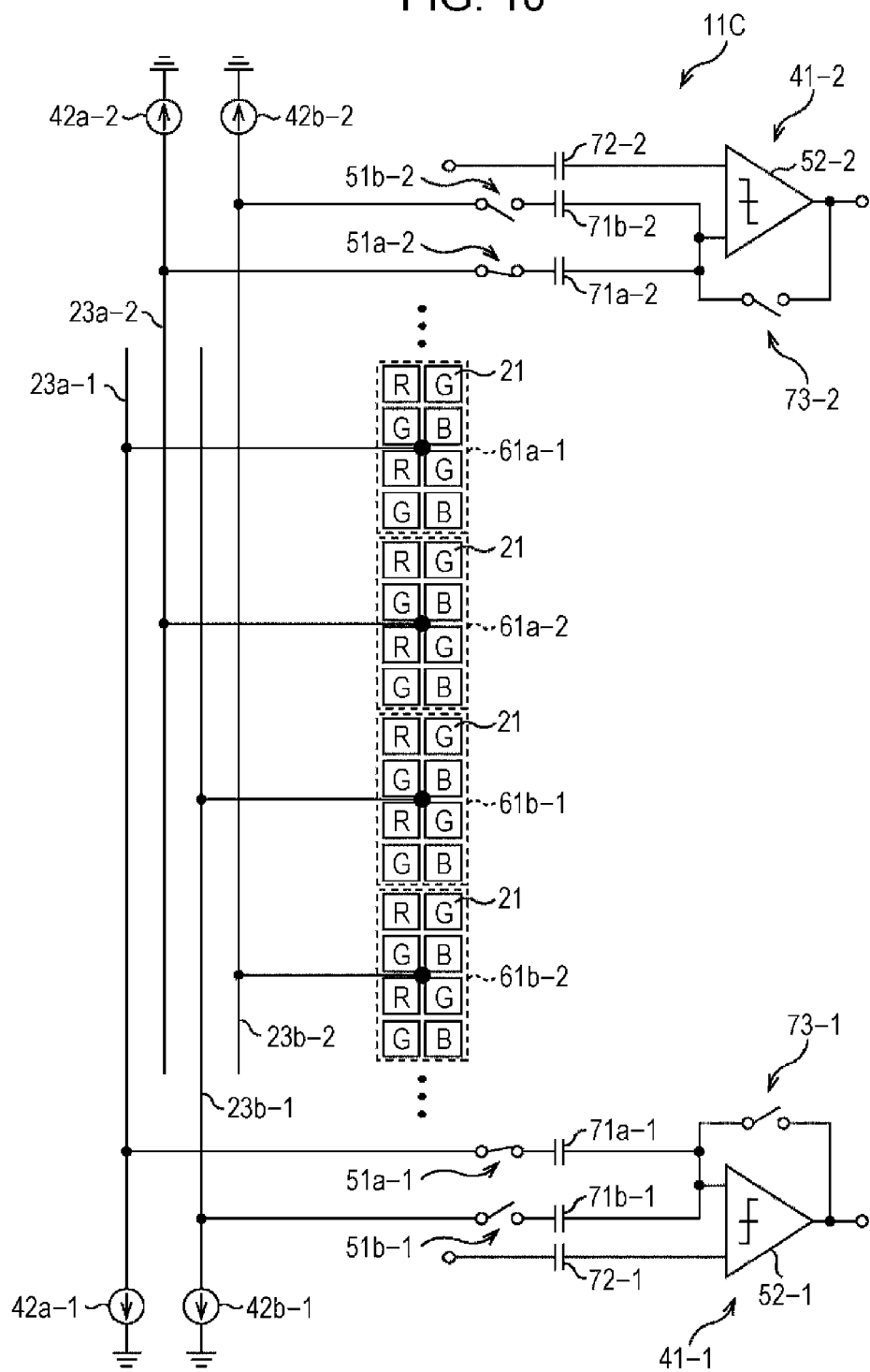
FIG. 10 is a block diagram illustrating a portion of a configuration example according to a fourth embodiment of the imaging element.

Next, FIG. 10 is a block diagram illustrating a portion of a configuration example according to the third embodiment of the imaging element 11. In an image element 11C illustrated in FIG. 10, the same symbols or reference numerals are attached to the same configurations as those of the imaging element 11B illustrated in FIG. 7, and detailed description thereof will be omitted.

As illustrated in FIG. 10, the imaging element 11C has a different configuration from the imaging element 11B of FIG. 7 in that four vertical signal lines of a first vertical signal line 23a-1, a second vertical signal line 23b-1, a third vertical signal line 23a-2, and a fourth vertical signal line 23b-2 are provided in each column of the sharing pixel 61, and two column processing units 41-1 and 41-2 are respectively provided on an upper side and a lower side with respect to a column direction of the pixel area. That is, the imaging element 11C has a configuration in which the third vertical signal line 23a-2, the fourth vertical signal line 23b-2, and the column processing unit 41-2 are added. In addition, a constant current source 42a-1 is connected to the first vertical signal line 23a-1, a constant current source 42b-1 is connected to the second vertical signal line 23b-1, a constant current source 42a-2 is connected to the third vertical signal line 23a-2, and a constant current source 42b-2 is connected to the fourth vertical signal line 23b-2.

In the imaging element 11C, the sharing pixel 61a-1 is connected to the column processing unit 41-1 via the first vertical signal line 23a-1, and the sharing pixel 61b-1 is connected to the column processing unit 41-1 via the second vertical signal line 23b-1. In addition, in the imaging element 11C, the sharing pixel 61a-2 is connected to the column processing unit 41-2 via the third vertical signal line 23a-2, and the sharing pixel 61b-2 is connected to the column processing unit 41-2 via the fourth vertical signal line 23b-2.

Thus, in the imaging element 11C, the AD conversion of the pixel signal corresponding to the signal level and the AD conversion of the pixel signal corresponding to the reset level are alternately performed by the pixels 21 that are respectively included in each of the sharing pixel 61a-1 and the sharing pixel 61b-1, in the column processing unit 41-1. Concurrently with this, in the imaging element 11C, the AD conversion of the pixel signal corresponding to the signal level and the AD conversion of the pixel signal corresponding to the reset level are alternately performed by the pixels 21 that are respectively included in each of the sharing pixel 61a-2 and the sharing pixel 61b-2, in the column processing unit 41-2.

In this way, in the imaging element 11C, the column processing unit 41-1 and the column processing unit 41-2 can concurrently perform the AD conversions, and thus, for example, it is possible to double the speed at which the AD conversion is performed as compared to the imaging element 11B in FIG. 7.

As described above, the imaging elements 11, according to each embodiment described above, have a configuration in which the above-described sample/hold technology is not used, and the number of the column processing units 41 is not increased. It is possible to realize a speed increase of the AD conversion processing without an increase in the power consumption. That is, it is possible to increase power efficiency of the imaging element 11, which can perform fast processing.

Next, a wiring layout of the imaging element 11 will be described.

Figure 11:
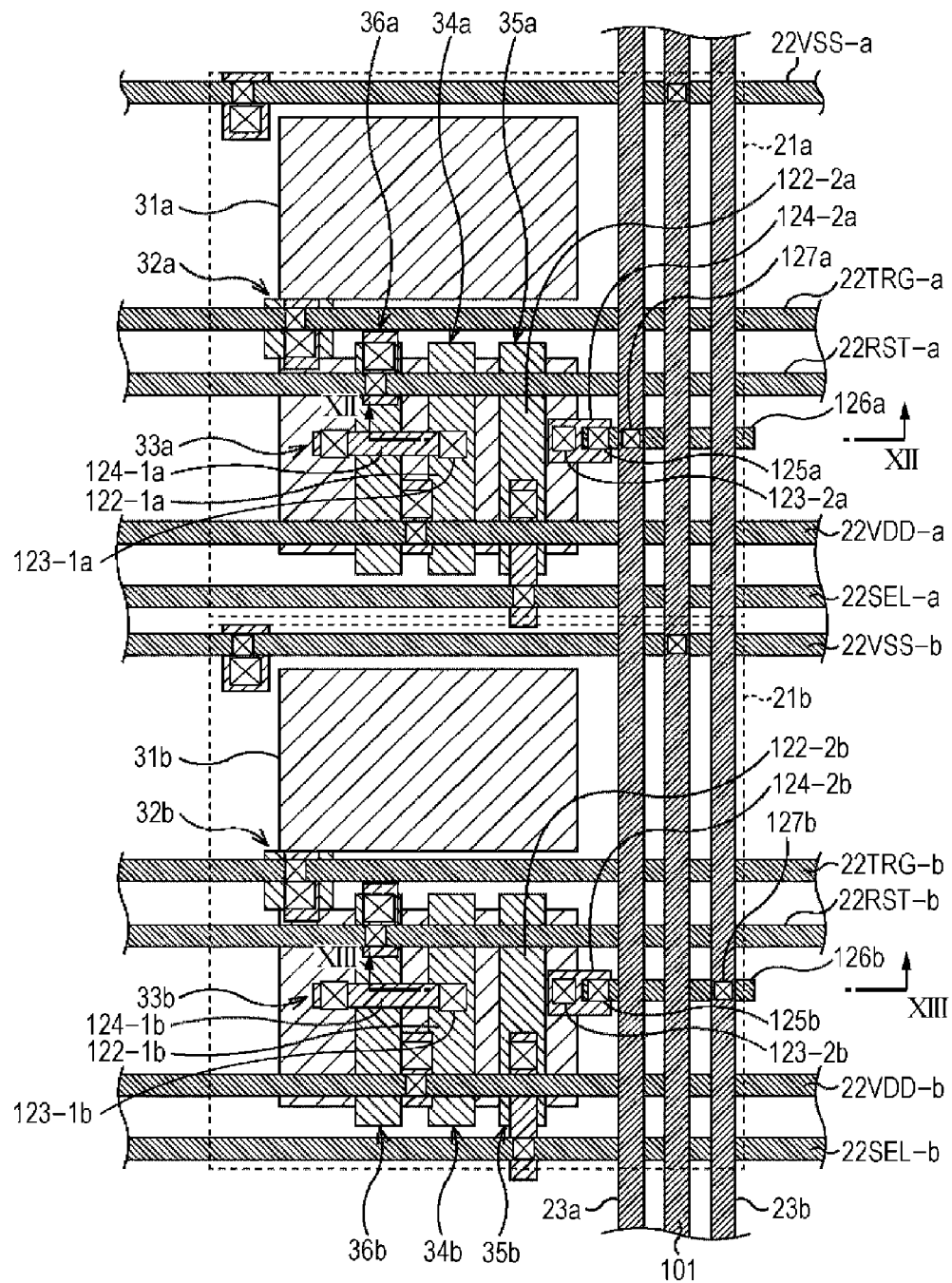
FIG. 11 is a diagram illustrating a first configuration example of a wiring layout of the imaging element.
Figure 12:
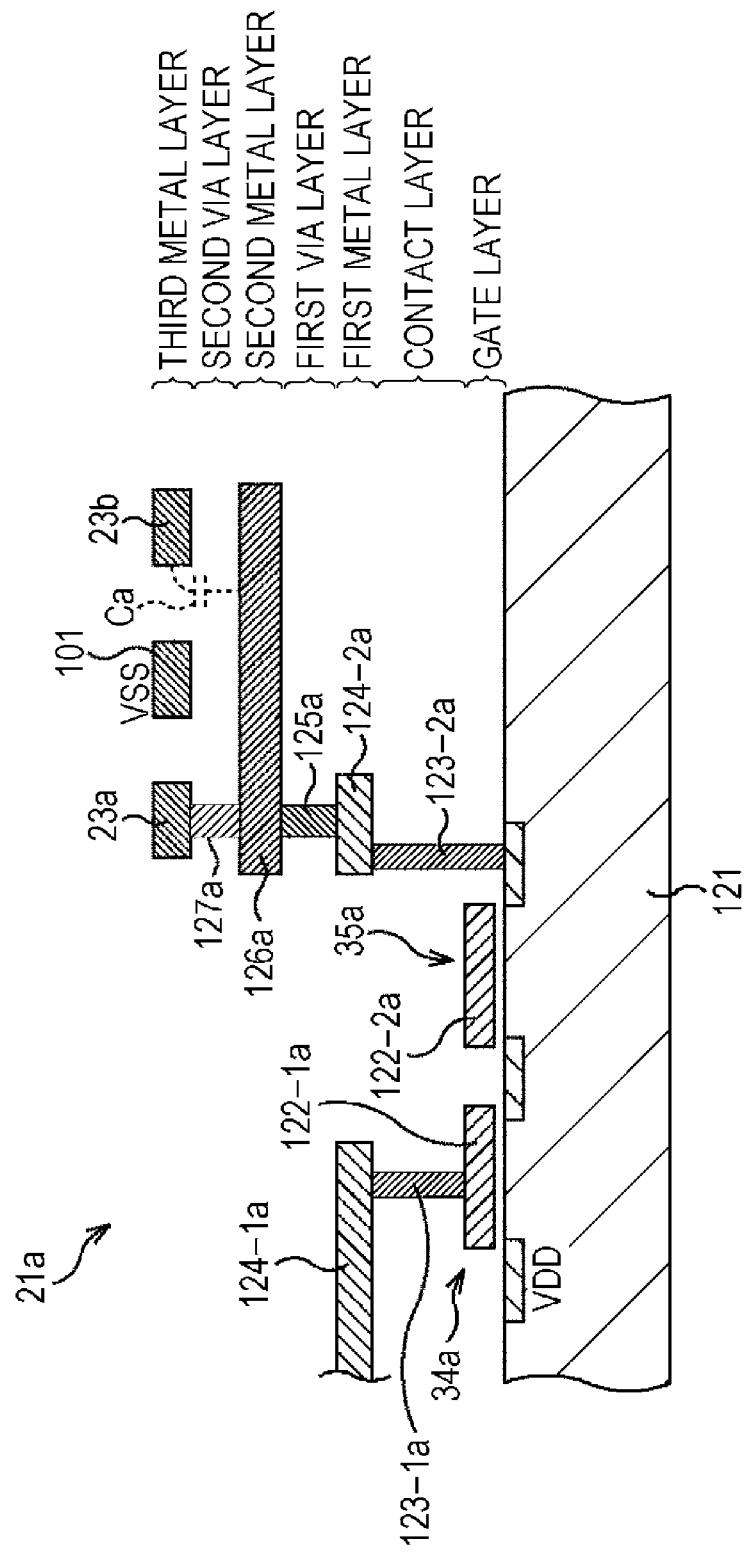
FIG. 12 is a view illustrating a portion corresponding to a XII-XII cross section of FIG. 11.
Figure 13:
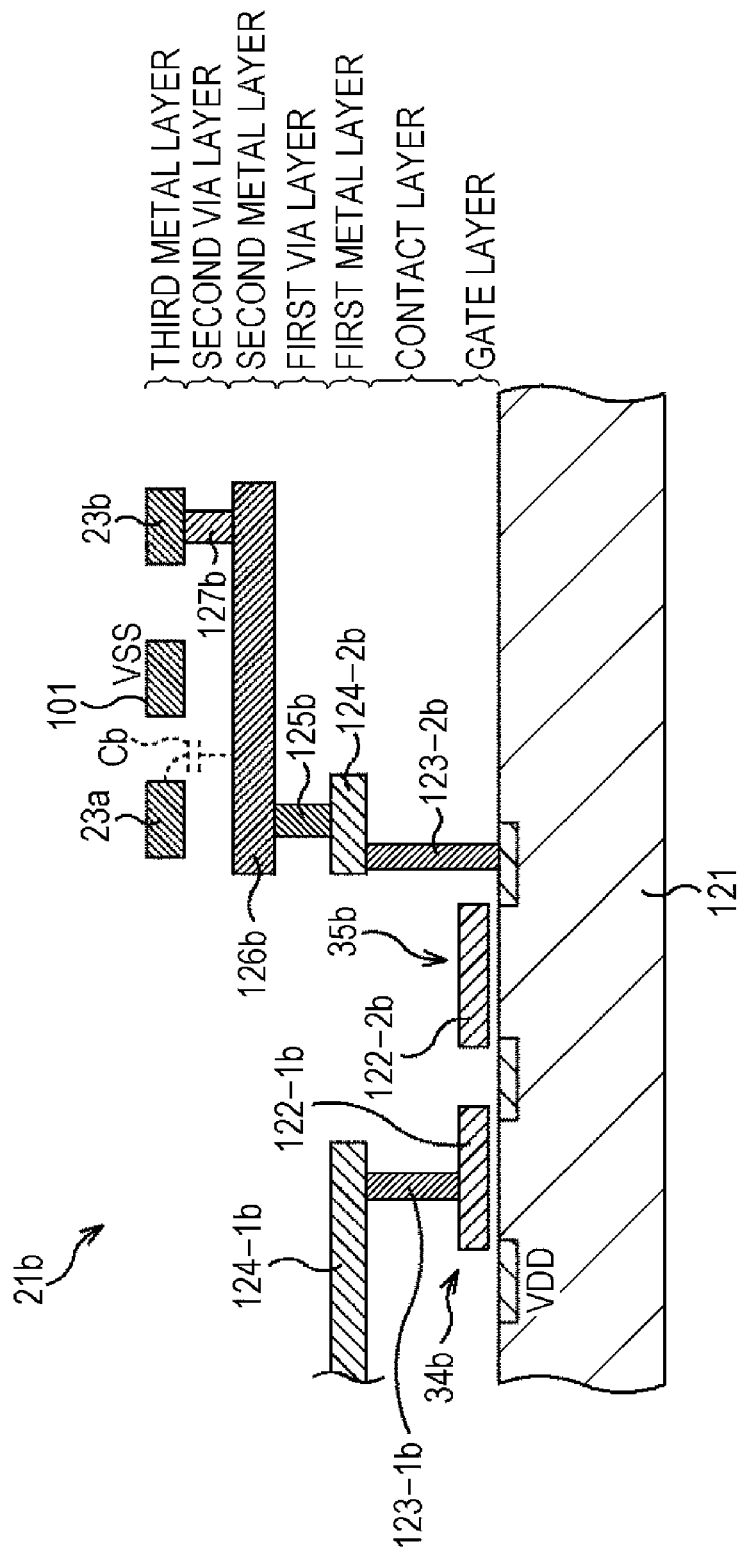
FIG. 13 is a view illustrating portion corresponding to a XIII-XIII cross section of FIG. 11.

To begin with, a first configuration example of a wire layout of the imaging element 11 will be described with reference to FIGS. 11 to 13. FIG. 11 illustrates a planar configuration of the pixel 21a and the pixel 21b that are included in the imaging element 11. FIG. 12 illustrates a cross-sectional configuration of a section corresponding to a XII×XII cross section illustrated in FIG. 11, that is, a connection section that connects the pixel 21a to the first vertical signal line 23a. FIG. 13 illustrates a cross-sectional configuration of a section corresponding to a XIII×XIII cross section illustrated in FIG. 11, that is, a connection section that connects the pixel 21b to the second vertical signal line 23b is illustrated.

As illustrated in FIG. 11, the pixel 21a is configured to include the PD 31a, the transfer transistor 32a, the FD unit 33a, the amplification transistor 34a, the selection transistor 35a, and the reset transistor 36a. In addition, a horizontal signal line VSS-a through which a source voltage is supplied, a horizontal signal line 22TRG-a through which a row transfer pulse is supplied to a transfer transistor 32a, a horizontal signal line 22RST-a through which a row reset pulse is supplied to the reset transistor 36a, a horizontal signal line VDD-a through which a drain voltage is supplied, and a horizontal signal line 22SEL-a through which a row selection pulse is supplied to the selection transistor 35a, are disposed along a horizontal direction of the pixel 21a.

In the same manner, the pixel 21b is configured to include the PD 31b, the transfer transistor 32b, the FD unit 33b, the amplification transistor 34b, the selection transistor 35b, and the reset transistor 36b. In addition, a horizontal signal line VSS-b through which a source voltage is supplied, a horizontal signal line 22TRG-b through which a row transfer pulse is supplied to a transfer transistor 32b, a horizontal signal line 22RST-b through which a row reset pulse is supplied to the reset transistor 36b, a horizontal signal line VDD-b through which a drain voltage is supplied, and a horizontal signal line 22SEL-b through which a row selection pulse is supplied to the selection transistor 35b, are disposed along the horizontal direction of the pixel 21b.

In addition, the first vertical signal line 23a and the second vertical signal line 23b are disposed along a vertical direction in which the pixel 21a and the pixel 21b are arranged. Then, an inter-signal-line shield 101 is disposed between the first vertical signal line 23a and the second vertical signal line 23n. The inter-signal-line shield 101 is connected to the horizontal signal line 22VSS-a and the horizontal signal line 22VSS-b, and is fixed to the source voltage.

Here, since uniformity of shape is generally important in the pixel layout, the pixel 21a and the pixel 21b have the same configuration other than a connection section of the pixel 21a and the first vertical signal line 23a, and a connection section of the pixel 21b and the second vertical signal line 23b. That is, the connection section of the first pixel 21a and the first vertical signal line 23a that are illustrated in FIG. 12 has a different configuration from the connection section of the pixel 21b and the second vertical signal line 23b that are illustrated in FIG. 13.

As illustrated in FIG. 12, in the pixel 21a, a gate layer in which gate electrodes 122-1a and 122-2a are formed, a contact layer in which contacts 123-1a and 123-2a are formed, a first metal layer in which metal wires 124-1a and 124-2a are formed, a first via layer in which a via 125a is formed, a second metal layer in which a metal wire 126a is formed, a second via layer in which a via 127a is formed, and a third metal layer in which the first vertical signal line 23a, the second vertical signal line 23b, and the inter-signal-line shield 101 are formed, are sequentially laminated from a semiconductor substrate (Well) 121 side.

The metal wire 124-1a is connected to the FD unit 33a in FIG. 11, and is connected via the contact 123-1a to the gate electrode 122-1a that configures the amplification transistor 34a. Thus, a potential with a level corresponding to the charges stored in the FD unit 33a is applied to the gate electrode 122-1a via the metal wire 124-1a and the contact 123-1a.

The gate electrode 122-2a configures the selection transistor 35a and is connected to the horizontal signal line 22SEL-a through which the row selection pulse is supplied, as illustrated in FIG. 11. Then, a diffusion layer on a source side of the selection transistor 35a is connected to the first vertical signal line 23a via the contact 123-2a, the metal wire 124-2a, the via 125a, the metal wire 126a, and the via 127a.

In addition, as illustrated in FIG. 13, in the pixel 21b, in the same manner as the pixel 21a, gate electrodes 122-1b and 122-2b are formed in a gate layer, contacts 123-1b and 123-2b are formed in a contact layer, metal wires 124-1b and 124-2b are formed in a first metal layer, a via 125b is formed in a first via layer, a metal wire 126b is formed in a second metal layer, a via 127b is formed in a second via layer, and the first vertical signal line 23a, the second vertical signal line 23b, and the inter-signal-line shield 101 are formed in the third metal layer.

The metal wire 124-1b is connected to the FD unit 33b in FIG. 11, and is connected via the contact 123-1b to the gate electrode 122-1b that configures the amplification transistor 34b. Thus, a potential with a level corresponding to the charges stored in the FD unit 33b is applied to the gate electrode 122-1b via the metal wire 124-1b and the contact 123-1b.

The gate electrode 122-2b configures the selection transistor 35b and is connected to the horizontal signal line 22SEL-b through which the row selection pulse is supplied, as illustrated in FIG. 11. Then, a diffusion layer on a source side of the selection transistor 35b is connected to the second vertical signal line 23b through the contact 123-2b, the metal wire 124-2b, the via 125b, the metal wire 126b, and the via 127b.

As illustrated in FIG. 12 and FIG. 13, in the third metal layer, the inter-signal-line shield 101 that is fixed to the source voltage is disposed between the first vertical signal line 23a and the second vertical signal line 23b. Thus, it is possible to prevent a coupling capacitance from being directly generated between the first vertical signal line 23a and the second vertical signal line 23b, in, for example, the third metal layer. Thus, even if a read operation, such as concurrently and alternately switching the AD conversion and settling of the pixel signal is performed, it is possible to prevent the first vertical signal line 23a and the second vertical signal line 23b from affecting each other, and for example, to prevent crosstalk noise from occurring.

However, in the third metal layer, the first vertical signal line 23a, the second vertical signal line 23b, and the inter-signal-line shield 101 are disposed in a vertical direction. In the second metal layer, the metal wire 126a and the metal wire 126b are disposed in a horizontal direction. That is, a wire layout is formed in such a manner that the vertical signal line 23 is alternately intersected with the metal wire 126 between the third metal layer and the second metal layer.

Accordingly, as illustrated in FIG. 12, a coupling capacitance Ca occurring between the second vertical signal line 23b of the third metal layer and the metal wire 126a of the second metal layer, is increased. That is, the metal wire 126a is connected to the first vertical signal line 23a, and thereby the coupling capacitance Ca indirectly occurs between the first vertical signal line 23a and the second vertical signal line 23b.

In the same manner, as illustrated in FIG. 13, a coupling capacitance Cb occurring between the first vertical signal line 23a of the third metal layer and the metal wire 126b of the second metal layer, is increased. That is, the metal wire 126b is connected to the second vertical signal line 23b, and thereby the coupling capacitance Cb indirectly occurs between the first vertical signal line 23a and the second vertical signal line 23b.

As illustrated above, in the imaging element 11, the AD conversion and the settling of the pixel signal is concurrently performed and a read operation of reading the pixel signal is performed in such a manner that the AD conversion and the settling are alternately switched, in the pixel 21a and the pixel 21b. In the read operation, a shift occurs in the first vertical signal line 23a and the second vertical signal line 23b at a timing in which the pixel signal is read. For this reason, for example, when the settling of the pixel signal of the pixel 21a is not performed, if the pixel signal of the pixel 21b is read, a potential change of the first vertical signal line 23a is transferred to the second vertical signal line 23b through the coupling capacitances Ca and Cb, and thereby there is a possibility that a signal quality is degraded.

As a result, noise of the pixel signal that is transferred through the first vertical signal line 23a and the second vertical signal line 23b is increased, and there is a possibility that the noise significantly affects the image quality. In addition, it is necessary to secure a settling time for sufficiently returning signal quality to an original state, and thereby there is a possibility that a speed increase may not be realized. In this way, a negative influence can occur due to crosstalk through the coupling capacitances Ca and Cb indirectly occurring between the first vertical signal line 23a and the second vertical signal line 23b.

Therefore, a wiring layout that can suppress an occurrence of the negative influence is employed in the imaging element 11.

Figure 14:
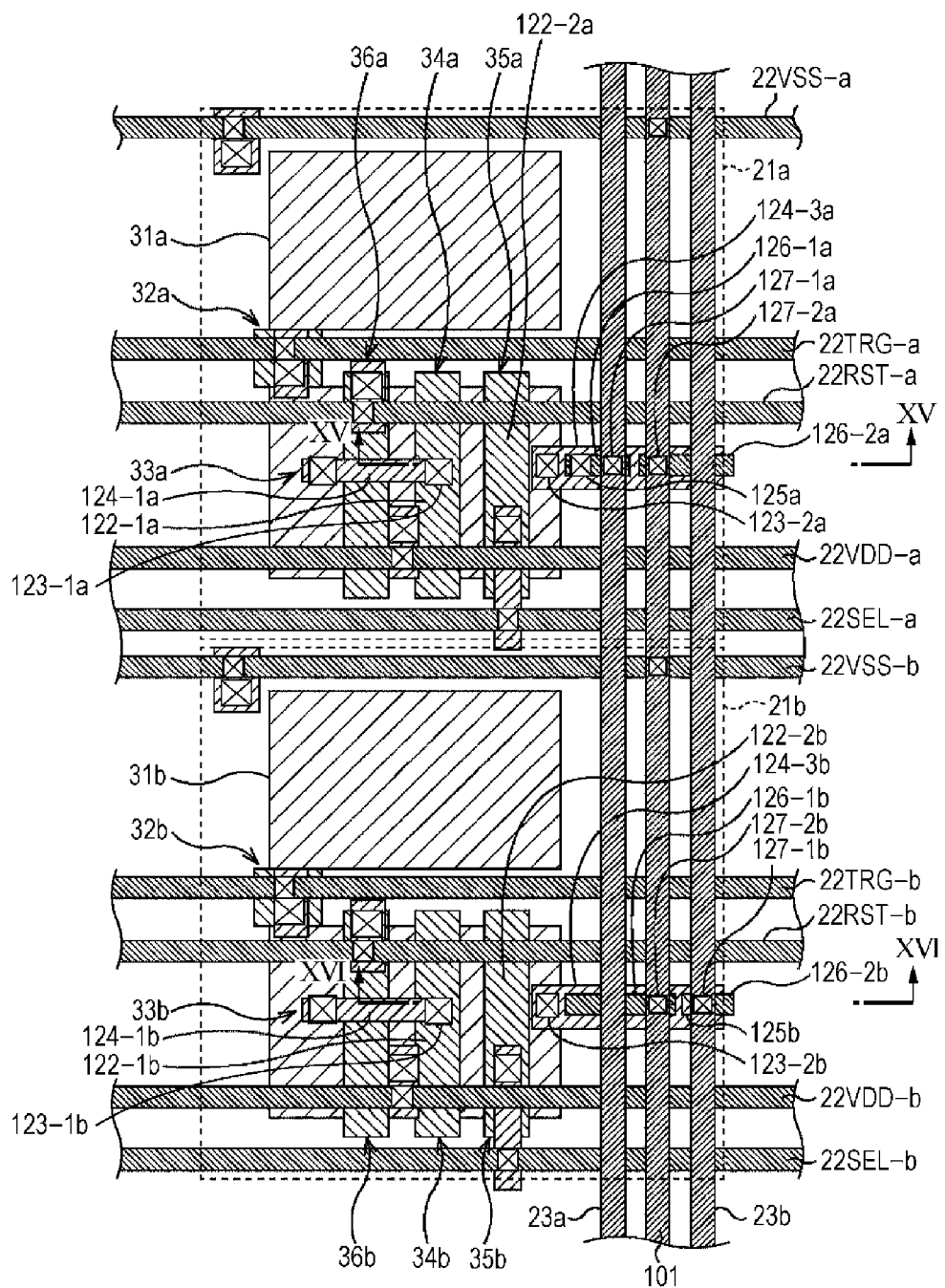
FIG. 14 is a diagram illustrating a second configuration example of a wiring layout of the imaging element.
Figure 15:
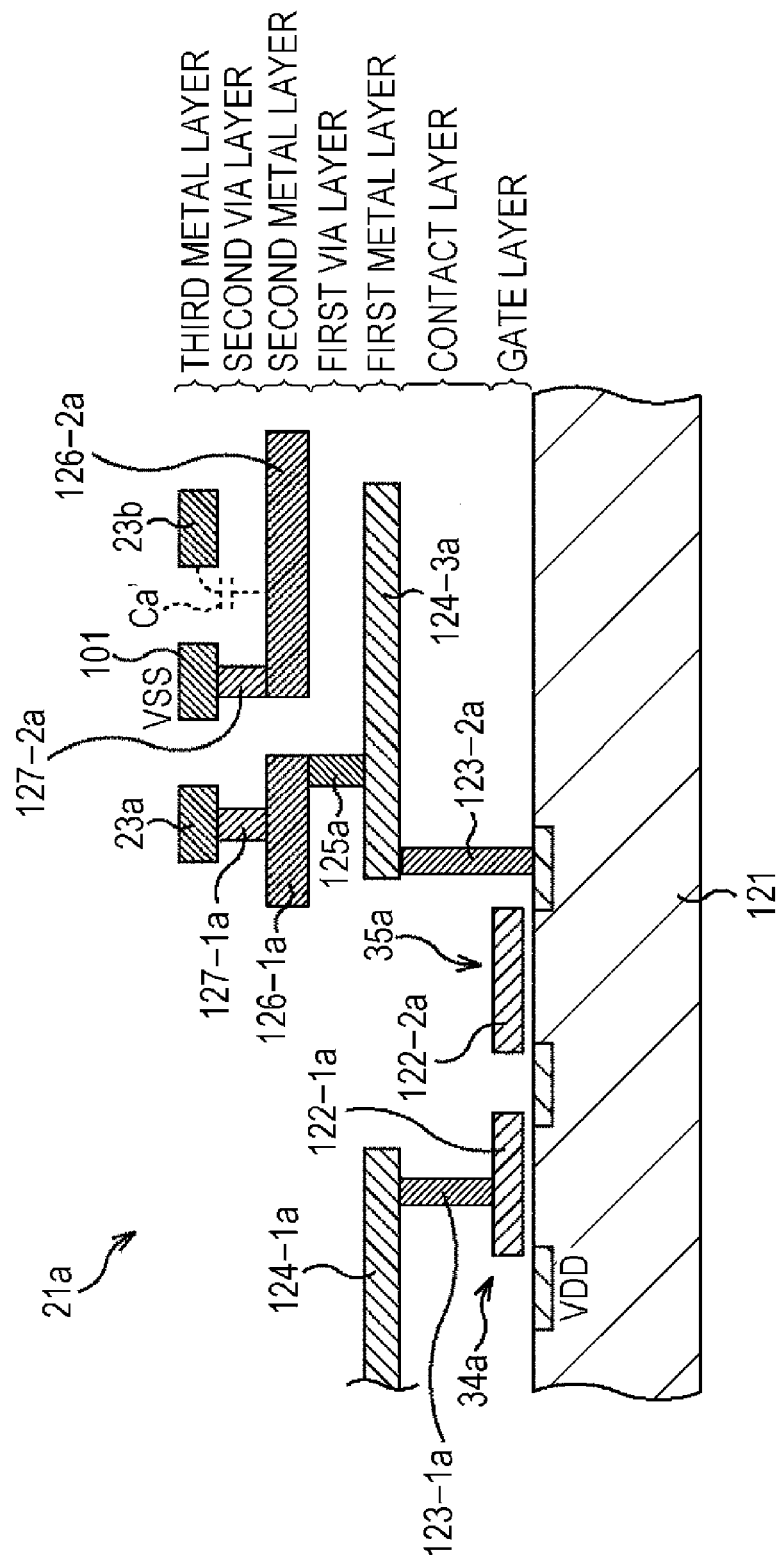
FIG. 15 is a view illustrating portion corresponding to a XV-XV cross section of FIG. 14.
Figure 16:
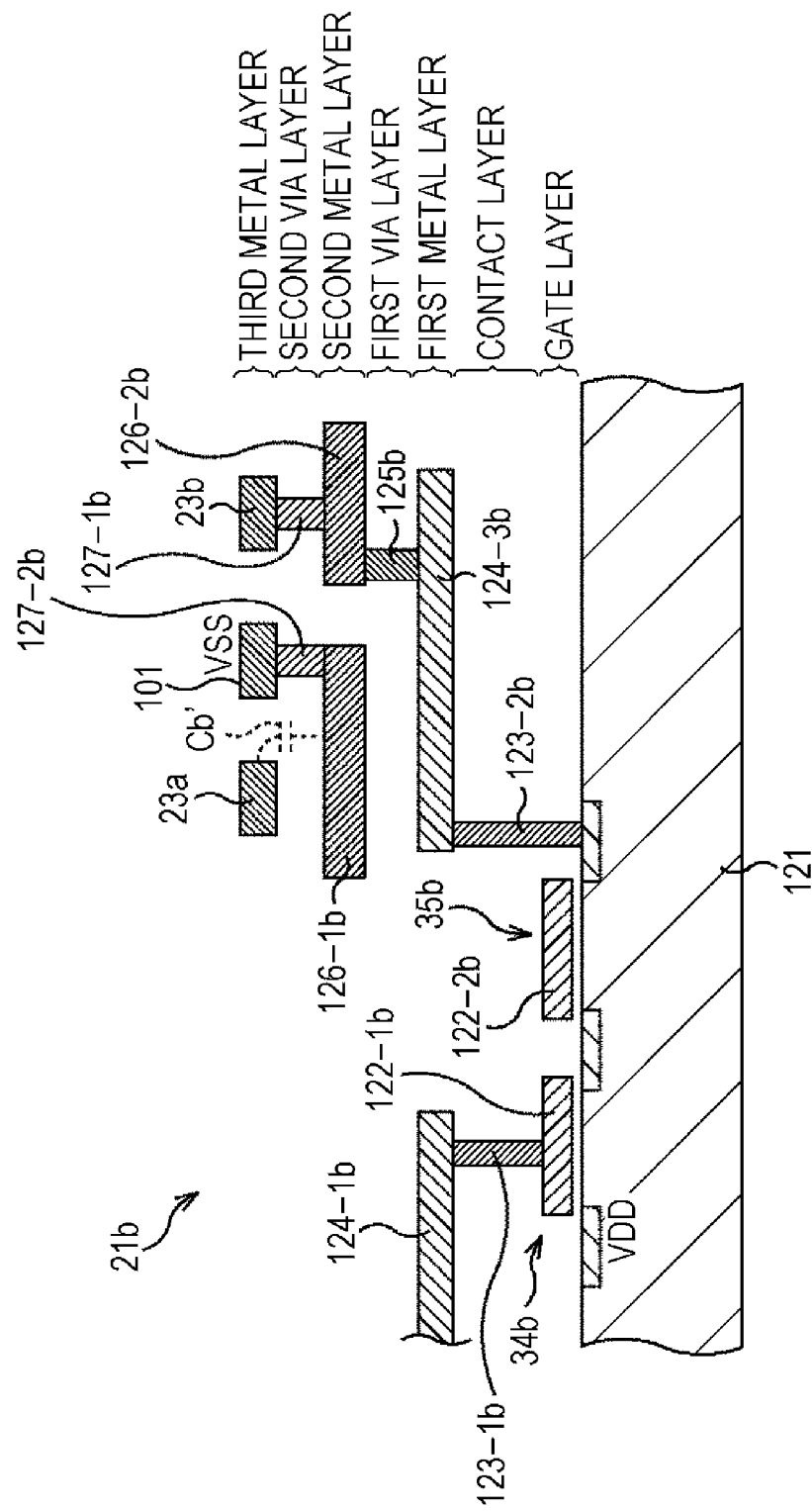
FIG. 16 is a view illustrating portion corresponding to a XVI-XVI cross section of FIG. 14.

Next, a second configuration example of the wiring layout of the imaging element 11 will be described with reference to FIG. 14 to FIG. 16. FIG. 14 illustrates a planar configuration of the pixel 21a and the pixel 21b that are included in the imaging element 11. FIG. 15 illustrates a cross-sectional configuration of a section corresponding to a XV-XV cross section illustrated in FIG. 14, that is, a connection section that connects the pixel 21a to the first vertical signal line 23a. FIG. 16 illustrates a cross-sectional configuration of a section corresponding to a XVI-XVI cross section illustrated in FIG. 14, that is, a connection section that connects the pixel 21b to the second vertical signal line 23b.

In the wiring layout of the imaging element 11 illustrated in FIG. 14 to FIG. 16, the same symbols or reference numerals are attached to the same configurations as those of the wiring layout of the imaging element 11 described with reference to FIG. 11 to FIG. 13 described above, and as such, a detailed description thereof will be omitted. For example, in a second configuration example of the wiring layout of the imaging element 11, a configuration of the connection section illustrated in FIG. 14 to FIG. 16 is different from a configuration of the wiring layout of the imaging element 11 described with reference to FIG. 11 to FIG. 13 described above.

For example, as illustrated in FIG. 15, in the connection section that connects the pixel 21a to the first vertical signal line 23a, the metal wire 124-3a is formed up to a position below the second vertical signal line 23b in the first metal layer. In addition, in the second metal layer, the metal wire 126-1a and the metal wire 126-2a are formed so as to be separated. Then, the metal wire 126-1a is connected to the metal wire 124-3a through the via 125a, and is connected to the first vertical signal line 23a through the via 127-1a. In addition, the metal line 126-2a is connected to the inter-signal-line shield 101 through the via 127-2a.

In this way, in the connection section that connects the pixel 21a to the first vertical signal line 23a, a two-layer structure is formed by the metal wire 124-3a that is provided in the first metal layer, and the metal wire 126-1a and the metal wire 126-2a that are provided in the second metal layer. Then, the metal wire 126-2a that is connected to the inter-signal-line shield 101, which is fixed to the source potential, is disposed between the second vertical signal line 23b and the metal wire 124-3a. Accordingly, a shield structure in which the first vertical signal line 23a is shielded with respect to the second vertical signal line 23b that is not used for reading the pixel signal from the pixel 21a, is provided. That is, a coupling capacitance Ca' is generated between the second vertical signal line 23b and the metal wire 126-2a, and the coupling capacitance Ca (FIG. 12) can be reduced between the first vertical signal line 23a and the second vertical signal line 23b that are described above.

In the same manner, as illustrated in FIG. 16, in the connection section that connects the pixel 21b to the second vertical signal line 23b, the metal wire 124-3b is formed up to a position below the second vertical signal line 23b in the first metal layer. In addition, in the second metal layer, the metal wire 126-1b and the metal wire 126-2b are formed so as to be separated. Then, the metal wire 126-2b is connected to the metal wire 124-3b through the via 125b, and is connected to the second vertical signal line 23b through the via 127-1b. In addition, the metal line 126-1b is connected to the inter-signal-line shield 101 through the via 127-2b.

In this way, in the connection section that connects the pixel 21b to the second vertical signal line 23b, a two-layer structure is formed by the metal wire 124-3b that is provided in the first metal layer, and the metal wire 126-1b and the metal wire 126-2b that are provided in the second metal layer. Then, the metal wire 126-1b that is connected to the inter-signal-line shield 101 which is fixed to the source potential, is disposed between the first vertical signal line 23a and the metal wire 124-3b. Accordingly, a shield structure in which the second vertical signal line 23b is shielded with respect to the first vertical signal line 23a that is not used for reading the pixel signal from the pixel 21b, is provided. That is, a coupling capacitance Cb' is generated between the first vertical signal line 23a and the metal wire 126-1b, and the coupling capacitance Cb (FIG. 13) can be reduced between the first vertical signal line 23a and the second vertical signal line 23b that are described above.

As described above, the imaging element 11 can configure a shield structure for a complementary shield, in the connection section that connects the pixel 21a to the first vertical signal line 23a, and the connection section that connects the pixel 21b to the second vertical signal line 23b.

That is, in the connection section that connects the pixel 21a to the first vertical signal line 23a, a shield structure that shields the first vertical signal line 23a with respect to the second vertical signal line 23b is formed by connecting the metal wire 126-2a, which is disposed between the metal wire 124-3a and the second vertical signal line 23b, to the inter-signal-line shield 101. In the same manner, in the connection section that connects the pixel 21b to the second vertical signal line 23b, a shield structure that shields the second vertical signal line 23b with respect to the first vertical signal line 23a is formed by connecting the metal wire 126-1b which is disposed between the metal wire 124-3b and the first vertical signal line 23a, to the inter-signal-line shield 101.

In this way, it is possible to reduce the coupling capacitance between the first vertical signal line 23a and the second vertical signal line 23b, and to suppress the occurrence of the crosstalk. Thus, it is possible to decrease the noise of the pixel signal that is transferred through the first vertical signal line 23a and the second vertical signal line 23b, and to obtain an image with better image quality. In addition, it is not necessary to secure a long settling time in order to sufficiently return the signal quality to an original state, and since reduction in the amount of settling time is possible, it is possible to increase the processing speed.

Thus, in the imaging element 11 that performs a read operation, such as concurrently and alternately switching the AD conversion and settling of the pixel signal, it is possible to realize an increase in speed and a high accuracy.

The wiring layout described with reference to FIG. 14 to FIG. 16 is not limited to the number of sharing pixels 21, the number of the vertical signal lines 23, and a direction (includes disposal of elements, inversion disposal in a unit pixel, or the like) of the transistors that configure the pixel 21, and can be applied to image element 11 with various configurations.

Furthermore, the present technology is not limited to a configuration in which two vertical signal lines 23 are disposed with respect to a pixel column, as the present technology can be applied to a configuration in which three or more vertical signal lines 23 are disposed, and can perform a complementary shield with respect to a combination of arbitrary vertical signal lines 23. In a configuration in which, for example, four vertical signal lines 23 are disposed, a pair of the third vertical signal line 23 and the fourth vertical signal line 23 may be complementarily shielded with respect to a pair of the first vertical signal line 23 and the second vertical signal line 23. In this configuration, the number of the metal wires 124 in the first metal layer can be reduced by the number of lines corresponding to two vertical signal lines 23, and thus it is possible to prevent a load from increasing.

In addition, for example, by further adding a metal layer to the first to third metal layers described above and thereby configuring the same shield structure, it is possible to further suppress crosstalk.

The shield structure described with reference to FIG. 14 to FIG. 16 may be applied between inputs (between FD units 33) of, for example, a source follower circuit. That is, when a capacitance between the FD units 33 is not ignored with respect to a plurality of FD units 33 in a unit pixel of the sharing pixel 61 illustrated in FIG. 6, a shield structure may be formed between the FD units 33. Accordingly, in the reading operation, such as concurrently and alternately switching the AD conversion and the settling of the pixel signal, it is possible to suppress the negative influence occurring between the plurality of FD units 33 in the unit pixel.

However, as described above, the imaging element 11 is configured to switch the inputs of the comparator 52 using the input switches 51a and 51b. In this configuration, there is a possibility that injection leakage and feedthrough at the time of the switching operation of the input switches 51a and 51b adds noise to the comparator 52. In addition, there is a possibility that a resistor at the time of switching on the input switches 51a and 51b may cause a delay in the settling of the pixel signal that is transferred through the first vertical signal line 23a and the second vertical signal line 23b. Meanwhile, a mounting method is proposed, which doubles reading speed by concurrently performing the reading operation using two comparators in order to speed up the operation of the imaging element. But, in the mounting method, there is a possibility that the size of the comparator is doubled and current consumption is also doubled.

Therefore, the imaging element 11 employs the comparator 52 with a configuration in which differential pair units are provided in parallel with each other, and switches for switching an active state and a standby state of the differential pair units are incorporated, and thereby reduce the likelihood that the size of the comparator is doubled and/or that the current consumption is also doubled. In this configuration, the input switches 51a and 51b are not provided, and the first vertical signal line 23a and the second vertical signal line 23b are directly connected to the comparator 52.

Figure 17:
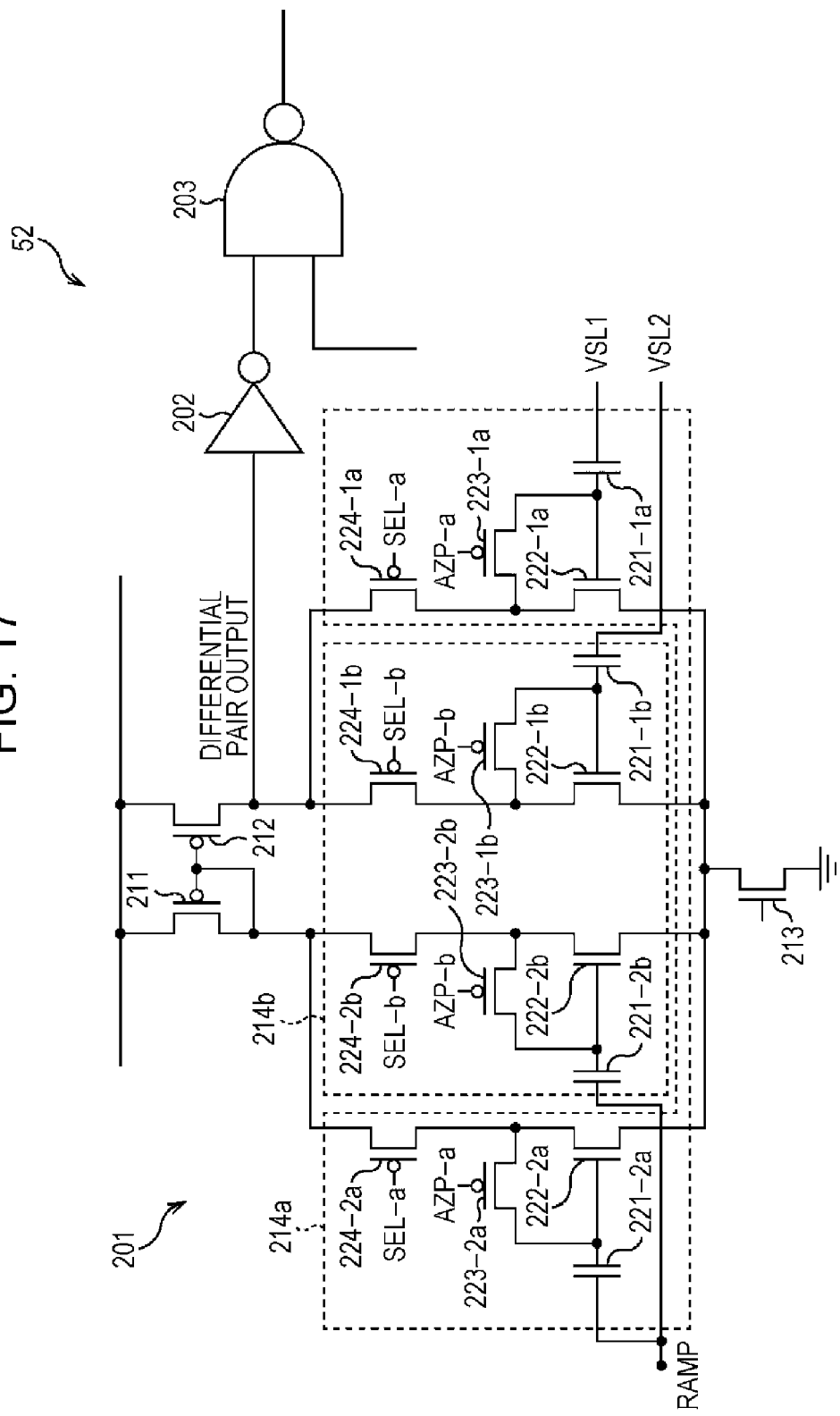
FIG. 17 is a diagram illustrating a circuit configuration of a comparator.

FIG. 17 illustrates a circuit configuration of the comparator 52.

As illustrated in FIG. 17, the comparator 52 is configured to include a differential pair circuit 201, a second amplification unit (2nd AMP) 202, and a third amplification unit (3rd AMP) 203.

The pixel signals from the first vertical signal line 23a and the second vertical signal line 23b, and the ramp signal from the ramp signal generation circuit 17 are input to the differential pair circuit 201. Then, a differential pair output from the differential pair circuit 201 is supplied to the second amplification unit 202, and then amplified and inverted. An output from the second amplification unit 202 is amplified up to a predetermined level by the third amplification unit 203 and thereafter is output as a comparison result signal described above.

The differential pair circuit 201 is configured to include transistors 211 to 213, a first differential pair unit 214a, and a second differential pair unit 214b, and as illustrated in FIG. 17, the first differential pair unit 214a and the second differential pair unit 214b are provided in parallel.

The first differential pair unit 214a is connected to the first vertical signal line 23a and the ramp signal generation circuit 17, and compares the pixel signal that is supplied through the first vertical signal line 23a with the ramp signal that is supplied from the ramp signal generation circuit 17. The second differential pair unit 214b is connected to the second vertical signal line 23b and the ramp signal generation circuit 17, and compares the pixel signal that is supplied through the second vertical signal line 23b with the ramp signal that is supplied from the ramp signal generation circuit 17.

The first differential pair unit 214a is configured to include a pair of capacitors 221-1a and 221-2a, a pair of transistors 222-1a and 222-2a, a pair of transistors 223-1a and 223-2a, and a pair of transistors 224-1a and 224-2a.

The capacitor 221-1a is connected to the first vertical signal line 23a and retains a potential according to a level of the pixel signal, and the capacitor 221-2a is connected to the ramp signal generation circuit 17 and retains a potential according to a level of the ramp signal.

A potential that is retained in the capacitor 221-1a is applied to a gate electrode of the transistor 222-1a, and a potential that is retained in the capacitor 221-2a is applied to a gate electrode of the transistor 222-2a. Thus, the pair of transistors 222-1a and 222-2a is used for comparing the pixel signal that is supplied through the first vertical signal line 23a with the ramp signal that is supplied from the ramp signal generation circuit 17.

The transistor 223-1a is disposed so as to be connected between a connection point of the gate electrodes of the capacitor 221-1*a* and the transistor 222-1*a*, and a connection point of the transistor 222-1*a* and the transistor 224-1*a*. In addition, the transistor 223-2*a* is disposed so as to be connected between a connection point of the gate electrodes of the capacitor 221-2*a* and the transistor 222-2*a*, and a connection point of the transistor 222-2*a* and the transistor 224-2*a*. Thus, the pair of the transistors 223-1*a* and 223-2*a* is driven by an auto-zero control signal AZP-a, and performs an auto-zero operation of the first differential pair unit 214*a*.

The transistor 224-1*a* is disposed on a source side of the transistor 222-1*a* to which the potential according to the level of the pixel signal is applied. The transistor 224-2*a* is disposed on a source side of the transistor 222-2*a* to which the potential according to the level of the ramp signal is applied. Then, the pair of transistors 224-1*a* and 224-2*a* is driven by a comparison operation selection signal SEL-a, and is used for switching an active state and a standby state of the first differential pair unit 214*a*, by performing ON/OFF of power supplying to the pair of transistors 222-1*a* and 222-2*a*.

That is, the pair of transistors 224-1*a* and 224-2*a* is turned on, and thereby the power is supplied to the pair of transistors 222-1*a* and 222-2*a*. Accordingly, the first differential pair unit 214*a* enters an active state (ACTIVE), and the pixel signal is compared with the ramp signal. Meanwhile, the pair of transistors 224-1*a* and 224-2*a* is turned off, and thereby the power is not supplied to the pair of transistors 222-1*a* and 222-2*a*. Accordingly, the first differential pair unit 214*a* enters a standby state (Standby), and the comparison of the pixel signal with the ramp signal is stopped.

In the same manner as the first differential pair unit 214*a*, the second differential pair unit 214*b* is configured to include a pair of capacitors 221-1*b* and 221-2*b*, a pair of transistors 222-1*b* and 222-2*b*, a pair of transistors 223-1*b* and 223-2*b*, and a pair of transistors 224-1*b* and 224-2*b*.

Thus, the pair of transistors 224-1*b* and 224-2*b* is turned on, and thereby the power is supplied to the pair of transistors 222-1*b* and 222-2*b*. Accordingly, the second differential pair unit 214*b* enters an active state, and the pixel signal is compared with the ramp signal. Meanwhile, the pair of transistors 224-1*b* and 224-2*b* is turned off, and thereby the power is not supplied to the pair of transistors 222-1*b* and 222-2*b*. Accordingly, the second differential pair unit 214*b* enters the standby state, and the comparison of the pixel signal with the ramp signal is stopped.

The comparator 52 is configured in this way: the comparison operation selection signal SEL-a that is supplied to the transistors 224-1*a* and 224-2*a* and the comparison operation selection signal SEL-b that is supplied to the transistors 224-1*b* and 224-2*b* are mutually inverted in level at the same timing. Accordingly, the active state and the standby state of the first differential pair unit 214*a* and the second differential pair unit 214*b* can be alternately switched.

For example, in the AD conversion periods (the above-described second and fourth operation periods of FIG. 3) of the pixel signals that are output from the pixel 21*a* connected to the first vertical signal line 23*a*, the first differential pair unit 214*a* can be set as the active state, and the second differential pair unit 214*b* can be set as the standby state. In addition, in the AD conversion periods (the above-described first and third operation periods of FIG. 3) of the pixel signals that are output from the pixel 21*b* connected to the second vertical signal line 23*b*, the second differential pair unit 214*b* can be set as the active state, and the first differential pair unit 214*a* can be set as the standby state.

In this way, in the imaging element 11, the pixel signal that is a target, an AD conversion of which is performed in the column processing unit 41, can be switched by the switching units (the pair of transistors 224-1*a* and 224-2*a*, and the pair of transistors 224-1*b* and 224-2*b*) that are incorporated in the comparator 52.

Thus, since the imaging element 11, including the comparator 52 with such a configuration, can switch the inputs within the comparator 52, it is possible to configure the image element 11 without the input switches 51*a* and 51*b*. Accordingly, it is possible to avoid a negative influence caused by a configuration in which the input switches 51*a* and 51*b* are provided, for example, noise that is generated when the input switches 51*a* and 51*b* are switched, or a negative influence, such as a delay of the settling caused by an ON resistance of the input switches 51*a* and 51*b*.

Accordingly, the imaging element 11 can capture an image with less noise and can further attain the speed increase.

In addition, compared to a configuration in which the speed increase can be attained by providing two comparators, the comparator 52 can attain a low-power consumption and miniaturization. That is, since the comparator 52 shares a current path of the first differential pair unit 214*a* and the second differential pair unit 214*b* and shares the second amplification unit 202 and the third amplification unit 203, the comparator 52 can be driven with the same current consumption as that of the configuration in which one comparator is provided, and can be mounted in an area reduced by the size of the sharing portion. For example, the comparator 52 can be realized by area size increase alone for providing the first differential pair unit 214*a* on an outside of the second differential pair unit 214*b*, compared to the comparator having a configuration in which only the second differential pair unit 214*b* is included, and thereby it is possible to reduce trade-off to chip specifications.

Figure 18:
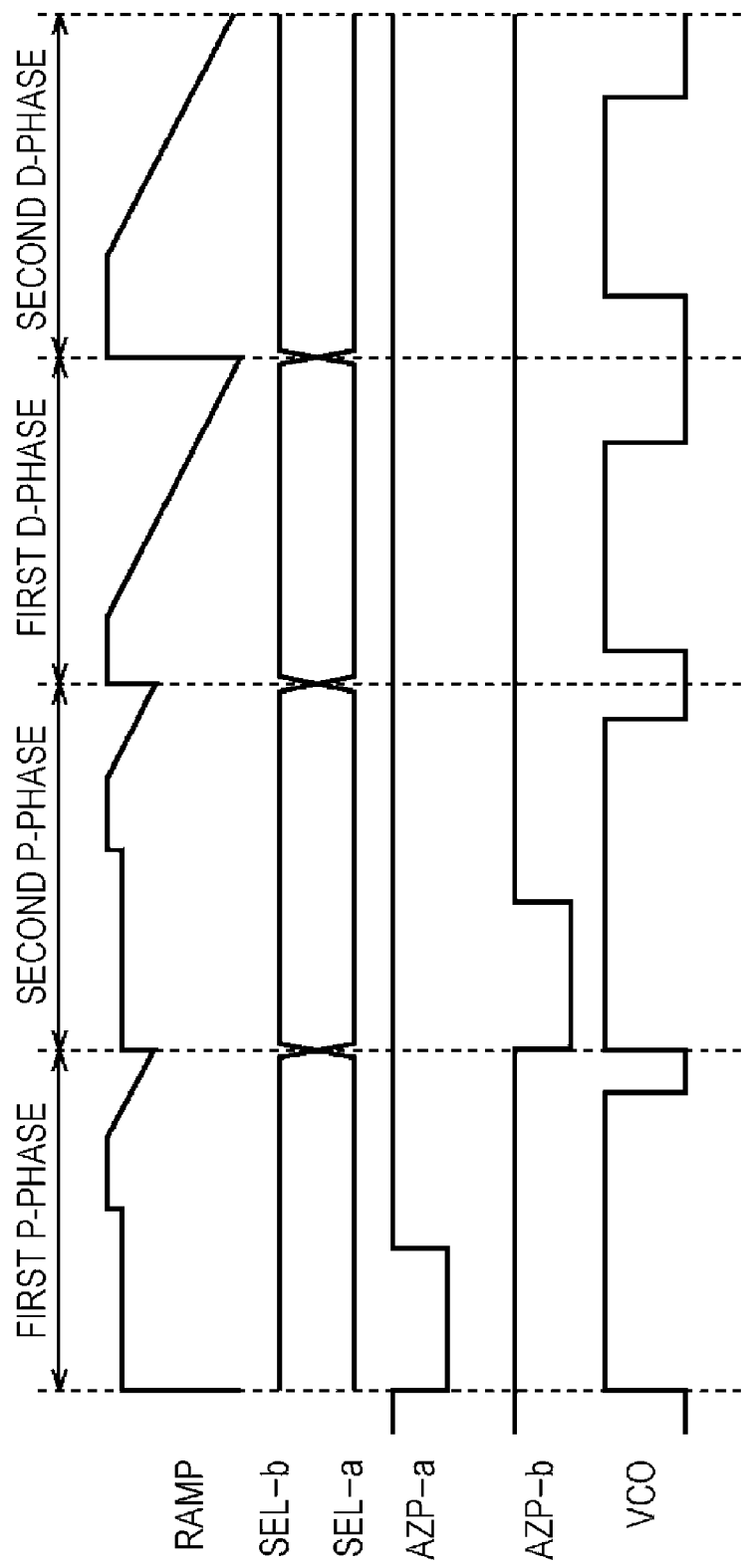
FIG. 18 is a timing chart for explaining a drive of the comparator.

Next, FIG. 18 illustrates a timing chart for explaining driving of the comparator 52.

FIG. 18 illustrates sequentially from the top, the ramp signal RAMP that is supplied from the ramp signal generation circuit 17, the comparison operation selection signal SEL-a that is supplied to the pair of transistors 224-1*a* and 224-2*a*, the comparison operation selection signal SEL-b that is supplied to the pair of transistors 224-1*b* and 224-2*v*, the auto-zero control signal AZP-a that is supplied to the pair of transistors 223-1*a* and 223-2*a*, the auto-zero control signal AZP-b that is supplied to the pair of transistors 223-1*b* and 223-2*b*, and the comparison result signal VCO that is output from the comparator 52.

To begin with, in a P phase of a first cycle, while the comparison operation selection signal SEL-a goes to an L level and the first differential pair unit 214*a* enters an active state, the comparison operation selection signal SEL-b goes to a H level and the second differential pair unit 214*b* enters a standby state. In addition, the auto-zero control signal AZP-a goes to the L level and the auto-zero operation of the first differential pair unit 214*a* is performed in a first half of the P phase of the first cycle, and thereafter the AD conversion of the pixel signal with the reset level is performed by the first differential pair unit 214*a*. Accordingly, the comparison result signal VCO is inverted according to the pixel signal with the reset level that is input through the first vertical signal line 23*a*.

Next, in a P phase of a second cycle, while the comparison operation selection signal SEL-a goes to the H level and the first differential pair unit 214*a* enters the standby state, the comparison operation selection signal SEL-b goes to the L level and the second differential pair unit 214*b* enters the active state. In addition, the auto-zero control signal AZP-b goes to the L level and the auto-zero operation of the second differential pair unit 214b is performed in a first half of the P phase of a second cycle, and thereafter the AD conversion of the pixel signal with the reset level is performed by the second differential pair unit 214b. Accordingly, the comparison result signal VCO is inverted according to the pixel signal with the reset level that is input through the second vertical signal line 23b.

Subsequently, in a D phase of a first cycle, while the comparison operation selection signal SEL-a goes to the L level and the first differential pair unit 214a enters the active state, the comparison operation selection signal SEL-b goes to the H level and the second differential pair unit 214b enters the standby state. Then, the AD conversion of the pixel signal with the signal level is performed by the first differential pair unit 214a, and the comparison result signal VCO is inverted according to the pixel signal with the signal level that is input through the first vertical signal line 23a.

Then, in a D phase of a second cycle, while the comparison operation selection signal SEL-a goes to the H level and the first differential pair unit 214a enters the standby state, the comparison operation selection signal SEL-b goes to the L level and the second differential pair unit 214b enters the active state. Then, the AD conversion of the pixel signal with the signal level is performed by the second differential pair unit 214b, and the comparison result signal VCO is inverted according to the pixel signal with the signal level that is input through the second vertical signal line 23b.

In this way, also in the imaging element 11 that includes the comparator 52 with the configuration illustrated in FIG. 17, the CDS operation performed by the P phase and the D phase can be performed, in the same manner as in the related art.

In addition, as illustrated in FIG. 18, by performing an inversion operation of the comparison operation selection signal SEL-a and the comparison operation selection signal SEL-b, a control of alternately selecting the active state and the standby state of the first differential pair unit 214a and the second differential pair unit 214b is performed. Thus, when the comparison operation selection signal SEL-a is in the H level, the comparison operation selection signal SEL-b goes to the L level, and thereby it is possible to prevent the signal of the second differential pair unit 214b in the active state from being propagated to the first differential pair unit 214a in the standby state. On the contrary, when the comparison operation selection signal SEL-b is in the H level, the comparison operation selection signal SEL-a goes to the L level, and thereby it is possible to prevent the signal of the first differential pair unit 214a in the active state from being propagated to the second differential pair unit 214b in the standby state.

For example, in the comparator 52, the comparison operation selection signal SEL-b that is supplied to the transistors 224-1b and 224-2b, and the auto-zero control signal AZP-b that is supplied to the transistors 223-1b and 223-2b can be constantly fixed to the H level. In this case, the first differential pair unit 214a is constantly in the active state, the second differential pair unit 214b is constantly in the standby state, and the comparator 52 can perform the same drive as that of the comparator of the related art that uses only the first differential pair unit 214a. On the contrary, when the comparison operation selection signal SEL-a and the auto-zero control signal AZP-a are constantly fixed to the H level, the comparator 52 can perform the same drive as that of the comparator of the related art that uses only the second differential pair unit 214b.

Figure 19:
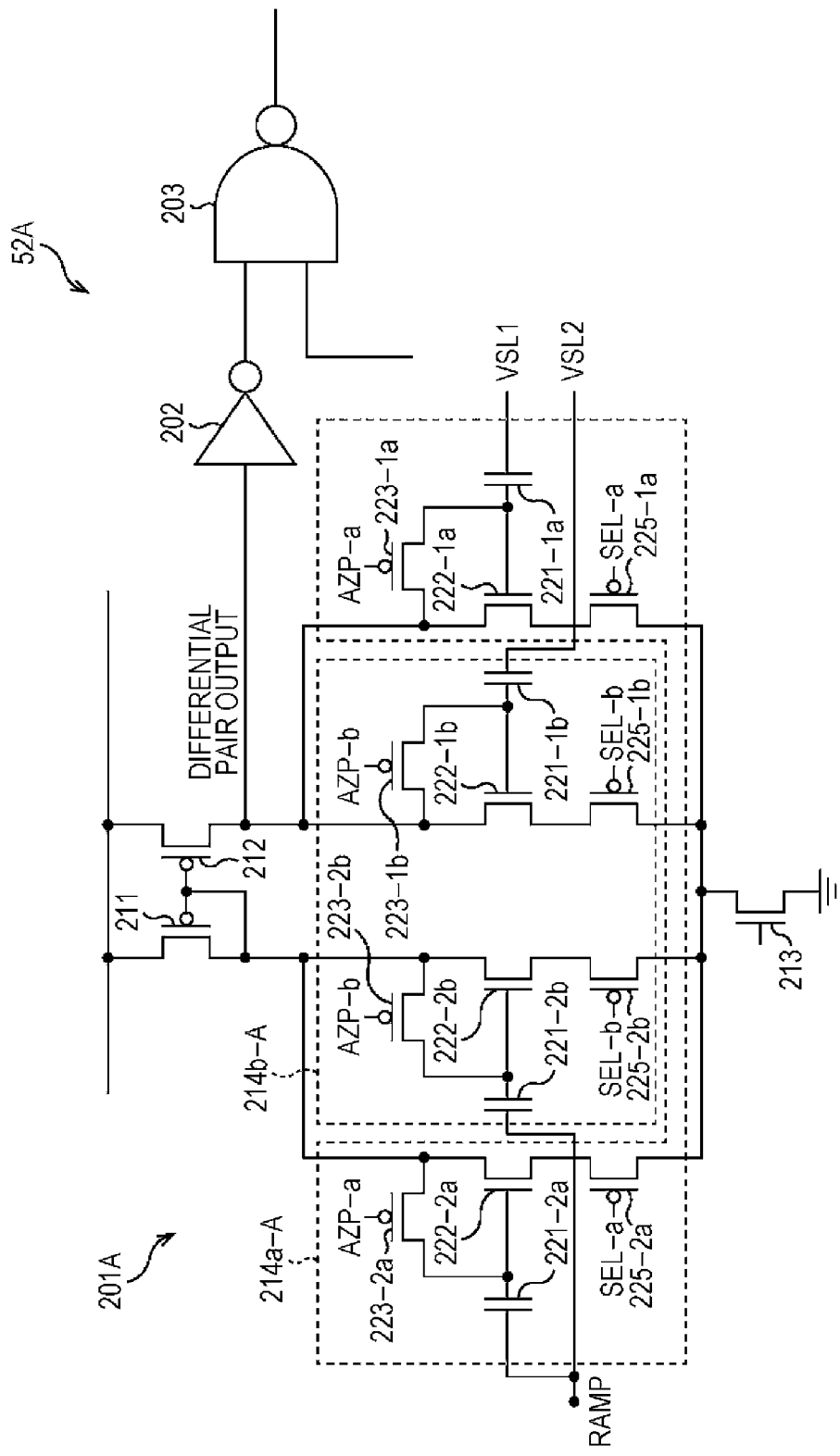
FIG. 19 is a diagram illustrating a first modification example of a circuit configuration of the comparator.

FIG. 19 illustrates a first modification example of a circuit configuration of the comparator 52.

In a comparator 52A illustrated in FIG. 19, the same symbols or reference numerals are attached to the same configurations as those of the comparator 52 of FIG. 17, and detailed description thereof will be omitted. That is, the comparator 52A is the same as the comparator 52 of FIG. 17 in that the comparator 52A includes the second amplification unit 202 and the third amplification unit 203 and a differential pair circuit 201A includes transistors 211 to 213. In addition, the comparator 52A has the same configuration as that of the comparator 52 of FIG. 17 in that a first differential pair unit 214a-A and a second differential pair unit 214b-A are provided in parallel with each other.

Meanwhile, in the comparator 52A, disposal of the transistors that are used for switching the active state and the standby state of the first differential pair unit 214a-A and the second differential pair unit 214b-A is different from that of the comparator 52 of FIG. 17.

That is, in the first differential pair unit 214a of the comparator 52 of FIG. 17, a pair of the transistors 224-1a and 224-2a that is used for switching the active state and the standby state are respectively disposed on source sides of a pair of the transistors 222-1a and 222-2a that is used for comparing signals. In addition, in the second differential pair unit 214b of the comparator 52 of FIG. 17, a pair of the transistors 224-1b and 224-2b that is used for switching the active state and the standby state are respectively disposed on source sides of a pair of the transistors 222-1b and 222-2b that is used for comparing signals.

In contrast to this, the first differential pair unit 214a-A of the comparator 52A has a configuration in which a pair of the transistors 225-1a and 225-2a that is used for switching the active state and the standby state are respectively disposed on drain sides of a pair of the transistors 222-1a and 222-2a that is used for comparing signals. In the same manner, the second differential pair unit 214b-A of the comparator 52A has a configuration in which a pair of the transistors 225-1b and 225-2b that is used for switching the active state and the standby state are respectively disposed on drain sides of a pair of the transistors 222-1b and 222-2b that is used for comparing signals.

The comparator 52A is configured in this way, and can perform the drive described above with reference to FIG. 18, in the same manner as in the comparator 52 of FIG. 17.

Then, for example, the comparator 52A can prevent the ramp signal that is applied to the gate electrodes of the transistors 222-2a and 222-2b from being propagated to the transistors' 222-1a and 222-1b sides through a connection point of the drain sides of the transistors 222-2a and 222-2b, as noise. Accordingly, the imaging element 11 that includes the comparator 52A can capture a good image with lower noise.

Figure 20:
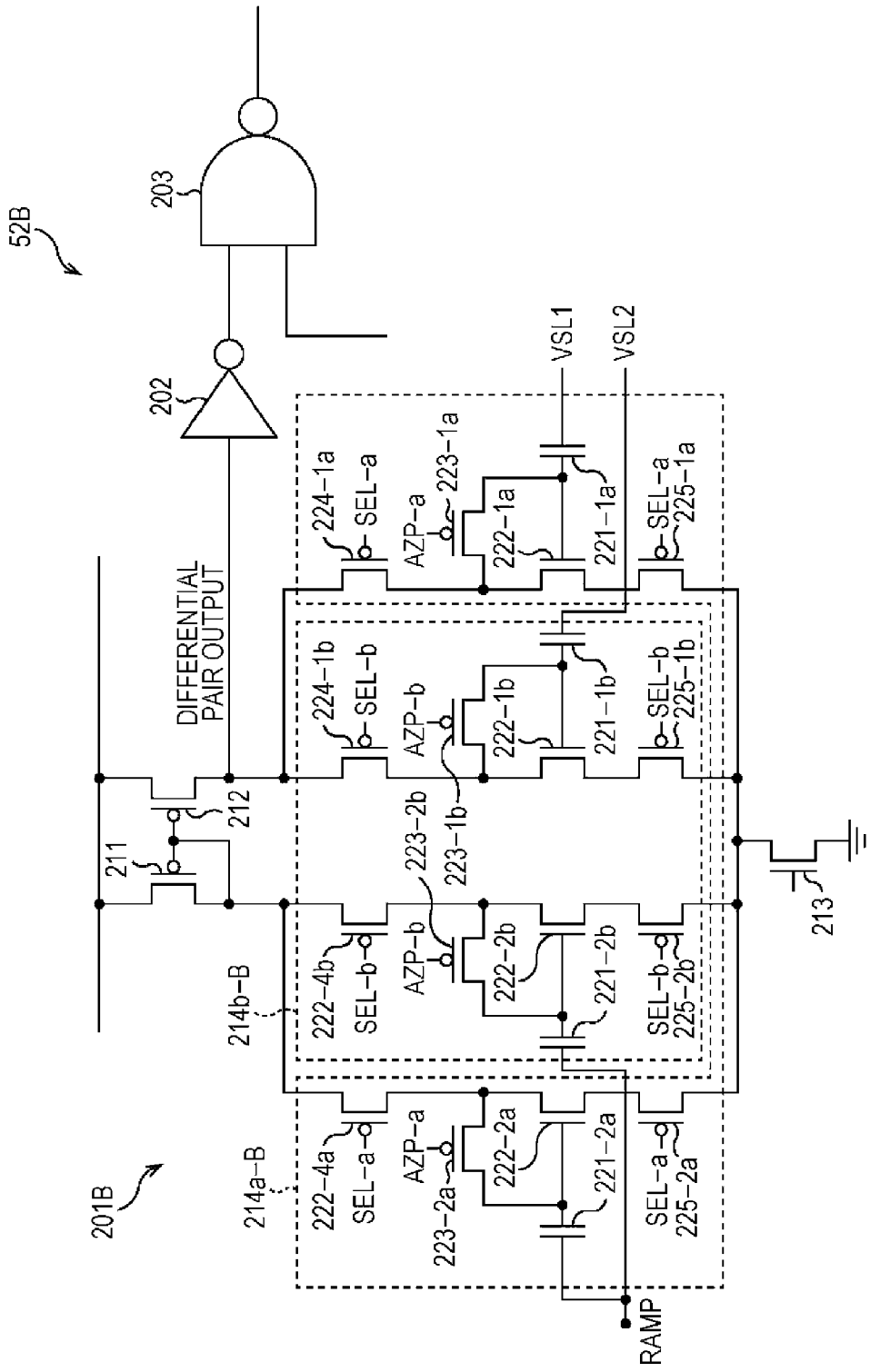
FIG. 20 is a diagram illustrating a second modification example of a circuit configuration of the comparator.

FIG. 20 illustrates a second modification example of a circuit configuration of the comparator 52.

In a comparator 52B illustrated in FIG. 20, the same symbols or reference numerals are attached to the same configurations as those of the comparator 52 of FIG. 17, and detailed description thereof will be omitted. That is, the comparator 52B is the same as the comparator 52 of FIG. 17 in that the comparator 52B includes the second amplification unit 202 and the third amplification unit 203 and a differential pair circuit 201B includes transistors 211 to 213. In addition, the comparator 52B has the same configuration as that of the comparator 52 of FIG. 17, in that a first differential pair unit 214a-B and a second differential pair unit 214b-B are provided in parallel with each other.

Meanwhile, in the comparator 52B, disposal of the transistors that are used for switching the active state and the standby state of the first differential pair unit 214a-B and the second differential pair unit 214b-B is different from that of the comparator 52 of FIG. 17.

That is, in the first differential pair unit 214a-B of the comparator 52B, in the same manner as in the comparator 52 of FIG. 17, a pair of the transistors 224-1a and 224-2a that is used for switching the active state and the standby state are respectively disposed on the source sides of a pair of the transistors 222-1a and 222-2a that is used for comparing signals. In addition to this, the first differential pair unit 214a-B of the comparator 52B has a configuration in which a pair of the transistors 225-1a and 225-2a that is used for switching the active state and the standby state are respectively disposed on the drain sides of a pair of the transistors 222-1a and 222-2a that is used for comparing signals.

That is, the first differential pair unit 214a-B of the comparator 52B has a configuration in which a pair of the transistors 224-1a and 224-2a and a pair of the transistors 225-1a and 225-2a are respectively disposed on both the source sides and the drain sides of a pair of the transistors 222-1a and 222-2a.

In the same manner, the second differential pair unit 214b-B of the comparator 52B has a configuration in which a pair of the transistors 224-1b and 224-2b and a pair of the transistors 225-1b and 225-2b are respectively disposed on both the source sides and the drain sides of a pair of the transistors 222-1b and 222-2b.

The comparator 52B is configured in this way, and can perform the drive described above with reference to FIG. 18, in the same manner as in the comparator 52 of FIG. 17.

Then, for example, the comparator 52B can prevent the ramp signal that is applied to the gate electrodes of the transistors 222-2a and 222-2b from being propagated to the transistors 222-1a and 222-1b sides through the connection point of the drain sides of the transistors 222-2a and 222-2b, as noise. In addition, since a load of the differential pair unit (any one of the first differential pair unit 214a-B and the second differential pair unit 214b-B) in the standby state is not seen as a differential pair output, the comparator 52B can avoid a decrease of the speed caused by a load increase. Accordingly, the image element 11 including the comparator 52B can capture a good image with lower noise at a high speed.

Figure 21:
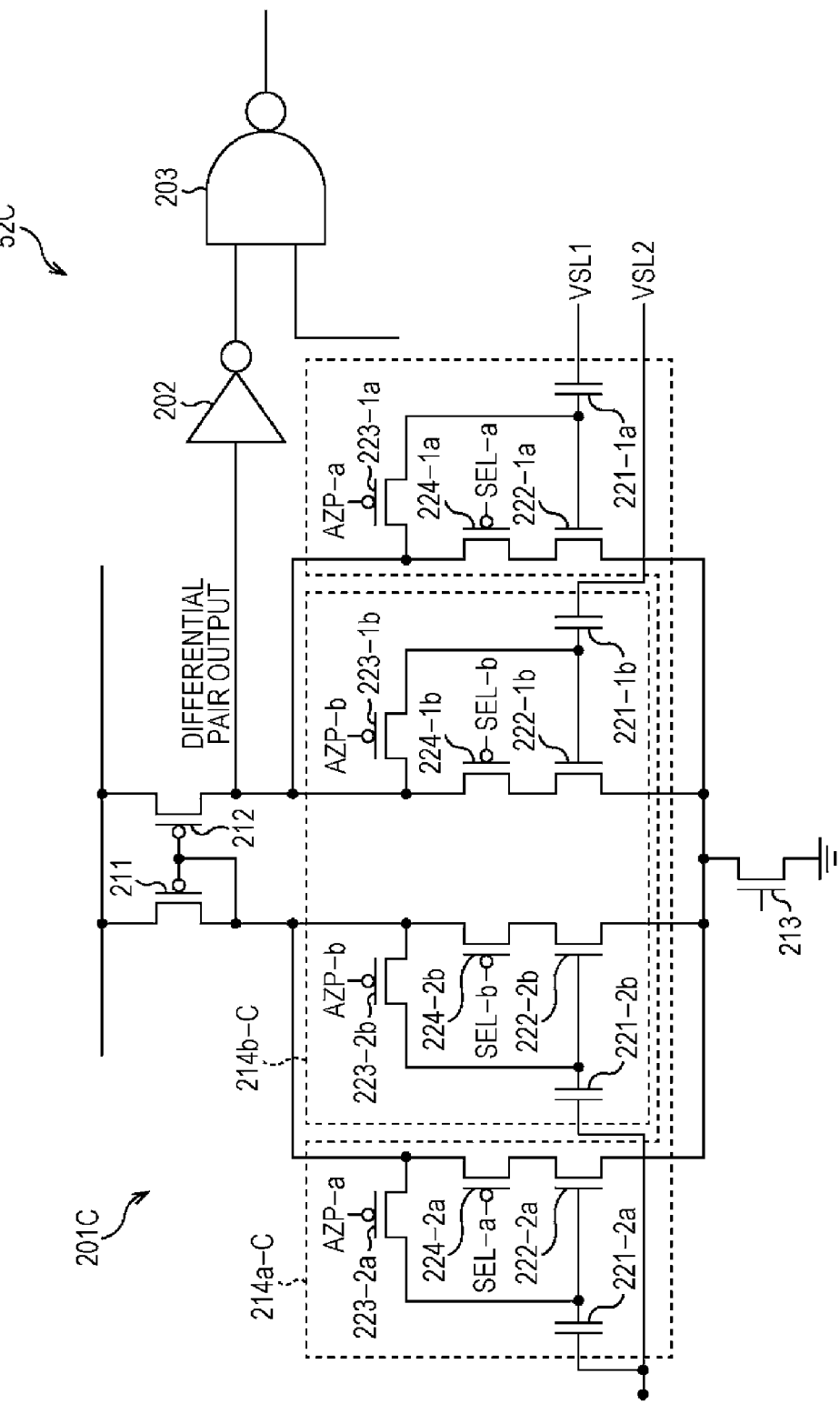
FIG. 21 is a diagram illustrating a third modification example of a circuit configuration of the comparator.

FIG. 21 illustrates a third modification example of a circuit configuration of the comparator 52.

In a comparator 52C illustrated in FIG. 21, the same symbols or reference numerals are attached to the same configurations as those of the comparator 52 of FIG. 17, and a detailed description thereof will be omitted. That is, the comparator 52C is the same as the comparator 52 of FIG. 17 in that the comparator 52C includes the second amplification unit 202 and the third amplification unit 203 and a differential pair circuit 201C includes transistors 211 to 213. In addition, the comparator 52C has the same configuration as that of the comparator 52 of FIG. 17, in that a first differential pair unit 214a-C and a second differential pair unit 214b-C are provided in parallel with each other.

Meanwhile, in the comparator 52C, a connection configuration of a pair of transistors 223-1a and 223-2a for performing an auto-zero operation is different from that of the comparator 52 of FIG. 17.

That is, in the first differential pair unit 214a of the comparator 52 of FIG. 17, a pair of transistors 223-1a and 223-2a for performing an auto-zero operation is respectively disposed, so as to connect between the gate electrodes of a pair of the transistors 222-1a and 222-2a that is used for comparing signals and a connection point of each of a pair of transistors 221-1a and 221-2a, and a pair of the capacitors 222-1a and 222-2a that is used for comparing signals and connection points of a pair of transistors 224-1a and 224-2a that is used for switching the active state and the standby state. In addition, in the second differential pair unit 214b of the comparator 52 of FIG. 17, a pair of transistors 223-1b and 223-2b for performing the auto-zero operation is respectively disposed, so as to connect between the gate electrodes of a pair of the transistors 222-1b and 222-2b that is used for comparing the signals and connection points of each of a pair of transistors 221-1b and 221-2b, and a pair of the capacitors 222-1b and 222-2b that is used for comparing signals and a connection point of a pair of transistors 224-1b and 224-2b that is used for switching the active state and the standby state.

In contrast to this, in the first differential pair unit 214a-C of the comparator 52C, a pair of transistors 223-1a and 223-2a for performing an auto-zero operation is respectively disposed, so as to connect between the gate electrodes of a pair of the transistors 222-1a and 222-2a that is used for comparing the signals and connection points of each of a pair of capacitors 221-1a and 221-2a, and source sides of a pair of transistors 224-1a and 224-2a that is used for switching the active state and the standby state.

In the same manner, in the second differential pair unit 214b-C of the comparator 52C, a pair of transistors 223-1a and 223-2a for performing an auto-zero operation are respectively disposed, so as to connect between the gate electrodes of a pair of the transistors 222-1b and 222-2b that is used for comparing the signals and connection points of each of a pair of capacitors 221-1b and 221-2b, and source sides of a pair of transistors 224-1b and 224-2b that is used for switching the active state and the standby state.

The comparator 52C that is configured in this way includes a pair of transistors 224-1a and 224-2a, and a pair of transistors 224-1b and 224-2b, and thereby can perform the auto-zero operation and to align differences between voltage thresholds of the transistors.

Figure 22:
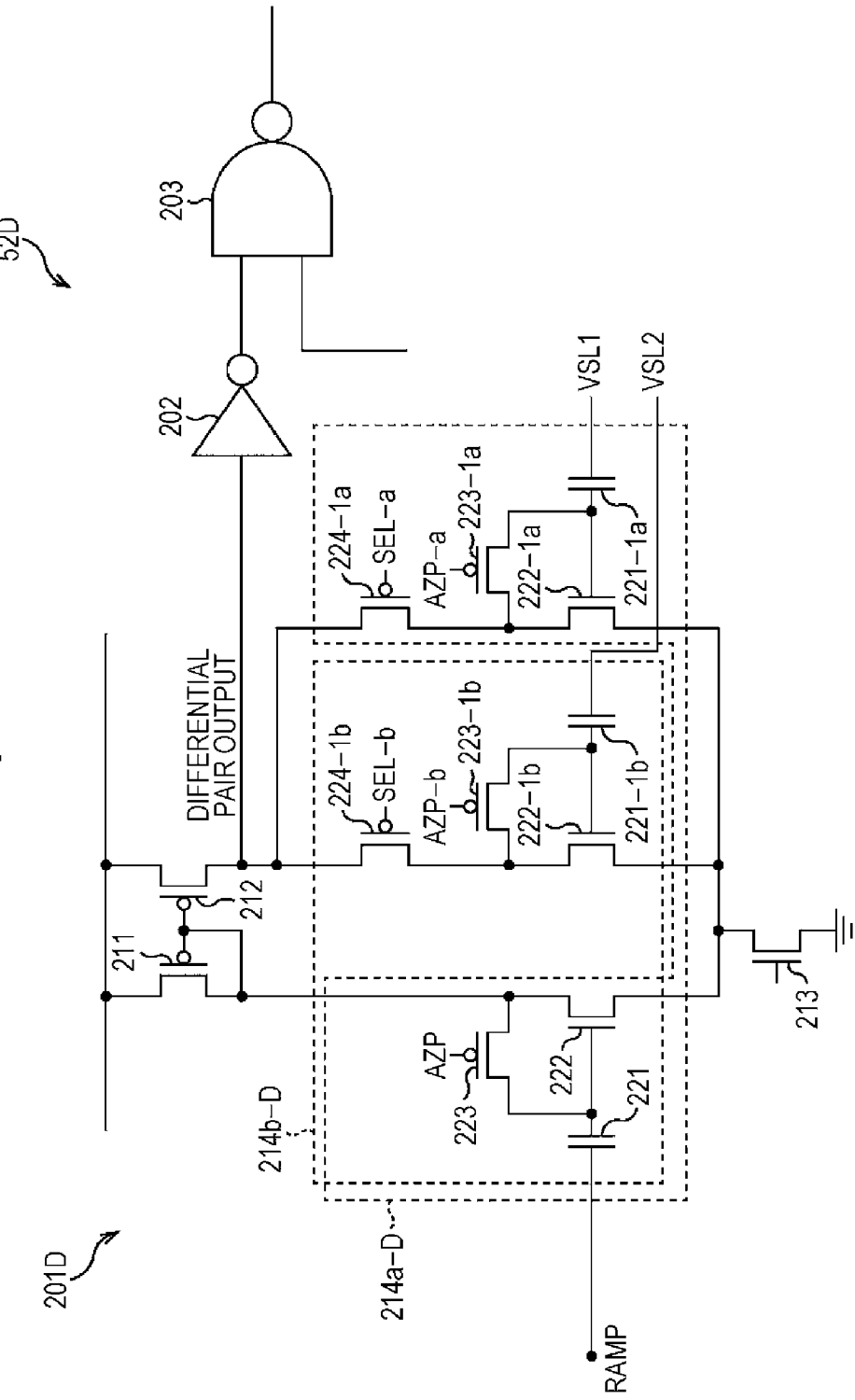
FIG. 22 is a diagram illustrating a fourth modification example of a circuit configuration of the comparator.

FIG. 22 illustrates a fourth modification example of a circuit configuration of the comparator 52.

In a comparator 52D illustrated in FIG. 22, the same symbols or reference numerals are attached to the same configurations as those of the comparator 52 of FIG. 17, and a detailed description thereof will be omitted. That is, the comparator 52D is the same as the comparator 52 of FIG. 17 in that the comparator 52D includes the second amplification unit 202 and the third amplification unit 203 and a differential pair circuit 201D, which includes transistors 211 to 213. In addition, the comparator 52D has the same configuration as that of the comparator 52 of FIG. 17, in that a first differential pair unit 214a-D and a second differential pair unit 214b-D are provided in parallel with each other.

Meanwhile, the comparator 52D has a different configuration from the comparator 52 of FIG. 17 in that a circuit configuration, on a side, which is connected to the ramp signal generation circuit 17, and to which the ramp signal is supplied, is commonly used with the first differential pair unit 214a-D and the second differential pair unit 214b-D. That is, the comparator 52D is configured in such a manner that the circuit configuration, which is configured with a capacitor 221, a transistor 222, and a transistor 223, on the ramp signal side is commonly used with the first differential pair unit 214a-D and the second differential pair unit 214b-D.

That is, the first differential pair unit 214a-D performs a comparison operation of the pixel signal and the ramp signal, using a circuit configuration, which is configured with a capacitor 221-1a, a transistor 222-1a, and a transistor 223-1a, on the pixel signal side, and using the circuit configuration, which is configured with the capacitor 221, the transistor 222, and the transistor 223, on the ramp signal side. In the same manner, the second differential pair unit 214b-D performs the comparison operation of the pixel signal and the ramp signal, using a circuit configuration, which is configured with a capacitor 221-1b, a transistor 222-1b, and a transistor 223-1b, on the pixel signal side, and using the circuit configuration, which is configured with the capacitor 221, the transistor 222, and the transistor 223, on the ramp signal side.

Then, the transistor 224-1a that is connected to the circuit configuration on the pixel signal side of the first differential pair unit 214a-D, and the transistor 224-1b that is connected to the circuit configuration on the pixel signal side of the second differential pair unit 214b-D, are used for switching the active state and the standby state.

In the comparator 52D configured in this way, the circuit configuration on the ramp signal side is shared with the first differential pair unit 214a-D and the second differential pair unit 214b-D, and thus it is possible to configure the comparator 52D with a small area, for example, compared to the comparator 52 of FIG. 17. Accordingly, it is possible to perform miniaturization of the entire imaging element 11.

Next, the drive signals and the pixel signals of the imaging element 11 will be described with reference to FIG. 23.

Figure 23:
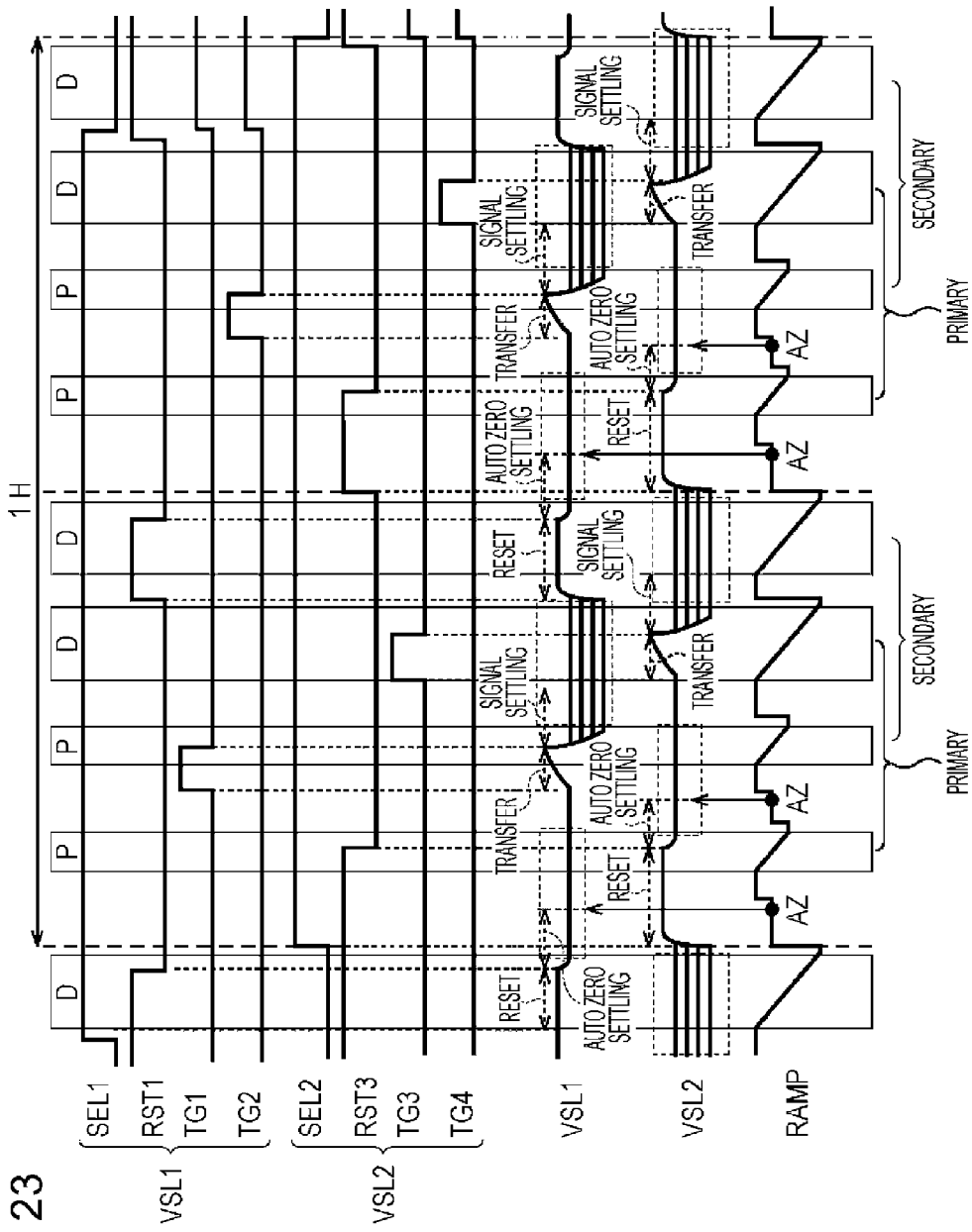
FIG. 23 is a timing chart for explaining a drive of the imaging element.
Figure 24:
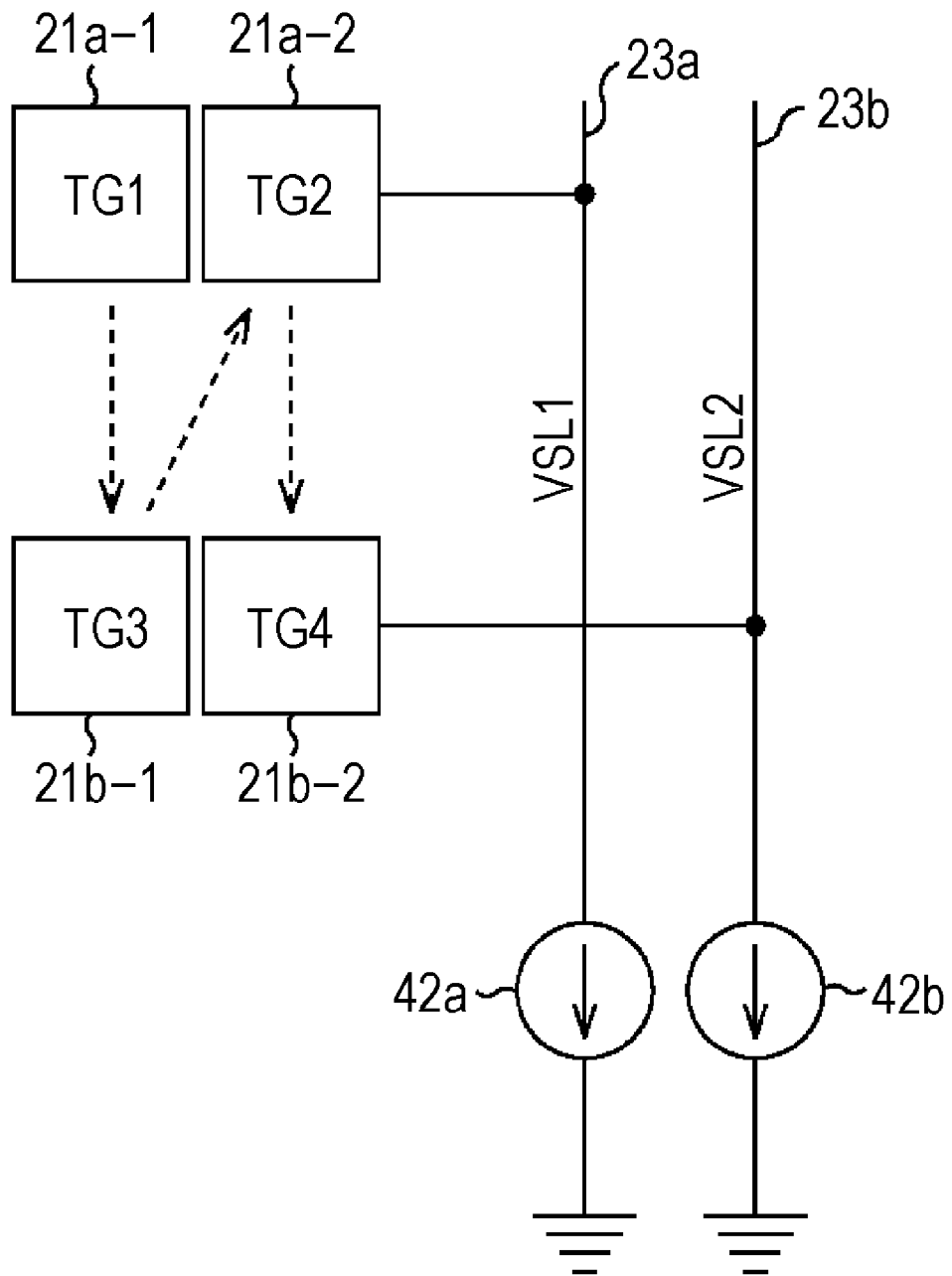
FIG. 24 is a diagram illustrating disposal of a pixel of the timing chart of FIG. 23.

FIG. 23 illustrates a timing chart of one horizontal period (1H) when the pixel signals are read in the order of a pixel 21a-1, a pixel 21b-1, a pixel 21a-2, and a pixel 21b-2, that are disposed as illustrated in FIG. 24.

A selection signal SEL1 that is supplied to the pixel 21a-1 and the pixel 21a-2, which are connected to the first vertical signal line 23a, a reset signal RST1, transfer signals TG1 and TG2, a selection signal SEL2 that is supplied to the pixel 21b-1 and the pixel 21b-2 which are connected to the second vertical signal line 23b, a reset signal RST3, transfer signals TG3 and TG4, a pixel signal VSL1 that is output through the first vertical signal line 23a, a pixel signal VSL2 that is output through the second vertical signal line 23b, and a ramp signal Ramp that is output from the ramp signal generation circuit 17, are sequentially illustrated from a top side of FIG. 23.

To begin with, the pixel 21a-1 and the pixel 21b-1 are driven, a P phase (pixel signal with reset level) of the pixel 21a-1 is read, and thereafter a P phase of the pixel 21b-1 is read. After that, a D phase (pixel signal with signal level) of the pixel 21a-1 is read, and thereafter a D phase of the pixel 21b-1 is read. Subsequently, the pixel 21a-2 and the pixel 21b-2 are driven, a P phase of the pixel 21a-2 is read, and thereafter a P phase of the pixel 21b-2 is read. After that, a D phase of the pixel 21a-2 is read, and thereafter a D phase of the pixel 21b-2 is read.

Hereinafter, with regard to the pixel 21a-1 and the pixel 21b-1, the pixel 21a-1 from which the pixel signal is first read is referred to as primary, and the pixel 21b-1 from which the pixel signal is subsequently read is referred to as secondary. In the same manner, the pixel 21a-2 is referred to as primary, and the pixel 21b-2 is referred to as secondary.

In the imaging element 11 that is driven according to the timing chart, if, during a reading operation of one of the pixel 21a and the pixel 21b, a shutter operation of the other is ended, a power supply load is changed. For this reason, noise of a lateral belt shape, which is referred to as a shutter step, can occur between the row in which the reading operation and the shutter operation are simultaneously performed and the row in which only a reading operation is performed.

Thus, in the imaging element 11, in order to avoid such a change of the power supply load, a dummy read row may be provided. The reading of the pixel signal is not performed in the dummy read row, and it is possible for the dummy read row to employ a dummy read control that supplies a reset pulse and a transfer pulse.

The dummy read control will be described with reference to FIG. 25 and FIG. 26.

Figure 25:
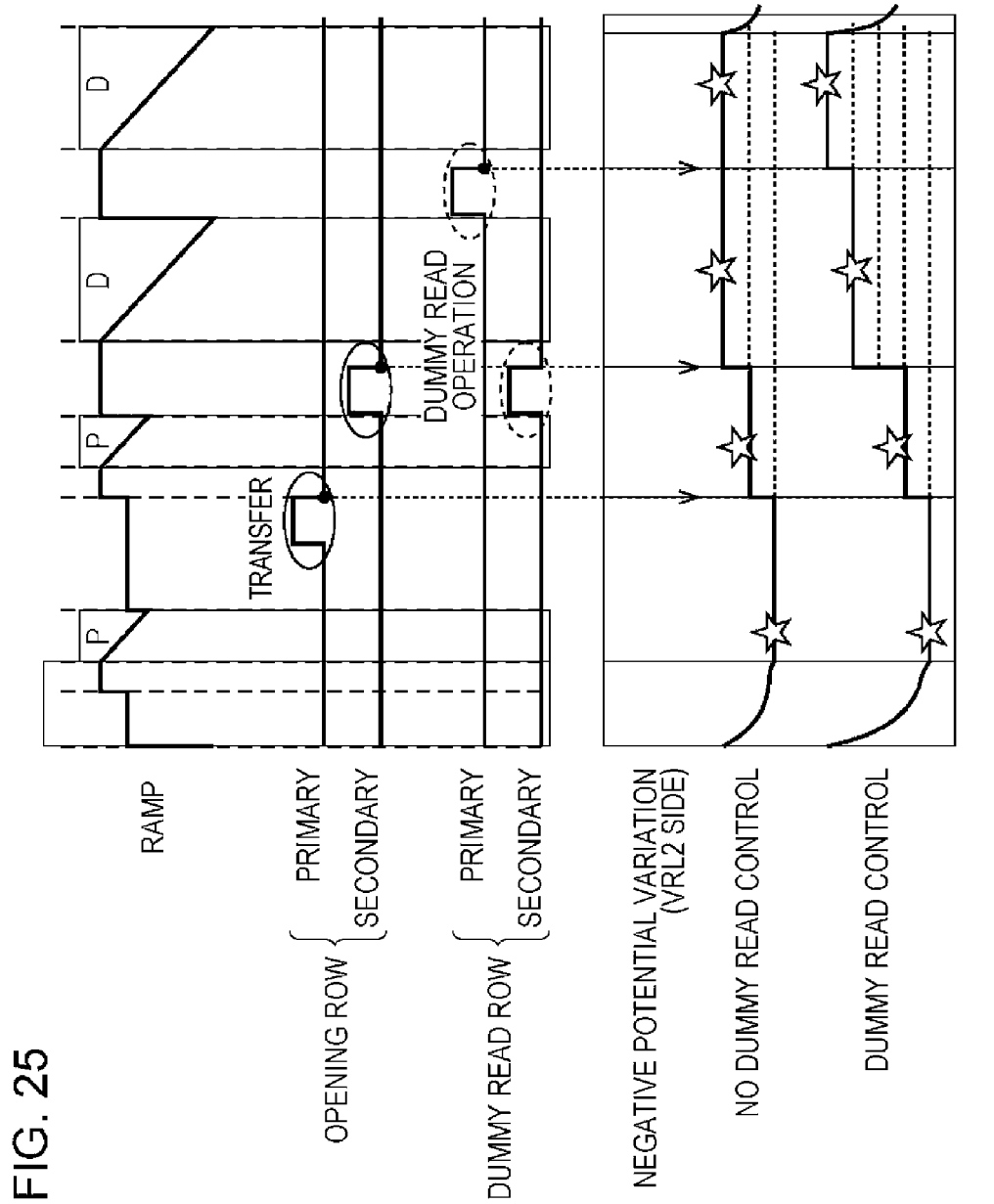
FIG. 25 is a timing chart for explaining a dummy read control of a transfer signal.

FIG. 25 illustrates a timing chart when a control that suppresses the change of the power supply load caused by a transfer signal in the dummy read row is performed.

The ramp signal Ramp that is output from the ramp signal generation circuit 17, the transfer signal of primary and the transfer signal of secondary, which perform reading of the pixel signal, in an opening row, the transfer signal of the primary and the transfer signal of the secondary in the dummy read row, a negative potential change when the dummy read control is not performed, and a negative potential change when the dummy read control is performed, are sequentially illustrated from a top side of FIG. 25. The negative potential change relates to a power supply that is connected to the second vertical signal line 23b.

As illustrated in FIG. 25, when the dummy read control is performed, a control is performed, which generates a pulse in the transfer signal of the secondary in the dummy read row, so as to coincide with the timing in which a pulse of the transfer signal of the secondary in the opening row is generated. In addition, in a timing in which a D phase of the primary is ended, a control is performed, which generates a pulse in the transfer signal of the primary in the dummy read row.

By performing such a dummy read control, it is possible to adjust the negative potential change of the power supply that is connected to the second vertical signal line 23b, using the P phase and D phase in the primary row and the P phase and the D phase in the secondary row. Accordingly, the imaging element 11 can avoid the noise of a lateral belt shape that is referred to as a shutter step described above.

Figure 26:
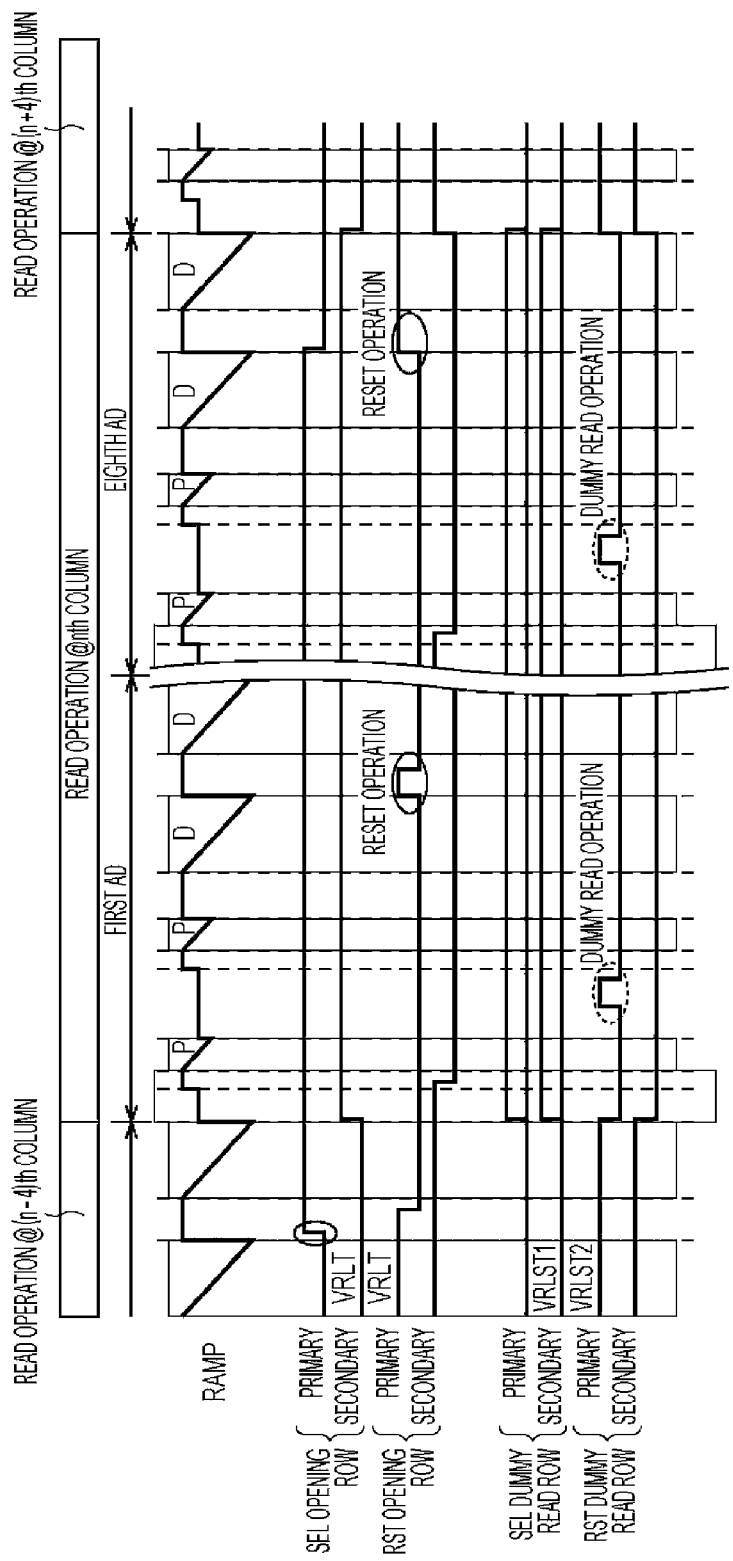
FIG. 26 is a timing chart for explaining a dummy read control of a reset signal.

FIG. 26 illustrates a timing chart when a control that suppresses the change of the power supply load caused by the reset signal in the dummy read row is performed.

The ramp signal Ramp that is output from the ramp signal generation circuit 17, a selection signal of the primary and a selection signal of the secondary in the opening row in which the read of the pixel signal is performed, a reset signal of the primary and a reset signal of the secondary in the opening row in which the read of the pixel signal is performed, a selection signal of the primary and a selection signal of the secondary in the dummy read row, and a reset signal of the primary and a reset signal of the secondary in the dummy read row, are sequentially illustrated from a top side of FIG. 26.

As illustrated in FIG. 26, in the reset signal of the primary in the dummy read row, the dummy read control that generates a pulse for performing the dummy read operation is performed between the P phase of the primary and the P phase of the secondary.

By performing the dummy read control, it is possible to adjust the negative potential change of the power supply that is connected to the second vertical signal line 23b, using the P phase and the D phase in the primary row, and the P phase and the D phase in the secondary row. Accordingly, the imaging element 11 can avoid the noise of a lateral belt shape that is referred to as a shutter step described above.

As described above, the dummy read row in which the read of the pixel signal is not performed is provided, the dummy read control that suppresses the negative potential change is performed by the pixel 21a that is the primary and the pixel 21b that is the secondary, and thus the imaging element 11 can suppress an occurrence of noise and can capture an image with a higher image quality.

However, in the imaging element 11, when a negative potential is used as an OFF potential of the transfer transistor 32 or the selection transistor 35, a generation or the like of the negative potential change caused by the shutter operation, or a potential change from the vertical signal line 23 can affect the read signal (i.e., signal that is read from the pixel 21).

Therefore, in order to avoid a negative influence caused by the generation or the like of the negative potential change caused by the shutter operation, or the potential change from the vertical signal line 23, the imaging element 11 can employ a configuration in which the negative potentials are separated into two systems for reading and shuttering.

Next, the imaging element 11 that is configured to separate the negative potential into systems will be described with reference to FIG. 27 to FIG. 29.

Figure 27:
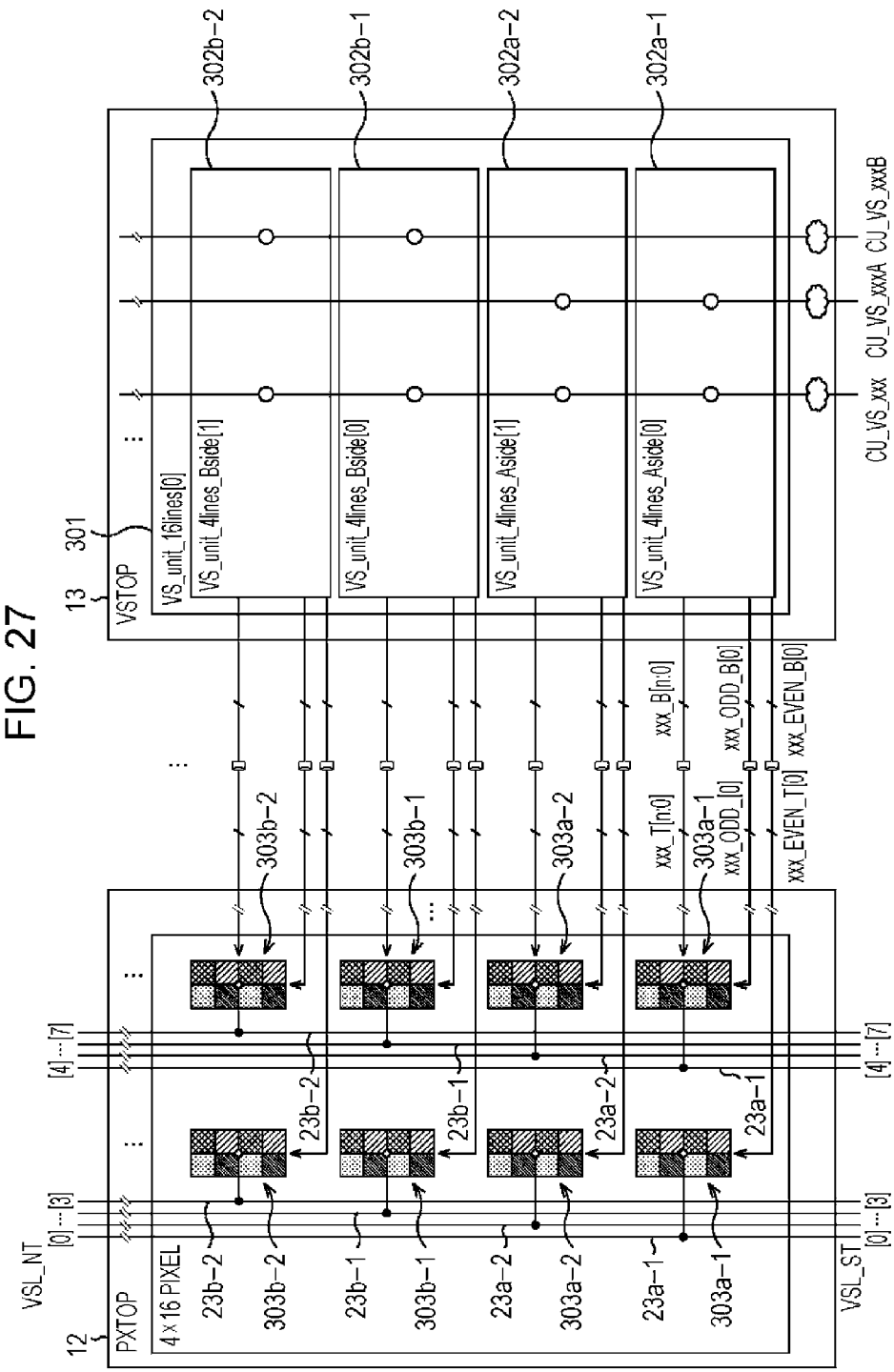
FIG. 27 is a diagram illustrating a configuration example of a portion of a pixel area and a vertical drive circuit.

FIG. 27 illustrates a portion of the pixel area 12 and the vertical drive circuit 13 in the imaging element 11.

The pixels 21 of four columns by sixteen rows among the plurality of pixels 21 disposed in a matrix are included in the pixel area 12 illustrated in FIG. 27, and the pixels 21 employ the pixel-sharing structure described above with reference to FIG. 6. That is, in the sharing pixel 303 of FIG. 27, the pixel-sharing structure is configured by eight pixels 21 of two columns by four rows, and the eight sharing pixels 303 are disposed by two columns by four rows. Here, the sharing pixel 303a-1 and the sharing pixel 303a-2 are the primary, and the sharing pixel 303b-1 and the sharing pixel 303b-2 are the secondary.

In addition, in the vertical drive circuit 13, four four-row drive units 302 are provided in correspondence to the sharing pixels 303 that are disposed by four rows, in the sixteen-row drive unit 301 for driving the pixels 21 in the sixteen rows.

The four-row drive unit 302a-1 supplies a drive signal to the sharing pixel 303a-1, the four-row drive unit 302a-2 supplies a drive signal to the sharing pixel 303a-2, the four-row drive unit 302b-1 supplies a drive signal to the sharing pixel 303b-1, and the four-row drive unit 302b-2 supplies a drive signal to the sharing pixel 303b-2.

At this time, the vertical drive circuit 13 is configured in such a manner that the negative potentials being used are separated by the four-row drive unit 302a-1 that drives the sharing pixel 303a-1, the four-row drive unit 302a-2 that drives the sharing pixel 303a-2, the four-row drive unit 302b-1 that drives the sharing pixel 303b-1, and the four-row drive unit 302b-2 that drives the sharing pixel 303b-2.

In this way, by separating the negative potential using the primary and the secondary, it is possible to prevent the generation or the like of the negative potential change caused by the shutter operation, or the potential change from the vertical signal line 23 from affecting the read signal.

Here, a system separation of the negative potential of the related art will be described with reference to FIG. 28.

Figure 28:
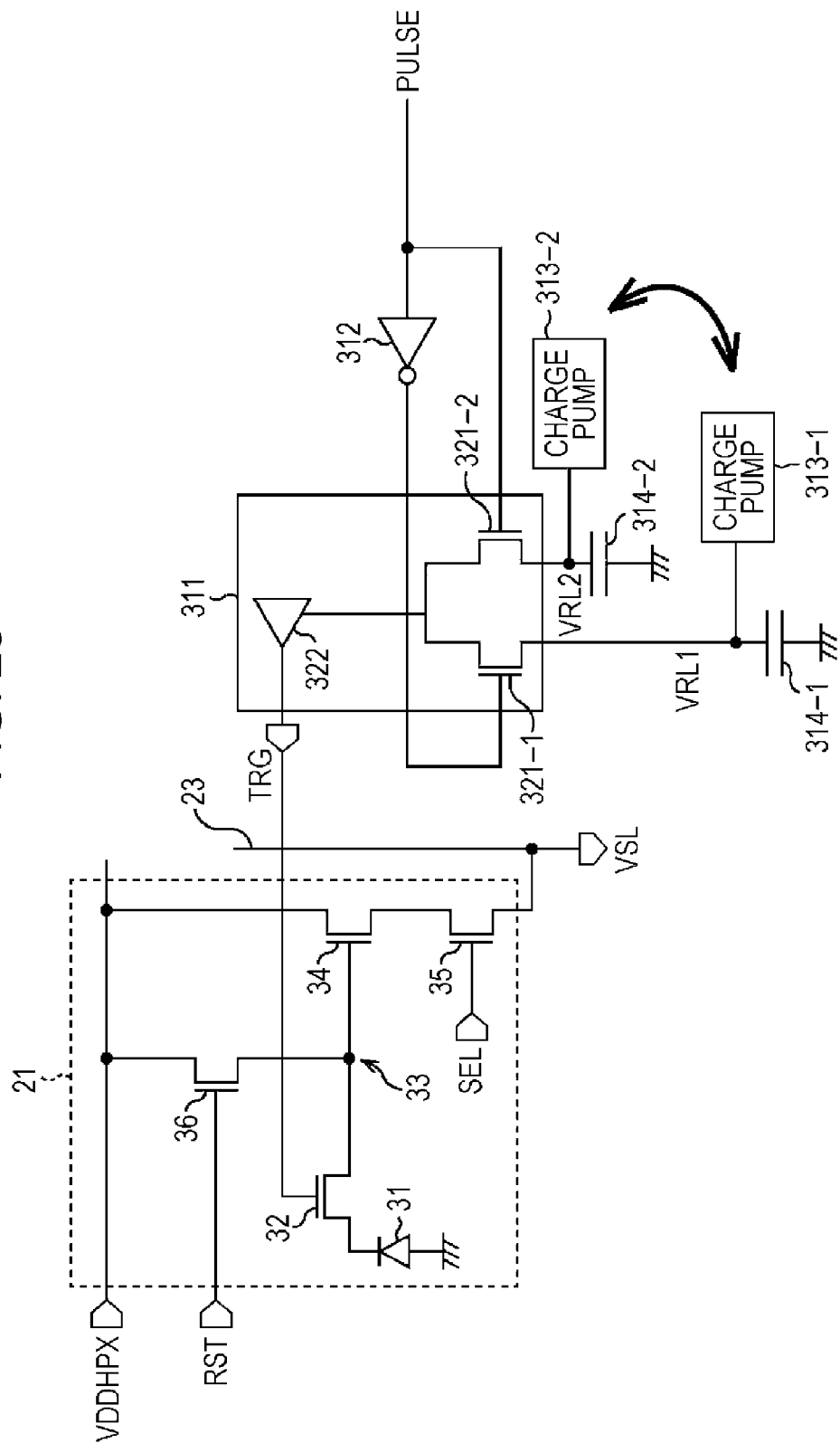
FIG. 28 is a diagram for explaining a system separation of a negative potential of the related art.

As illustrated in FIG. 28, a transfer signal supply unit 311 that is connected to the pixel 21 is configured to include a pair of transistor 321-1 and 321-2, and an amplifier 322. Then, a pulse that becomes a transfer signal is inverted by an inversion amplification unit 312, the inverted signal is supplied to the transistor 321-1, and the pulse that becomes the transfer signal is supplied to the transistor 321-2 without being inverted. In addition, the transistor 321-1 is grounded through a capacitor 314-1, and a charge pump 313-1 is connected to a connection point VRL1 of the transistor 321-1 and the capacitor 314-1. In the same manner, the transistor 321-2 is grounded through a capacitor 314-2, and a charge pump 313-2 is connected to a connection point VRL2 of the transistor 321-2 and the capacitor 314-2.

The transfer signal supply unit 311 switches the charge pump 313-1 and the charge pump 313-2 in a read state and a settling state according to the pulse, and thus is configured to separate a negative potential for each state.

In this way, in the related art, the negative potential is separated in the read state and the settling state of one pixel 21. The separation of the negative potential is not considered between the pixel 21a that is the primary and the pixel 21b that is the secondary.

In contrast to this, the system separation of the negative potential of the imaging element 11 will be described with reference to FIG. 29.

Figure 29:
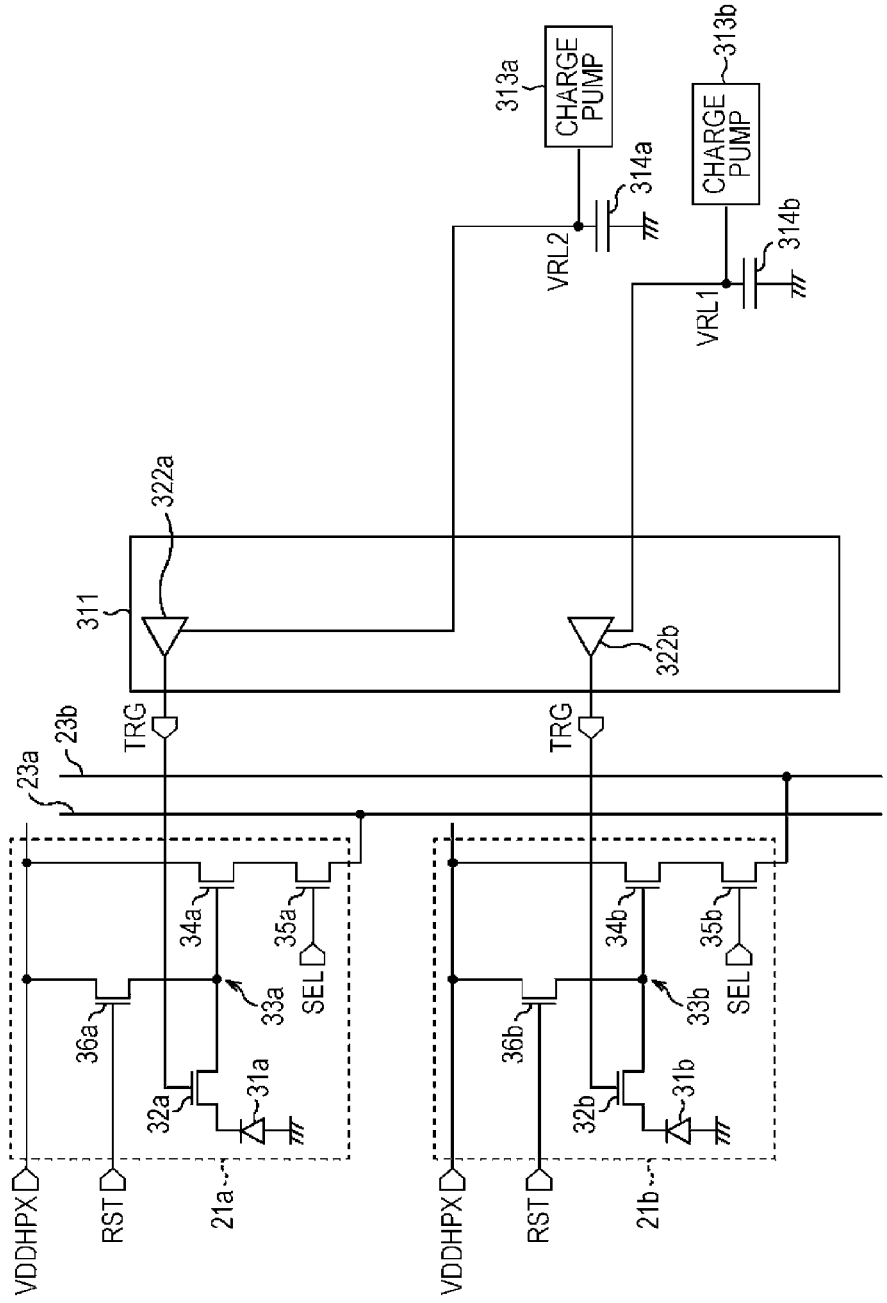
FIG. 29 is a diagram for explaining a system separation of a negative potential of the imaging element.

As illustrated in FIG. 29, in the imaging element 11, the system separation of the negative potential is not performed in the pixel 21a that is the primary and the pixel 21b that is the secondary.

That is, the transfer signal supply unit 311 is configured to include an amplifier 322a that supplies the transfer signal to the pixel 21a, and an amplifier 322b that supplies the transfer signal to the pixel 21b. Then, the amplifier 322a is grounded through the capacitor 314a, and the charge pump 313a is connected to a connection point VRL2 of the amplifier 322a and the capacitor 314a. In the same manner, the amplifier 322b is grounded through the capacitor 314b, and the charge pump 313b is connected to a connection point VRL1 of the amplifier 322b and the capacitor 314b.

In this way, the imaging element 11 is configured to separate the negative potential in the pixel 21a that is the primary and the pixel 21b that is the secondary. Accordingly, a generation of noise can be suppressed between the pixel 21a and the pixel 21b. Thus, the imaging element 11 can prevent the noise from affecting the pixel, and to capture an image with a higher image quality.

In the present embodiment, a configuration example in which two of the first vertical signal line 23a and the second vertical signal line 23b are provided in one column of the pixels 21 that are disposed in a matrix in the pixel area 12, is used, but a configuration in which a plurality of vertical signal lines 23 that are two or more is provided may be used. For example, in the example of FIG. 3, approximately the same time is necessary for the settling and the hold of the pixel signal, but for example, if the AD conversion processing itself can be speeded up and the time for holding an output of the pixel signal can be reduced, while a plurality of pixels performs the settling of the pixel signals, the AD conversion of the pixel signals that are output from another plurality of pixels can be sequentially performed. Accordingly, it is possible to further speed up the entire AD conversion.

Furthermore, the imaging element 11 can be applied to both a surface radiation type CMOS image sensor in which light is radiated onto a surface, on which a wiring layer is laminated, of a semiconductor substrate in which the pixels 21 are formed, and a backside radiation-type CMOS image sensor in which light is radiated into a backside opposite to the surface. In addition, the image element 11 can be applied to a stacktype CMOS image sensor, which is configured by stacking a sensor substrate in which the pixels 21 are formed on a circuit substrate in which a control circuit 18 (FIG. 1) or the like is formed. In addition, as described above, processing of reading the pixel signal and performing the AD conversion of the read signal can be realized by executing a program by the control circuit 18.

The imaging element 11, according to each embodiment described above, can be applied to various electronic apparatuses, such as an imaging system (e.g., a digital still camera or a digital video camera, a mobile phone with an imaging function, or other apparatuses with an imaging function).

Figure 30:
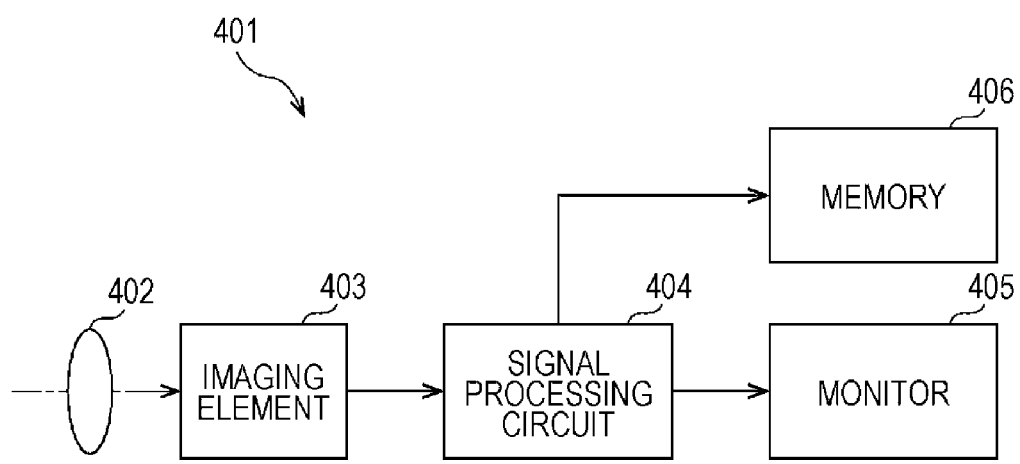
FIG. 30 is a block diagram illustrating a configuration example of an embodiment of an imaging device to which the present technology is applied.

FIG. 30 is a block diagram illustrating a configuration example of an imaging device, which is mounted in an electronic apparatus.

As illustrated in FIG. 30, an imaging device 401 is configured to include an optical system 402, an imaging element 403, a signal processing circuit 404, a monitor 405, and a memory 406, and can image a still image and a moving image.

The optical system 402 is configured to include one or a plurality of lenses, leads image light (i.e., incident light) from a subject to the imaging element 403, and image formation is made to a light-receiving surface (i.e., sensor portion) of the imaging element 403.

The imaging element 11 according to each embodiment described above is applied as the imaging element 403. Electrons are stored in the imaging element 403 for a predetermined period, according to an image that is formed in the light-receiving surface through the optical system 402. Then, a signal according to the electrons that are stored in the imaging element 403 is supplied to the signal processing circuit 404.

The signal processing circuit 404 performs various signal processing with respect to the pixel signal that is output from the imaging element 403. An image (i.e., image data) that is obtained by performing the signal processing by the signal processing circuit 404 is supplied to the monitor 405 to be displayed, and is supplied to the memory 406 and stored (recorded) there.

The imaging device 401 configured in this way can apply the imaging element 11 according to each embodiment described above, thereby speeding up the AD conversion processing, and thus it is possible to capture an image with a higher frame rate, for example.

Figure 31:
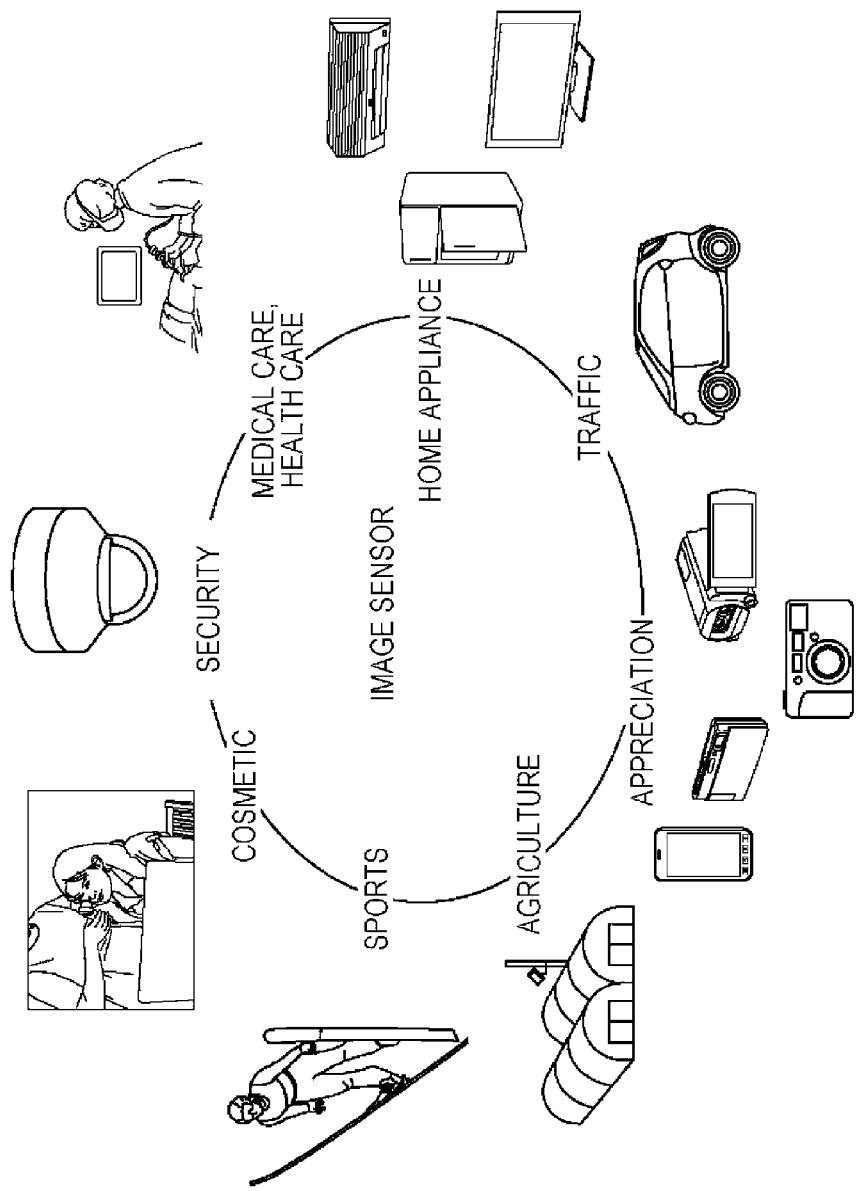
FIG. 31 is a diagram illustrating a usage example in which an image sensor is used.

FIG. 31 is a view illustrating a usage example in which the above-described image sensor (i.e., imaging element 11) is used.

The above-described image sensor can be used for various cases in which light, such as visible light, infrared light, ultraviolet light, or X-rays is sensed, as follows.

An image capturing device that is provided for appreciation, such as a digital camera or a portable device with a camera function.

A device that is provided for traffic, such as an in-vehicle sensor that captures the front, the rear, the surrounding, the inside, or the like of a vehicle, a monitoring camera that monitors a travelling vehicle or a road, or a distance-measuring sensor that performs a distance measurement, such as inter-vehicles, for safe driving, such as an automatic stop, recognition of a state of a driver, or the like.

A device that is provided to a home appliance, such as a TV, a refrigerator, or an air conditioner, in order to capture a gesture of a user, and to perform an apparatus operation according to the gesture.

A device that is provided for medical care or health care, such as an endoscope or a device that performs angiography by receiving infrared light.

A device that is provided for security, such as a monitoring camera for security or a camera for person authentication.

A device that is provided for cosmetics, such as a skin measuring device that captures skin or a microscope that captures scalp.

A device that is provided for sports, such as an action camera or a wearable camera for sports.

A device that is provided for agriculture, such as a camera for monitoring a status of a field or crops.

Further, for example, the present technology can have the following configurations.

(1)

An imaging device comprising:
a pixel array including a plurality of pixels two-dimensionally arranged in a matrix pattern;
a plurality of column signal lines disposed according to a first column of the pixels, wherein at least one column signal line of the plurality of column signal lines is connected to two or more pixels in the first column; and
an analog to digital converter shared by the plurality of column signal lines.

(2)

The imaging device according to (2), wherein the plurality of column signal lines disposed according to the first column are parallel to each other.

(3)

The imaging device according to any one of (2) to (3), further comprising: a first column signal line of the plurality of column signal lines; and a second column signal line of the plurality of column signal lines, wherein pixels in even numbered rows share the first column signal line and pixels in odd numbered rows share the second column signal line.

(4)

The imaging device according to any one of (1) to (3), wherein one or more of the plurality of column signal lines are selectively coupled to a same comparator.

(5)

The solid-state image pickup device according to (4), further comprising a switch for each of the plurality of column signal lines, wherein each switch is coupled to a first terminal of the comparator.

(6)

The imaging device according to (5), further comprising: a ramp signal generation circuit connected to a second terminal of the comparator; and a counter unit connected to an output terminal of the comparator, wherein the counter unit is coupled to a data output signal line.

(7)

The imaging device according to any one of (5) to (6), wherein the comparator includes: a first differential pair unit connected to a first column signal line of the plurality of column signal lines; and a second differential pair unit connected to a second column signal line of the plurality of column signal lines.

(8)

The imaging device according to (7), wherein the first differential pair unit and the second differential pair unit are connected to a ramp signal node provided from a ramp signal generation circuit.

(9)

The imaging device according to (8), wherein when the first differential pair unit is active, the second differential pair unit is inactive, and wherein when the first differential pair unit is inactive, the second differential pair unit is active.

(10)

The imaging device according to (9), wherein pixels in even numbered rows share the first column signal line and pixels in odd numbered rows share the second column signal line.

(11)

The imaging device according to any one of (7) to (10), wherein an output from at least one of the first differential pair unit and the second differential pair unit is provided to at least one of a first amplification unit and a second amplification unit.

(12)

The imaging device according to any one of (7) to (11), wherein the first differential pair unit includes two transistors connected to a first auto-zero connection node, and the second differential pair unit includes two transistors connected to a second auto-zero connection node.

(13)

The imaging device according to any one of (7) to (12), wherein the first differential pair unit includes a transistor connected to a first auto-zero connection node, the second differential pair unit includes a transistor connected to a second auto-zero connection node, and the first differential pair unit and the second differential pair unit share a transistor connected to a third auto-zero connection node.

(14)

The imaging device according to any one of (4) to (6), further comprising: a switch for each of the plurality of column signal lines; and a capacitor for each of the plurality of column signal lines, wherein a first terminal of the capacitor is connected to the switch and a second terminal of the capacitor is connected to a first terminal of the comparator.

(15)

The imaging device according to any one of (1) to (14), further comprising: a first pixel sharing structure including at least two pixels in adjacent columns and at least two pixels in adjacent rows; a second pixel sharing structure including at least two pixels in adjacent columns and at least two pixels in adjacent rows, wherein the first pixel sharing structure and the second pixel sharing structure are arranged in a same column, wherein the first pixel sharing structure is connected to a first column signal line of the plurality of column signal lines, and wherein the second pixel sharing structure is connected to a second column signal line of the plurality of column signal lines.

(16)

The imaging device according to (16), further comprising color filters disposed on the at least two pixels in adjacent columns and the at least two pixels in adjacent rows, wherein the color filters are arranged according to a Bayer pattern.

(17)

The imaging device according to any one of (1) to (16), wherein a reading of a reset signal associated with a second signal column line of the plurality of signal column lines occurs between a reading of a reset signal associated with a first signal column line of the plurality of signal column lines and a reading of a signal corresponding to an amount of light received by a photodiode connected to the first column signal line.

(18)

An electronic apparatus comprising:
an optical system including at least one lens; and
an imaging element configured to receive light through the optical system, wherein the imaging element includes:
a pixel array including pixels two-dimensionally arranged in a matrix pattern;
a plurality of column signal lines disposed according to a first column of the pixels, wherein at least one column signal line of the plurality of column signal lines is connected to two or more pixels in the first column; and
an analog to digital converter shared by the plurality of column signal lines.

(19)

A comparator comprising a differential pair circuit including:
a first differential pair unit connected to a first column signal line of an imaging device; and
a second differential pair unit connected to a second column signal line of the imaging device, wherein the first column signal line and the second column signal line are for the same column of pixel array units in a pixel array.

(20)

The comparator according to (19), wherein the first differential pair unit and the second differential pair unit are connected to a ramp signal provided from a ramp signal generation circuit.

(21)

The comparator according to any one of (19) to (20), wherein when the first differential pair unit is active, the second differential pair unit is inactive, and wherein when the first differential pair unit is inactive, the second differential pair unit is active.

(22)

The comparator according to any one of (19) to (21), wherein pixel units in even numbered rows share the first column signal line and pixel units in odd numbered rows share the second column signal line.

(23)

The comparator according to any one of (19) to (22), further comprising: a first amplification unit; and a second amplification unit, wherein an output from at least one of the first differential pair unit and the second differential pair unit is provided to the first amplification unit and the second amplification unit.

(24)

The comparator according to any one of (19) to (23), wherein the first differential pair unit includes two transistors connected to a first auto-zero connection node, and the second differential pair unit includes two transistors connected to a second auto-zero connection node.

(25)

The comparator according to any one of (19) to (23), wherein the first differential pair unit includes a transistor connected to a first auto-zero connection node, the second differential pair unit includes a transistor connected to a second auto-zero connection node, and the first differential pair unit and the second differential pair unit share a transistor connected to a third auto-zero connection node.

(26)

An imaging element including: a pixel area in which a plurality of pixels is disposed in a matrix; and a column AD signal processing unit in which an AD conversion unit that performs an AD (Analog to Digital) conversion of a pixel signal which is output from the pixel is provided in each column of the pixels, and the plurality of pixels that is disposed in the same column is connected to the AD conversion unit through a predetermined number of vertical signal lines, in which the pixel connected through a portion of a predetermined number of the vertical signal lines performs a reset operation or a signal transfer operation, and concurrently, the AD conversion unit performs an operation of an AD conversion of a pixel signal that is output from the pixel connected through the other vertical signal lines, and the operations are alternately repeated.

(27)
The imaging element described in (26), in which for each sharing pixel that shares a portion of the pixel in the plurality of pixels, the reset operation or the signal transfer operation, and the AD conversion are alternately and concurrently performed in the pixel that each of the sharing pixels includes.

(28)
The imaging element described in (26) or (27), in which a predetermined number of capacitors is respectively provided between a predetermined number of the vertical signal lines and an input terminal of the AD conversion unit, and a switch connects the capacitors to an output terminal of the AD conversion unit.

(29)
The imaging element described in (26) to (28), in which the two column AD signal processing units are provided on an upper side and a lower side in a column direction of the pixel area, respectively.

(30)
The imaging element described in (26) to (29), in which the AD conversion unit is provided in each one column of the pixel, and the plurality of pixels disposed in the one column is connected to the AD conversion unit through a first vertical signal line or a second vertical signal line, in which a reset operation period of the pixel connected to the first vertical signal line is concurrent with an AD conversion period in which an AD conversion of a pixel signal with a signal level that is output from the pixel connected to the second vertical signal line is performed, in which an AD conversion period in which an AD conversion of a pixel signal with a reset level that is output from the pixel connected to the first vertical signal line is concurrent with a reset operation period of the pixel connected to the second vertical signal line, in which a signal transfer period of the pixel connected to the first vertical signal line is concurrent with an AD conversion period in which an AD conversion of a pixel signal with a reset level that is output from the pixel connected to the second vertical signal line is performed, and in which an AD conversion period in which an AD conversion of a pixel signal with a signal level is performed in the pixel connected to the first vertical signal line is concurrent with a signal transfer period of the pixel connected to the second vertical signal line.

(31)
The imaging element described in (30), in which the AD conversion unit includes a retention unit that retains a value that is obtained by performing the AD conversion of the pixel signal, in which the AD conversion unit retains a value that is obtained by performing the AD conversion of the pixel signal with a signal level that is output from the pixel connected to the second vertical signal line, performs the AD conversion of the pixel signal with a reset level that is output from the pixel connected to the second vertical signal line, and thereafter outputs a difference between the values, and in which the AD conversion unit retains a value that is obtained by performing the AD conversion of the pixel signal with a reset level that is output from the pixel connected to the first vertical signal line, performs the AD conversion of the pixel signal with a signal level that is output from the pixel connected to the first vertical signal line, and thereafter outputs a difference between the values.

(32)
The imaging element described in (26) to (31), in which in a metal layer on which a predetermined number of the vertical signal lines are formed, an inter-signal-line shield that is fixed to a predetermined potential is formed between the vertical signal lines.

(33)
The imaging element described in (32), in which in a connection section of the predetermined pixel and a predetermined vertical signal line used for reading a pixel signal from the pixel, a shield structure is provided which shields the predetermined vertical signal line with respect to the other vertical signal lines that are not used for reading the pixel signal from the predetermined pixel.

(34)
The imaging element described in (33), in which the shield structure is configured using at least two metal layers provided between a metal layer in which the vertical signal line and the inter-signal-line shield are formed, and a semiconductor substrate, and the metal layer on an upper side disposed between the metal layer on a lower side that is connected to the predetermined vertical signal line, and the other vertical signal lines is connected to the inter-signal-line shield.

(35)
The imaging element described in (26) to (34), in which in a comparator included in the AD conversion unit, differential pair units, each of which receives a pixel signal that is output from the pixel and a ramp signal, and compares the two signals so as to perform an AD conversion of the pixel signal, are provided in parallel with each other in a predetermined number of each vertical signal lines, and in which switching units, each switching an active state in which the pixel signal is compared with the ramp signal, and a standby state in which the pixel signal is not compared with the ramp signal, are provided in each differential pair unit.

(36)
The imaging element described in (35), in which the switching units are disposed on source sides of a pair of transistors, gate electrodes of which the pixel signal and the ramp signal are respectively applied to.

(37)
The imaging element described in (35), in which the switching units are disposed on drain sides of a pair of transistors, gate electrodes of which the pixel signal and the ramp signal are respectively applied to.

(38)
The imaging element described in (35), in which the switching units are disposed on both source sides and drain sides of a pair of transistors, gate electrodes of which the pixel signal and the ramp signal are respectively applied to.

(39)
The imaging element described in (35), in which a pair of capacitors that respectively retain potentials according to levels of the pixel signal and the ramp signal, and a pair of transistors for auto-zero for performing an auto-zero operation of the differential pair unit, are provided in each differential pair unit, and in which a pair of the transistors for auto-zero is disposed so as to connect between each connection point of a pair of transistors for comparison, gate electrodes of which the pixel signal and the ramp signal are respectively applied to, and the capacitor, and each connection point of the transistors for comparison and the switching units.

(40)
The imaging element described in (35), in which a pair of capacitors that respectively retain potentials according to levels of the pixel signal and the ramp signal, and a pair of transistors for performing an auto-zero operation of the differential pair unit, are provided in each differential pair unit, in which the switching units are disposed on sources sides of a pair of transistor for comparison, gate electrodes of which the pixel signal and the ramp signal are respectively applied to, and in which a pair of the transistors for auto-zero is disposed so as to connect between each connection point of the transistors for comparison and the capacitor, and each source side of the switching units.

(41)

The imaging element described in (35) to (40), in which in a predetermined number of the differential pair units, a circuit configuration on a side to which the ramp signal is input is shared.

(42)

The imaging element described in (26) to (41), in which a dummy read row in which pixels in which reading of a pixel signal is not performed are disposed is provided, and a control is performed which suppresses a change of a negative potential of the pixels that concurrently and alternately perform a reset operation or a signal transfer operation and an AD conversion operation.

(43)

The imaging element described in (26) to (41), in which a negative potential is configured so as to be separated for each pixel that concurrently and alternately perform a reset operation or a signal transfer operation and an AD conversion operation.

(44)

An imaging method of an imaging element that includes a pixel area in which a plurality of pixels is disposed in a matrix, and a column AD signal processing unit in which an AD conversion unit that performs an AD (Analog to Digital) conversion of a pixel signal which is output from the pixel is provided in each column of the pixels, and the plurality of pixels that is disposed in the same column is connected to the AD conversion unit through a predetermined number of vertical signal lines, the method including: performing a reset operation or a signal transfer operation using the pixel connected through a portion of a predetermined number of the vertical signal lines, and concurrently, performing an operation of an AD conversion of a pixel signal that is output from the pixel connected through the other vertical signal lines using the AD conversion unit, and the operations being alternately repeated.

(45)

An electronic Apparatus including: an imaging element that includes a pixel area in which a plurality of pixels is disposed in a matrix, and a column AD signal processing unit in which an AD conversion unit that performs an AD (Analog to Digital) conversion of a pixel signal which is output from the pixel is provided in each column of the pixels, and the plurality of pixels that is disposed in the same column is connected to the AD conversion unit through a predetermined number of vertical signal lines, in which the pixel connected through a portion of a predetermined number of the vertical signal lines performs a reset operation or a signal transfer operation, and concurrently, the AD conversion unit performs an operation of an AD conversion of a pixel signal that is output from the pixel connected through the other vertical signal lines, and the operations are alternately repeated.

It should be understood by those skilled in the art that various modifications, combinations, sub-combinations, and alterations may occur depending on design requirements and other factors insofar as they are within the scope of the appended claims or the equivalents thereof.

REFERENCE SIGNS LIST

11 Imaging device
12 Pixel area
13 Vertical drive circuit
14 Column signal processing circuit
15 Horizontal drive circuit
16 Output circuit
17 Ramp signal generation circuit
18 Control circuit
21 Pixel
22 Horizontal signal line
23 Vertical signal line
24 Data output signal line
31 PD
32 Transfer transistor
33 FD unit
34 Amplification transistor
35 Selection transistor
36 Reset transistor
41 Column processing unit
42 Constant current source
51 Input switch
52 Comparator
53 Counter
54 Output switch
55 Retention unit
61 Sharing pixel
71, 72 Capacitor
73 Feedback switch

What is claimed is:

1. An imaging device comprising:
a pixel array including a plurality of pixels two-dimensionally arranged in a matrix pattern;
a plurality of column signal lines disposed according to a first column of the pixels, wherein one or more of the plurality of column signal lines is selectively coupled to a comparator, wherein at least one column signal line of the plurality of column signal lines is connected to two or more pixels in the first column; and
an analog to digital converter shared by the plurality of column signal lines, wherein the analog to digital converter includes the comparator, and wherein the comparator includes:
a first differential pair unit coupled to a first column signal line of the plurality of column signal lines, wherein the first differential pair unit includes a transistor coupled to a second auto-zero connection node; and
a second differential pair unit coupled to a second column signal line of the plurality of column signal lines, wherein the second differential pair unit includes transistor coupled to a second auto-zero connection node, and wherein the first differential pair unit and the second differential pair unit share a transistor coupled to a third auto-zero connection node.

2. The imaging device according to claim 1, wherein the plurality of column signal lines disposed according to the first column are parallel to each other.

3. The imaging device according to claim 1,
wherein pixels in even numbered rows share the first column signal line and pixels in odd numbered rows share the second column signal line.

4. The imaging device according to claim 1, further comprising a switch for each of the plurality of column signal lines, wherein each switch is coupled to a first terminal of the comparator.

5. The imaging device according to claim 4, further comprising:
a ramp signal generation circuit connected to a second terminal of the comparator; and
a counter unit connected to an output terminal of the comparator, wherein the counter unit is coupled to a data output signal line.

6. The imaging device according to claim 1, wherein the first differential pair unit and the second differential pair unit are connected to a ramp signal node provided from a ramp signal generation circuit.

7. The imaging device according to claim 6, wherein when the first differential pair unit is active, the second differential pair unit is inactive, and wherein when the first differential pair unit is inactive, the second differential pair unit is active.

8. The imaging device according to claim 7, wherein pixels in even numbered rows share the first column signal line and pixels in odd numbered rows share the second column signal line.

9. The imaging device according to claim 1, wherein an output from at least one of the first differential pair unit and the second differential pair unit is provided to at least one of a first amplification unit and a second amplification unit.

10. The imaging device according to claim 1, wherein the first differential pair unit includes two transistors connected to a first auto-zero connection node, and the second differential pair unit includes two transistors connected to a second auto-zero connection node.

11. The imaging device according to claim 1, further comprising:
a switch for each of the plurality of column signal lines; and
a capacitor for each of the plurality of column signal lines, wherein a first terminal of the capacitor is connected to the switch and a second terminal of the capacitor is connected to a first terminal of the comparator.

12. The imaging device according to claim 1, further comprising:
a first pixel-sharing structure including at least two pixels in adjacent columns and at least two pixels in adjacent rows;
a second pixel-sharing structure including at least two pixels in adjacent columns and at least two pixels in adjacent rows,
wherein the first pixel-sharing structure and the second pixel-sharing structure are arranged in a same column, wherein the first pixel-sharing structure is connected to a first column signal line of the plurality of column signal lines, and wherein the second pixel-sharing structure is connected to a second column signal line of the plurality of column signal lines.

13. The imaging device according to claim 12, further comprising color filters disposed on the at least two pixels in adjacent columns and the at least two pixels in adjacent rows, wherein the color filters are arranged according to a Bayer pattern.

14. The imaging device according to claim 1, wherein a reading of a reset signal associated with a second signal column line of the plurality of signal column lines occurs between a reading of a reset signal associated with a first signal column line of the plurality of signal column lines and a reading of a signal corresponding to an amount of light received by a photodiode connected to the first column signal line.

15. An electronic apparatus comprising:
an optical system including at least one lens; and
an imaging element configured to receive light through the optical system, wherein the imaging element includes:
a pixel array including pixels two-dimensionally arranged in a matrix pattern;
a plurality of column signal lines disposed according to a first column of the pixels, wherein one or more of the plurality of column signal lines is selectively coupled to a comparator, wherein at least one column signal line of the plurality of column signal lines is connected to two or more pixels in the first column; and
an analog to digital converter shared by the plurality of column signal lines, wherein the analog to digital converter includes the comparator, and wherein the comparator includes:
a first differential pair unit coupled to a first column signal line of the plurality of column signal lines, wherein the first differential pair unit includes a transistor coupled to a second auto-zero connection node; and
a second differential pair unit coupled to a second column signal line of the plurality of column signal lines, wherein the second differential pair unit includes transistor coupled to a second auto-zero connection node, and wherein the first differential pair unit and the second differential pair unit share a transistor coupled to a third auto-zero connection node.

16. The electronic apparatus according to claim 15, wherein the plurality of column signal lines disposed according to the first column are parallel to each other.

17. The electronic apparatus according to claim 15, wherein pixels in even numbered rows share the first column signal line and pixels in odd numbered rows share the second column signal line.

18. The electronic apparatus according to claim 15, further comprising a switch for each of the plurality of column signal lines, wherein each switch is coupled to a first terminal of the comparator.

19. The electronic apparatus according to claim 18, further comprising:
a ramp signal generation circuit connected to a second terminal of the comparator; and
a counter unit connected to an output terminal of the comparator, wherein the counter unit is coupled to a data output signal line.

20. The electronic apparatus according to claim 15, wherein the first differential pair unit and the second differential pair unit are connected to a ramp signal node provided from a ramp signal generation circuit.

* * * * *